(12) United States Patent
Yang et al.

(10) Patent No.: US 11,600,535 B2
(45) Date of Patent: Mar. 7, 2023

(54) INTEGRATED ASSEMBLIES HAVING CONDUCTIVE MATERIAL ALONG THREE OF FOUR SIDES AROUND ACTIVE REGIONS, AND METHODS OF FORMING INTEGRATED ASSEMBLIES

(71) Applicant: Micron Technology, inc., Boise, ID (US)

(72) Inventors: Litao Yang, Boise, ID (US); Srinivas Pulugurtha, Boise, ID (US); Yunfei Gao, Boise, ID (US); Sanh D. Tang, Meridian, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 360 days.

(21) Appl. No.: 16/868,133

(22) Filed: May 6, 2020

(65) Prior Publication Data

US 2021/0351087 A1    Nov. 11, 2021

(51) Int. Cl.
| | | |
|---|---|---|
| H01L 27/00 | (2006.01) |
| H01L 21/84 | (2006.01) |
| H01L 21/265 | (2006.01) |
| H01L 29/78 | (2006.01) |
| H01L 27/108 | (2006.01) |

(52) U.S. Cl.
CPC ........ *H01L 21/845* (2013.01); *H01L 21/2656* (2013.01); *H01L 27/10805* (2013.01); *H01L 29/7827* (2013.01)

(58) Field of Classification Search
CPC ......... H01L 27/10805; H01L 27/10873; H01L 29/66666; H01L 29/7827
See application file for complete search history.

(56) References Cited

U.S. PATENT DOCUMENTS

| | | |
|---|---|---|
| 8,518,812 B2 | 8/2013 | Mariani |
| 8,878,271 B2 | 11/2014 | Karda |
| 9,773,888 B2 | 9/2017 | Pulugurtha |
| 11,069,687 B2 | 7/2021 | Tang |
| 11,088,142 B2 | 8/2021 | Tang |
| 2008/0093644 A1 | 4/2008 | Forbes |
| 2009/0001337 A1 | 1/2009 | Furukawa |
| 2013/0230955 A1 | 9/2013 | Chen |
| 2014/0021485 A1 | 1/2014 | Cho |

(Continued)

FOREIGN PATENT DOCUMENTS

WO    WO    8/2021
    PCT-US2021-028943

*Primary Examiner* — Reema Patel
(74) *Attorney, Agent, or Firm* — Wells St. John P.S.

(57) ABSTRACT

Some embodiments include an integrated assembly having an array of vertically-extending active regions. Each of the active regions is contained within a four-sided area. Conductive gate material is configured as first conductive structures. Each of the first conductive structures extends along a row of the array. The first conductive structures include segments along three of the four sides of each of the four-sided areas. Second conductive structures are under the active regions and extend along columns of the array. Third conductive structures extend along the rows of the array and are adjacent the fourth sides of the four-sided areas. Storage-elements are coupled with the active regions. Some embodiments include methods of forming integrated assemblies.

19 Claims, 58 Drawing Sheets

(56) References Cited

U.S. PATENT DOCUMENTS

| | | | |
|---|---|---|---|
| 2015/0357334 A1* | 12/2015 | Hu | H01L 29/7827 257/329 |
| 2019/0136207 A1 | 5/2019 | Ramaswamy | |
| 2021/0125642 A1 | 4/2021 | Mariani | |

* cited by examiner

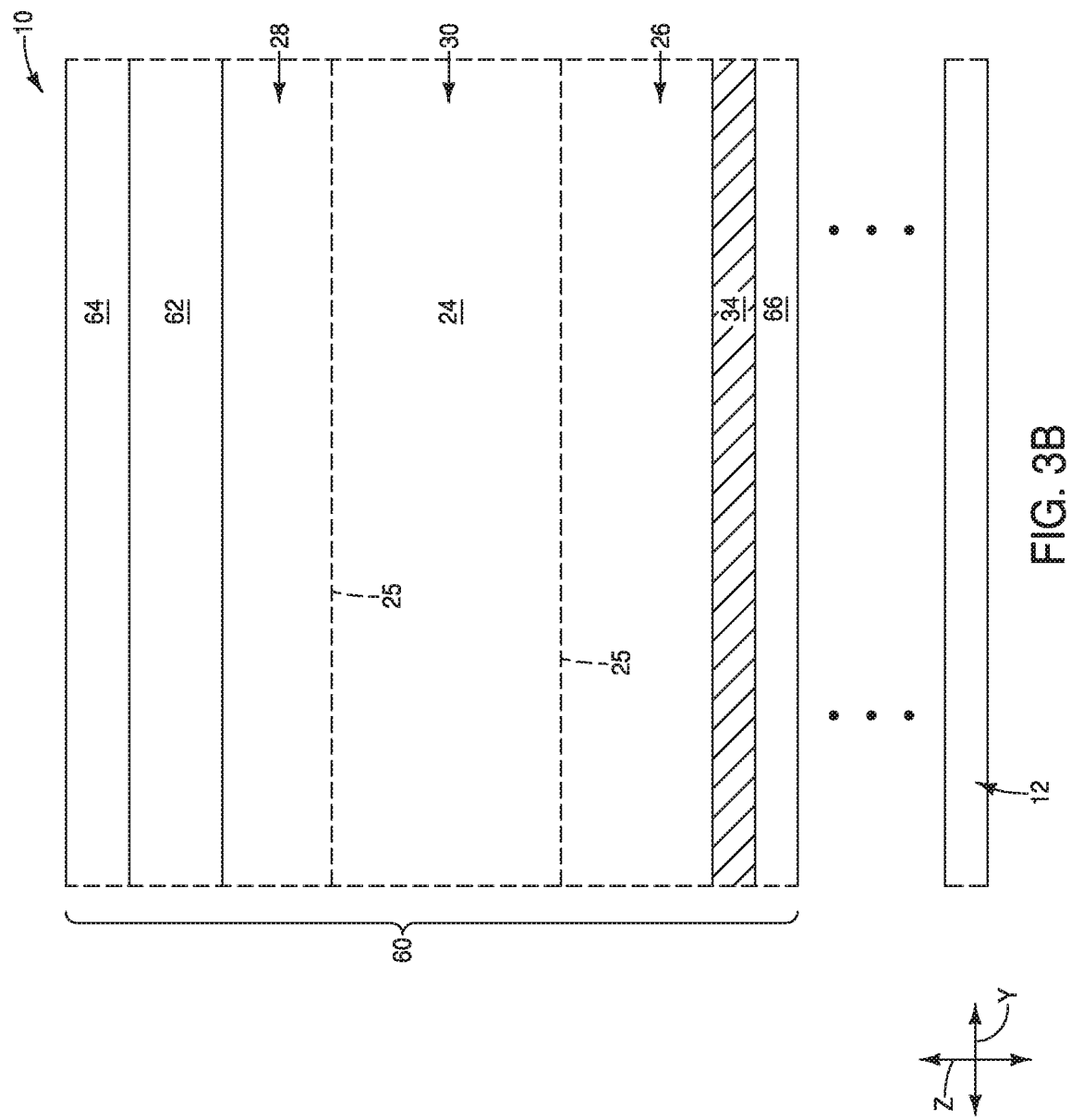

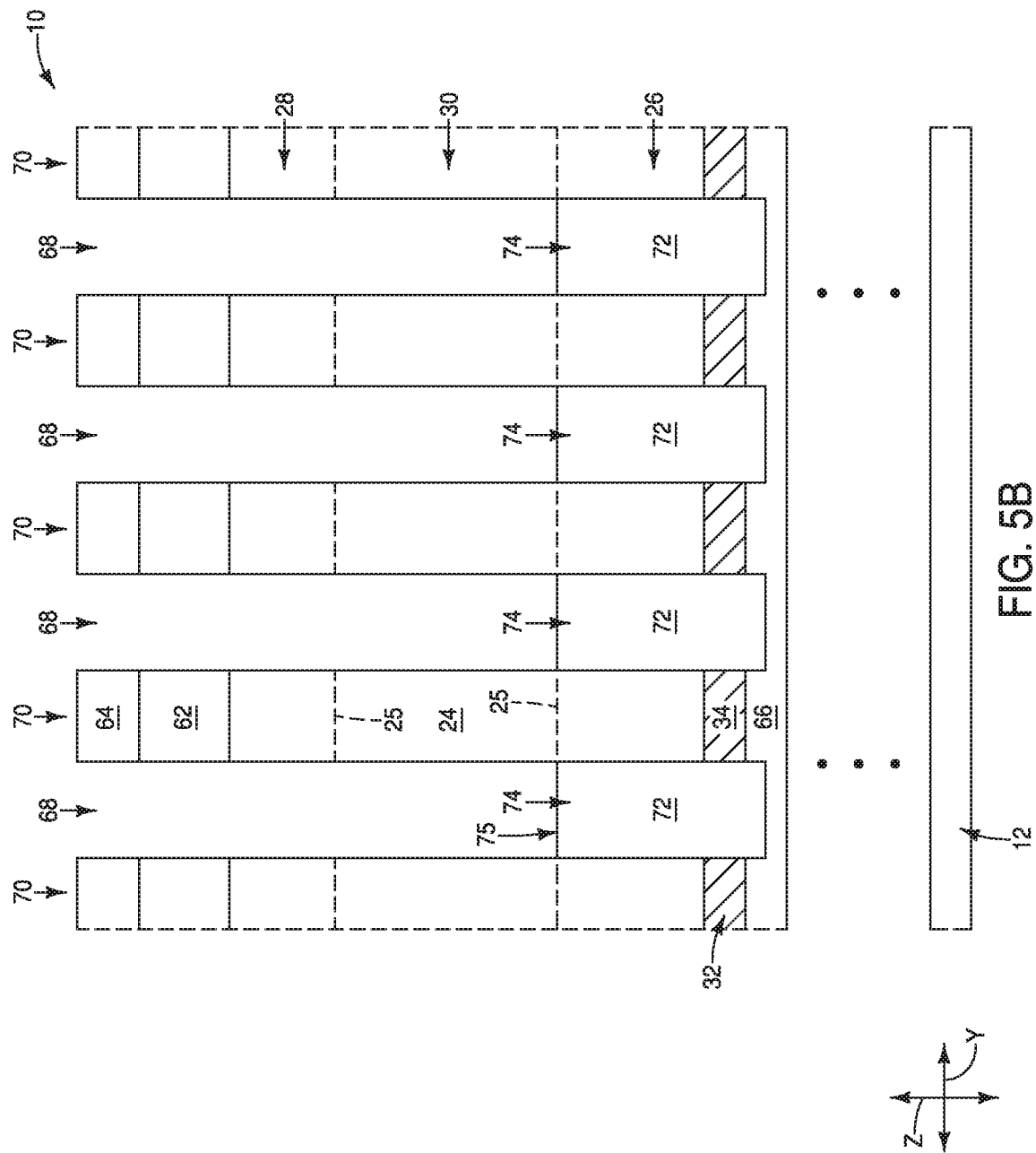

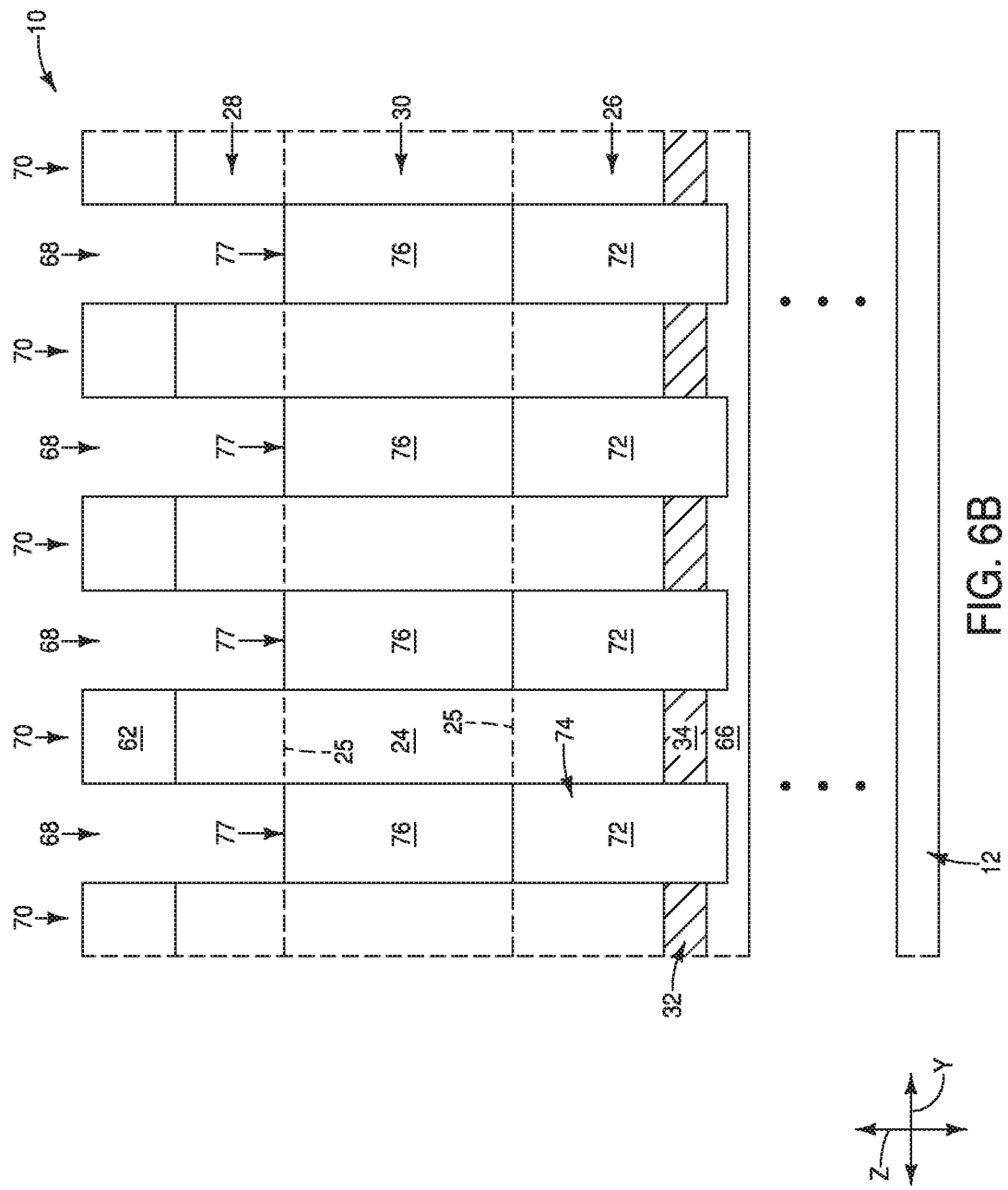

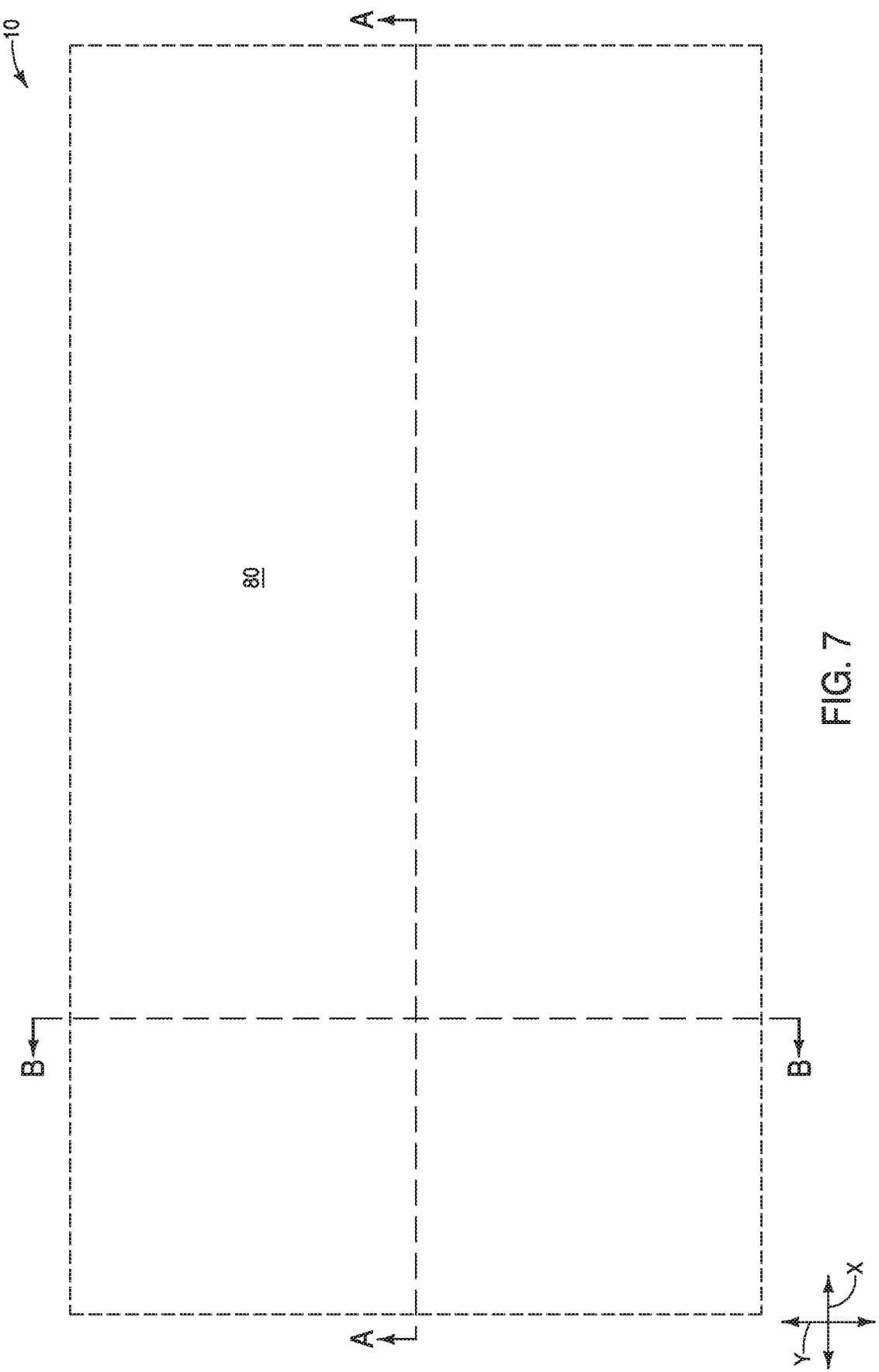

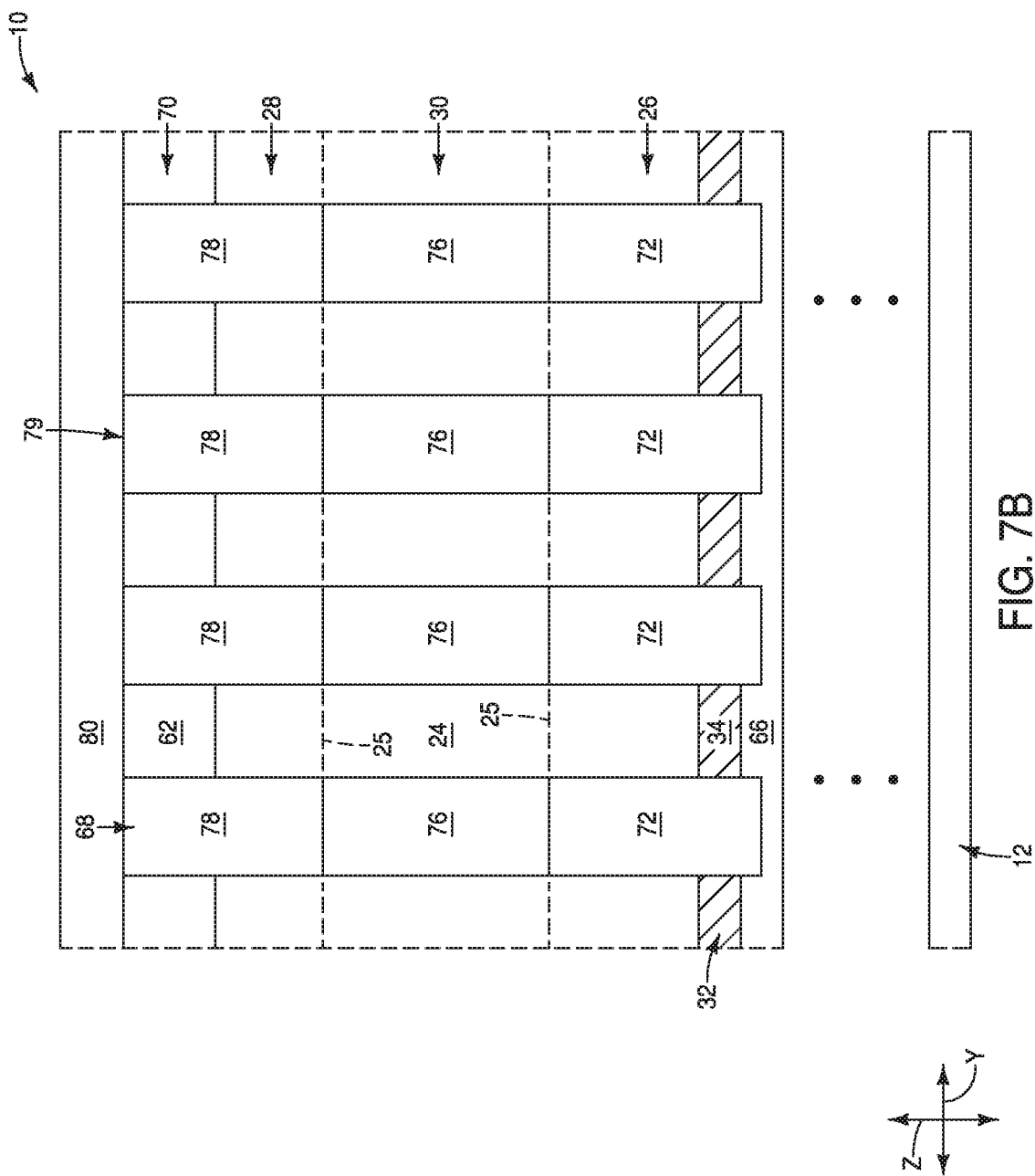

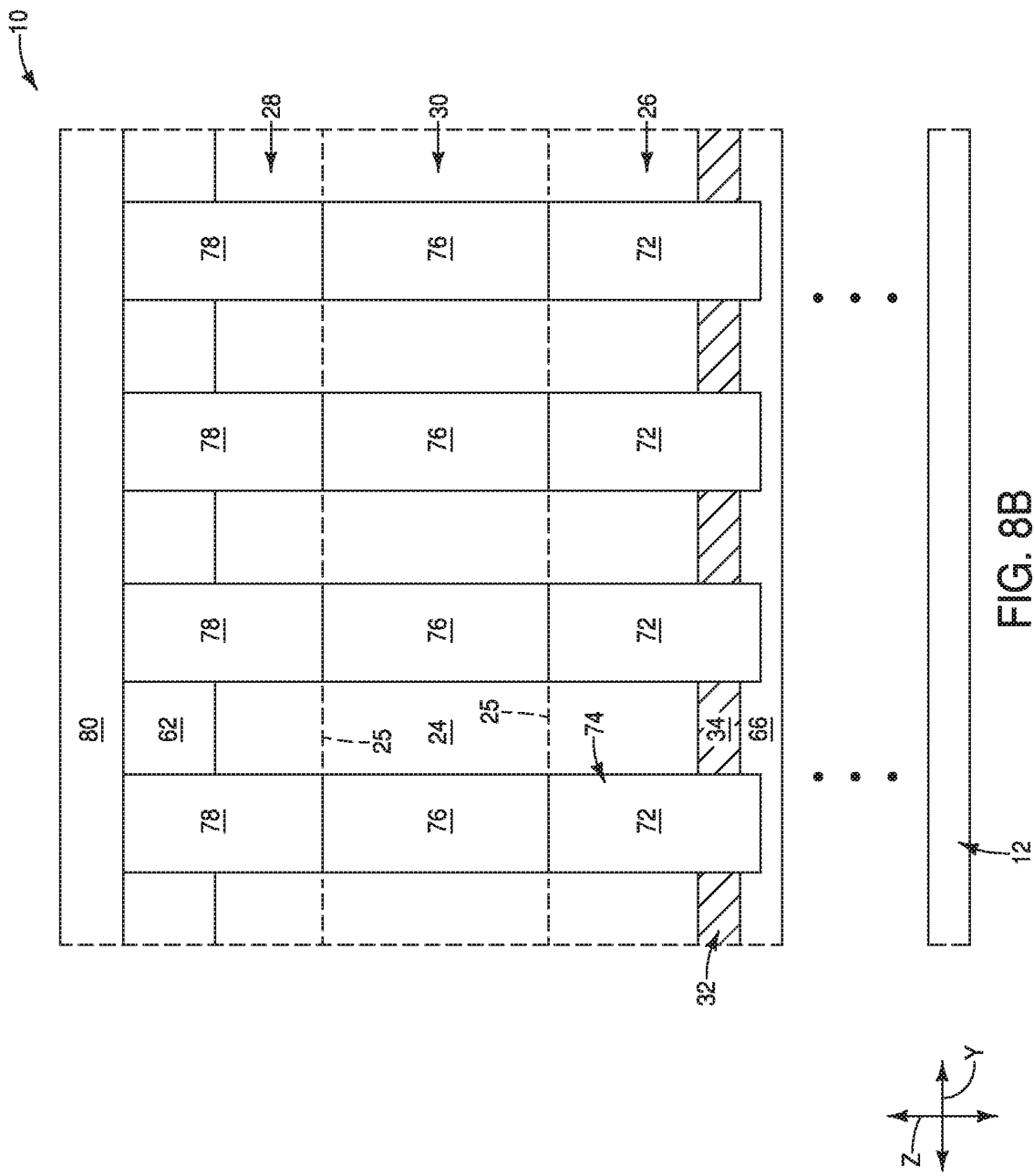

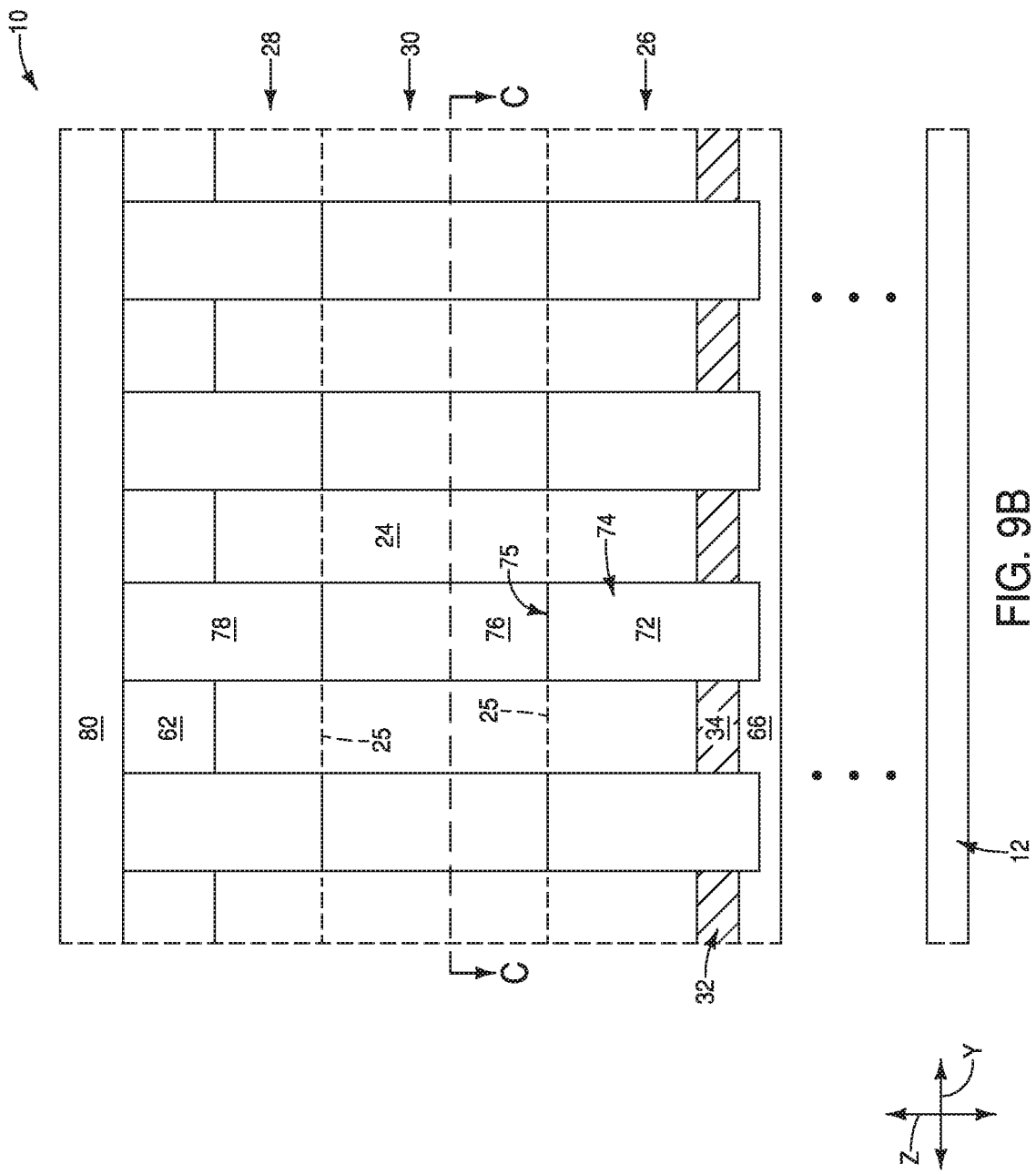

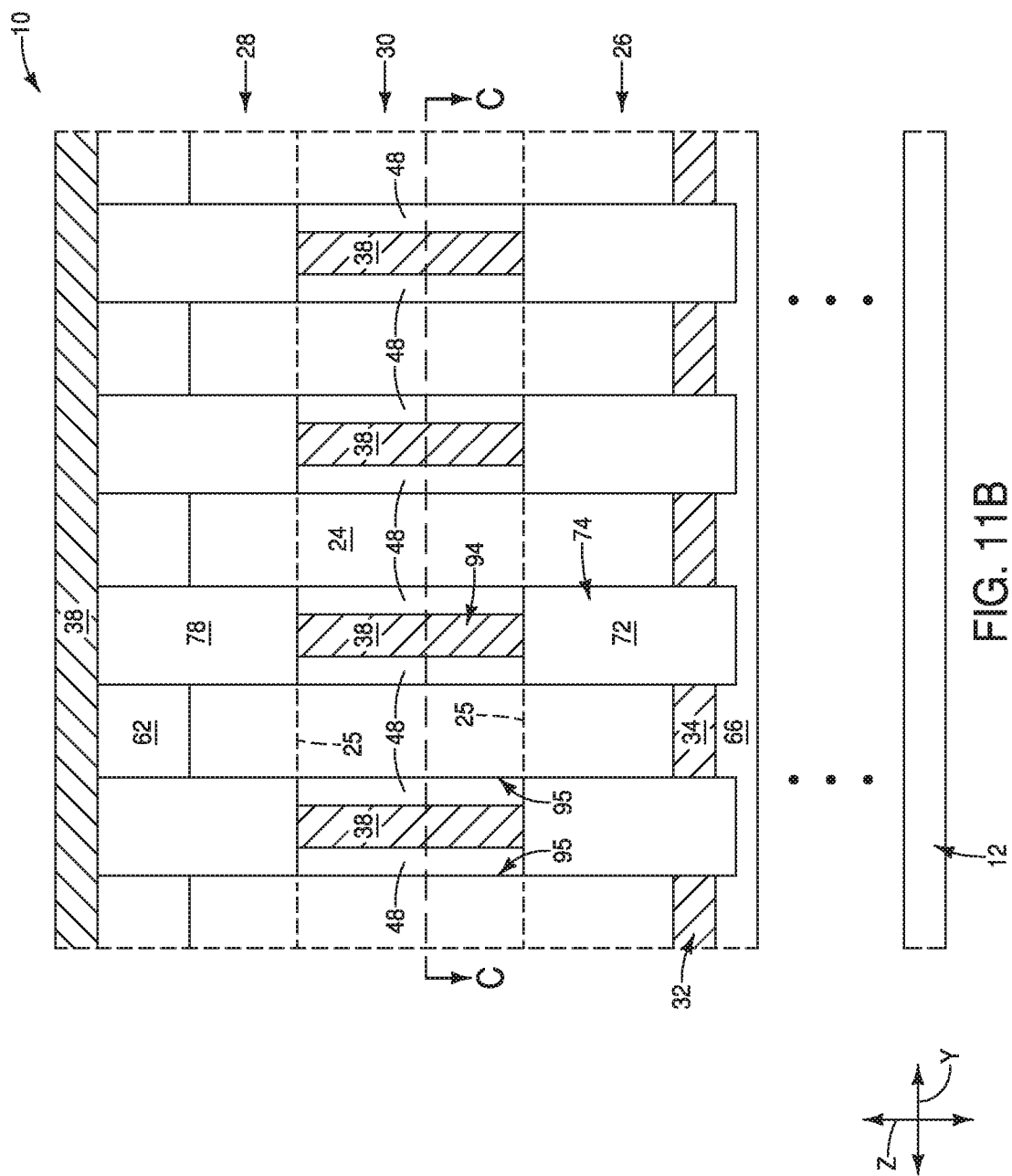

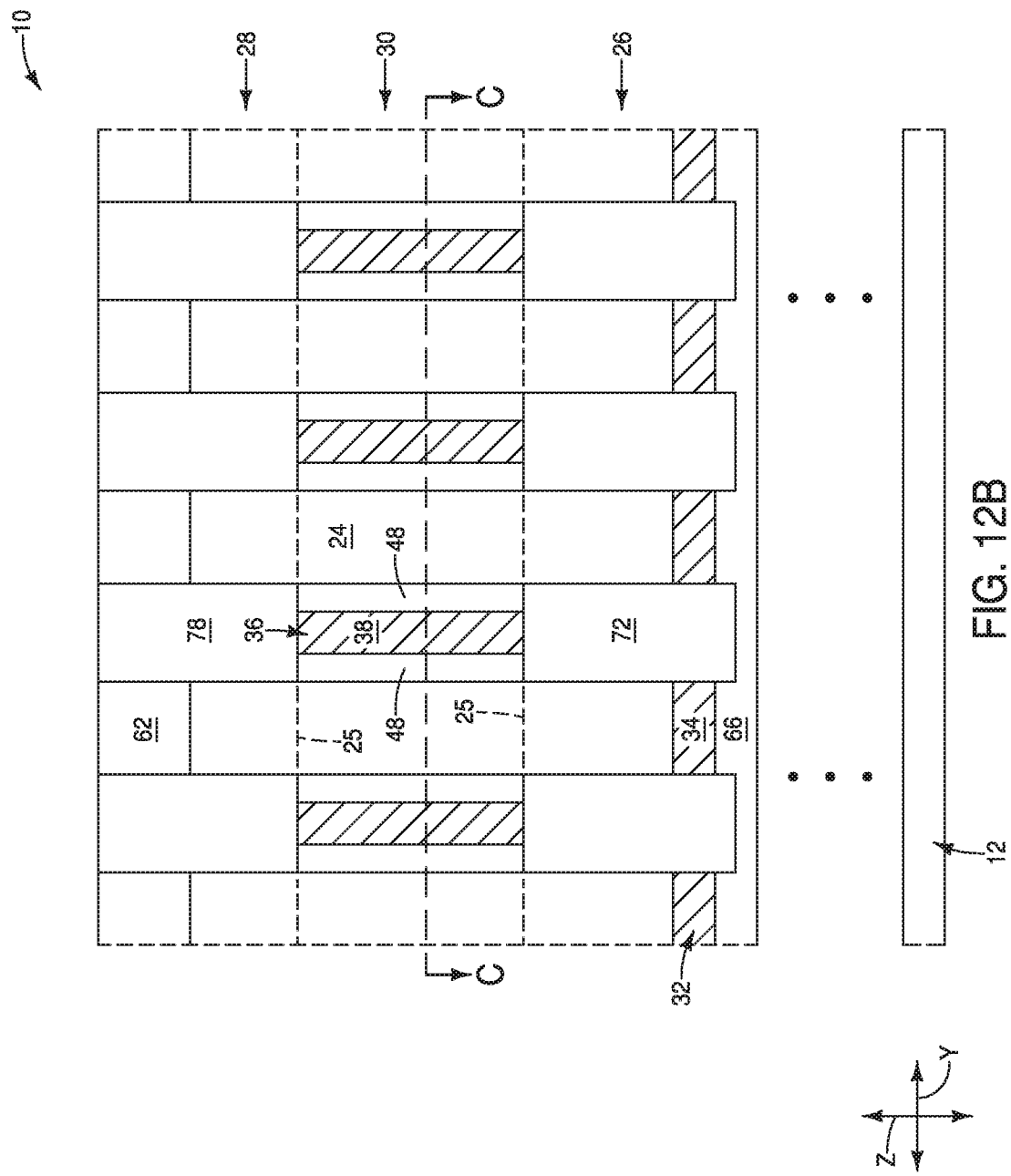

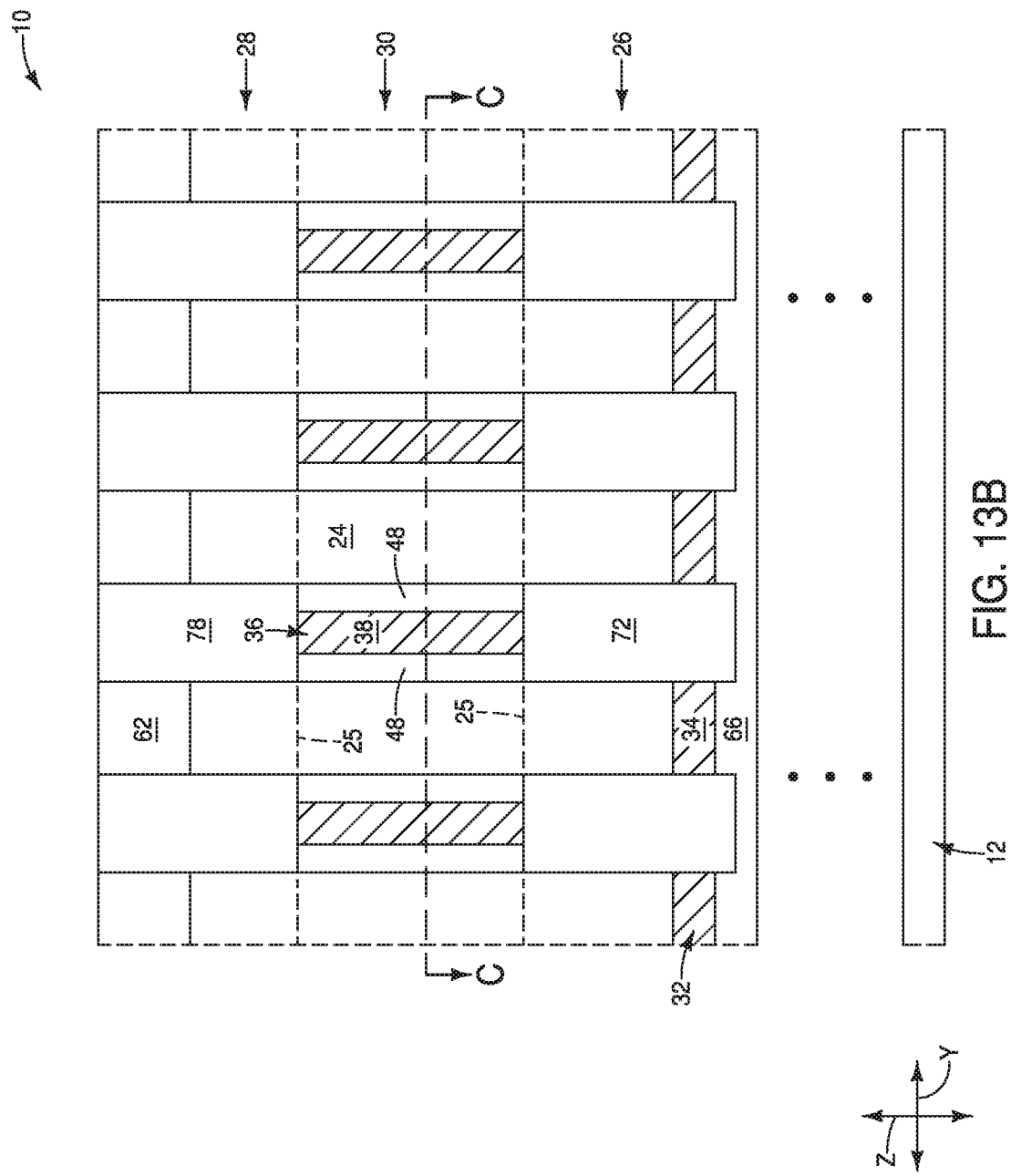

INTEGRATED ASSEMBLIES HAVING CONDUCTIVE MATERIAL ALONG THREE OF FOUR SIDES AROUND ACTIVE REGIONS, AND METHODS OF FORMING INTEGRATED ASSEMBLIES

TECHNICAL FIELD

Integrated assemblies (e.g., DRAM configurations, FeRAM configurations, etc.). Methods of forming integrated assemblies.

BACKGROUND

Memory may utilize memory cells which individually comprise an access transistor in combination with a capacitor. The capacitor may be a ferroelectric capacitor if the memory is ferroelectric random-access memory (FeRAM), or may be a non-ferroelectric capacitor if the memory is traditional dynamic random-access memory (DRAM).

It would be desirable to develop improved memory architecture, and improved methods of forming memory architecture. It would also be desirable for such methods to be applicable for fabrication of FeRAM and DRAM.

BRIEF DESCRIPTION OF THE DRAWINGS

FIG. 1 is a diagrammatic cross-sectional top down view, and FIG. 1A is a diagrammatic cross-sectional side view. The view of FIG. 1A is along the line A-A of FIG. 1, and the view of FIG. 1 is along the line 1-1 of FIG. 1A.

FIG. 2 is a diagrammatic cross-sectional top down view, and FIG. 2A is a diagrammatic cross-sectional side view. The view of FIG. 2A is along the line A-A of FIG. 2, and the view of FIG. 2 is along the line 2-2 of FIG. 2A.

FIGS. 3-3B are diagrammatic views of a region of an example integrated assembly. FIG. 3 is a diagrammatic top down view. FIGS. 3A and 3B are diagrammatic cross-sectional side views along the lines A-A and B-B of FIG. 3, respectively.

FIG. 4 is a diagrammatic top down view. FIGS. 4A and 4B are diagrammatic cross-sectional side views along the lines A-A and B-B of FIG. 4, respectively.

FIGS. 5-5B are diagrammatic views of the region of the example integrated assembly of FIG. 3 at a process stage subsequent to that of FIG. 4. FIG. 5 is a diagrammatic top down view. FIGS. 5A and 5B are diagrammatic cross-sectional side views along the lines A-A and B-B of FIG. 5, respectively.

FIGS. 6-6B are diagrammatic views of the region of the example integrated assembly of FIG. 3 at a process stage subsequent to that of FIG. 5. FIG. 6 is a diagrammatic top down view. FIGS. 6A and 6B are diagrammatic cross-sectional side views along the lines A-A and B-B of FIG. 6, respectively.

FIGS. 7-7B are diagrammatic views of the region of the example integrated assembly of FIG. 3 at a process stage subsequent to that of FIG. 6. FIG. 7 is a diagrammatic top down view. FIGS. 7A and 7B are diagrammatic cross-sectional side views along the lines A-A and B-B of FIG. 7, respectively.

FIGS. 8-8B are diagrammatic views of the region of the example integrated assembly of FIG. 3 at a process stage subsequent to that of FIG. 7. FIG. 8 is a diagrammatic top down view. FIGS. 8A and 8B are diagrammatic cross-sectional side views along the lines A-A and B-B of FIG. 8, respectively.

FIG. 9 is a diagrammatic top down view. FIGS. 9A and 9B are diagrammatic cross-sectional side views along the lines A-A and B-B of FIGS. 9 and 9C, respectively. FIG. 9C is a diagrammatic cross-sectional top-down view along the line C-C of FIGS. 9A and 9B.

FIG. 10 is a diagrammatic top down view. FIG. 10C is a diagrammatic cross-sectional top-down view along the line C-C of FIGS. 10A and 10B.

FIG. 11 is a diagrammatic top down view. FIGS. 11A and 11B are diagrammatic cross-sectional side views along the lines A-A and B-B of FIGS. 11 and 11C, respectively. FIG. 11C is a diagrammatic cross-sectional top-down view along the line C-C of FIGS. 11A and 11B.

FIG. 12 is a diagrammatic top down view. FIGS. 12A and 12B are diagrammatic cross-sectional side views along the lines A-A and B-B of FIGS. 12 and 12C, respectively. FIG. 12C is a diagrammatic cross-sectional top-down view along the line C-C of FIGS. 12A and 12B.

FIG. 13 is a diagrammatic top down view. FIGS. 13A and 13B are diagrammatic cross-sectional side views along the lines A-A and B-B of FIGS. 13 and 13C, respectively. FIG. 13C is a diagrammatic cross-sectional top-down view along the line C-C of FIGS. 13A and 13B.

FIG. 14 is a diagrammatic top down view. FIG. 14C is a diagrammatic cross-sectional top-down view along the line C-C of FIGS. 14A and 14B.

FIG. 15 is a diagrammatic top down view. FIG. 15C is a diagrammatic cross-sectional top-down view along the line C-C of FIGS. 15A and 15B.

FIG. 16 is a diagrammatic top down view. FIG. 16C is a diagrammatic cross-sectional top-down view along the line C-C of FIGS. 16A and 16B.

DETAILED DESCRIPTION OF THE ILLUSTRATED EMBODIMENTS

Some embodiments include integrated assemblies (e.g., DRAM, FeRAM, etc.) having conductive material (e.g., wordline material) along three of four sides around active regions. Some embodiments include methods of forming integrated assemblies. Example embodiments are described with reference to FIGS. 1-20.

Figure 1:
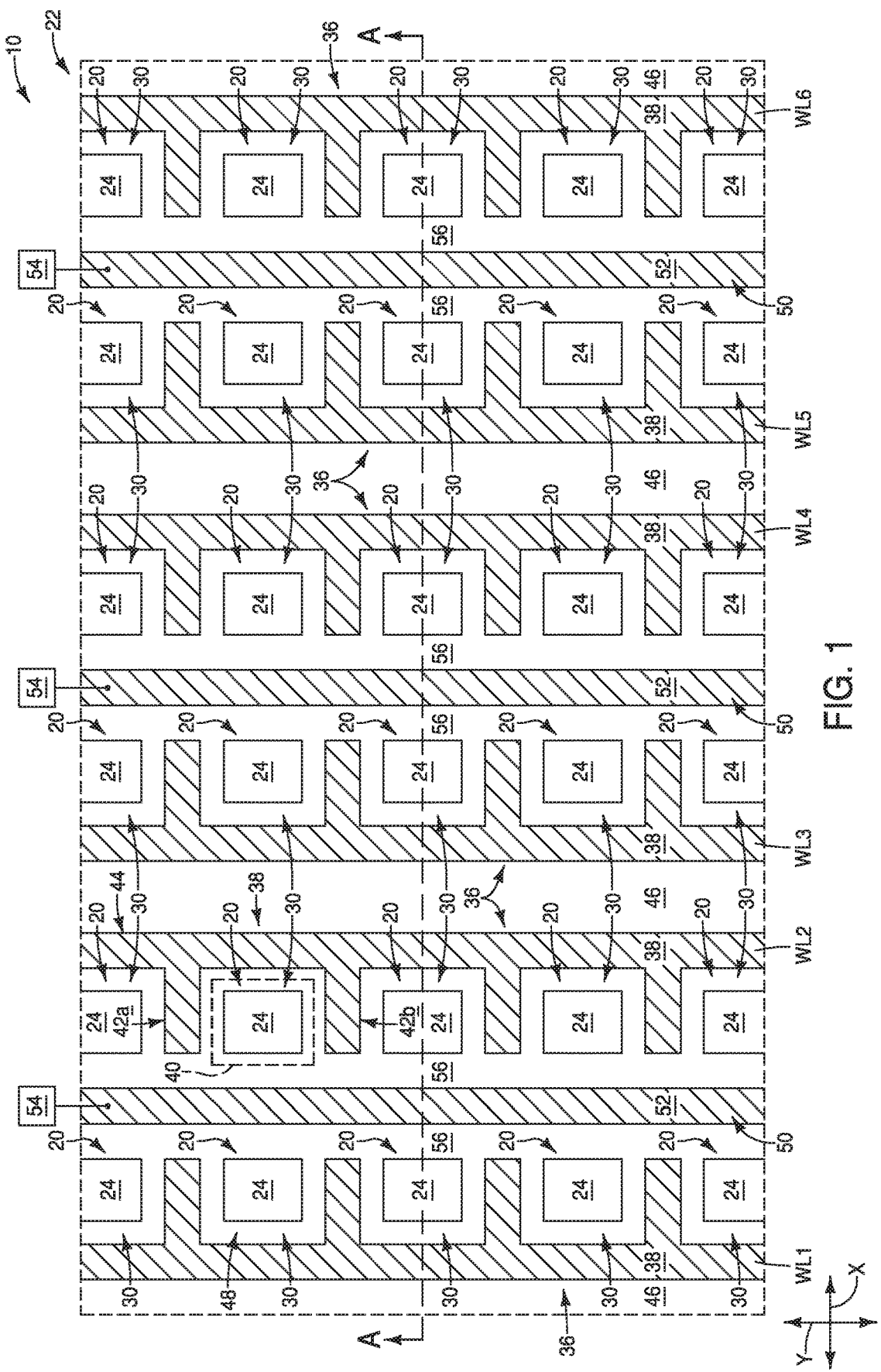
FIGS. 1 and 1A are diagrammatic views of a region of an example integrated assembly.
Figure 1A:
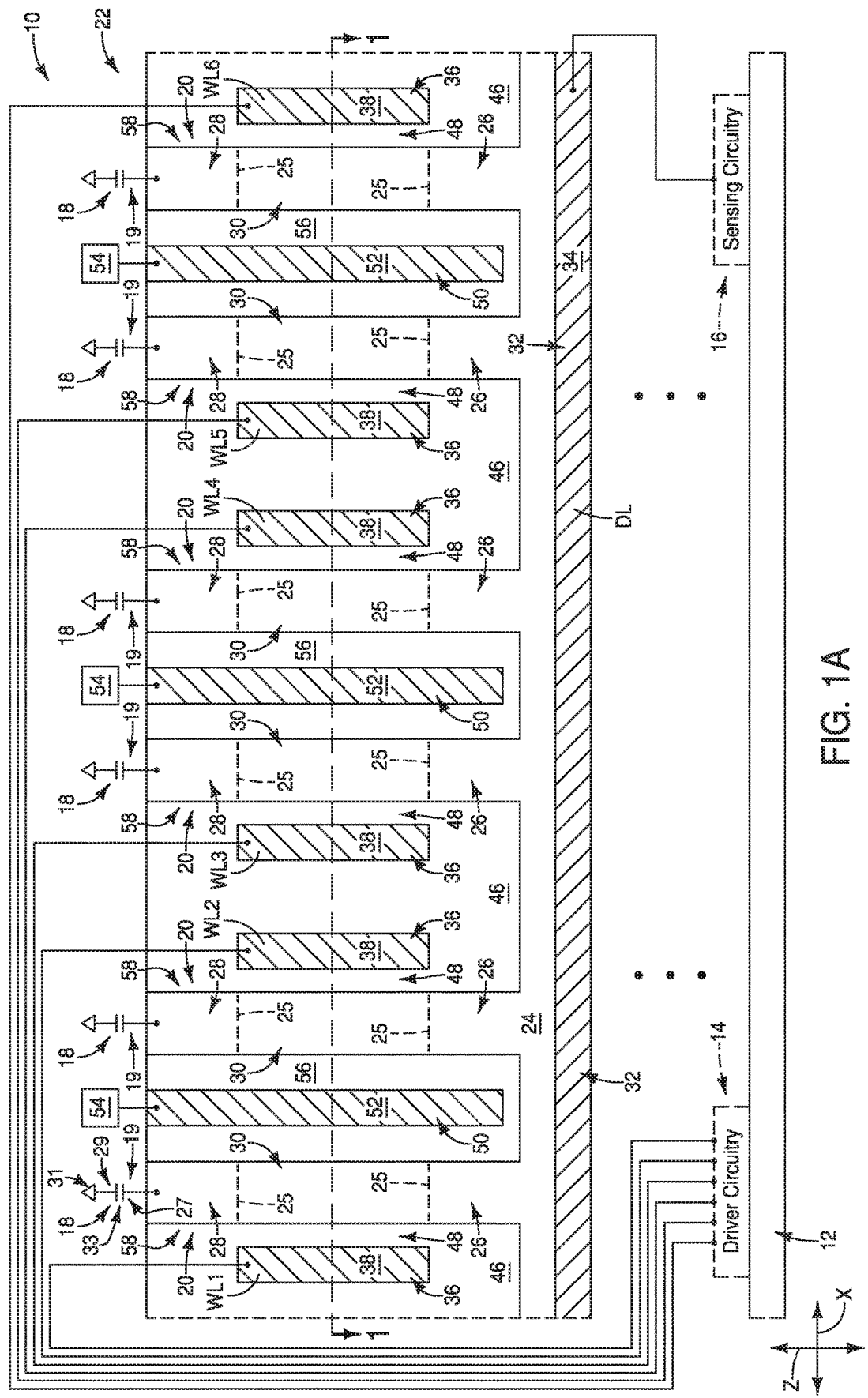

Referring to FIGS. 1 and 1A, an integrated assembly 10 includes vertically-extending active regions 20 arranged in an array 22. The array comprises a row direction (which extends along an illustrated y-axis) and a column direction (which extends along an illustrated x-axis). In the illustrated embodiment, the row direction is substantially orthogonal to the column direction, with the term "substantially orthogonal" meaning orthogonal to within reasonable tolerances of fabrication and measurement. In other embodiments, the row direction may cross the column direction without being substantially orthogonal to the column direction.

The vertically-extending active regions 20 comprise semiconductor material 24. In some embodiments, the active regions 20 may be considered to correspond to vertically-extending pillars of the semiconductor material, with such pillars which extending along the illustrated z-axis direction. The z-axis direction may be substantially orthogonal to the x-axis direction and the y-axis direction. In some embodiments, the vertically-extending pillars 20 may extend along a direction which is about vertical; with the term "about vertical" meaning within about 15° of being orthogonal to the x-axis direction and the y-axis direction.

The semiconductor material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the semiconductor material 24 may comprise, consist essentially of, or consist of appropriately-doped silicon. The silicon may be in any suitable crystalline form; and in some example embodiments the crystalline form of the silicon may be one or more of monocrystalline, polycrystalline, amorphous etc.

The illustrated active regions each include a lower source/drain region 26, an upper source/drain region 28, and a channel region 30 between the source/drain regions 26 and 28. In some embodiments, one of the source/drain regions 26 and 28 may be referred to as a first source/drain region, and the other may be referred to as a second source/drain region. Dashed lines 25 are provided to illustrate approximate boundaries between the channel region 30 and the source/drain regions 26, 28.

Storage-elements 18 are shown to be electrically coupled with the upper source/drain regions 28. The storage-elements may be any suitable devices having at least two detectable states; and in some embodiments may be, for example, capacitors (as shown), resistive-memory devices, conductive-bridging devices, phase-change-memory (PCM) devices, programmable metallization cells (PMCs), etc. The illustrated capacitors have lower electrodes 27 coupled with the upper source/drain regions 28, and have upper electrodes 29 coupled with a reference source 31. The reference source 31 may correspond to a common plate (CP) voltage. The common plate voltage may be any suitable voltage, such as a voltage within a range of from greater than or equal to ground to less than or equal to VCC (i.e., ground≤CP≤VCC). In some applications, the common plate voltage may be about one-half VCC (i.e., about VCC/2).

Insulative material 33 is between the capacitor electrodes 27 and 29. The insulative material 33 may comprise any suitable composition(s). In some embodiments, the insulative material 33 may comprise only non-ferroelectric material (e.g., may be a non-ferroelectric insulative material). The non-ferroelectric insulative material may, for example, comprise, consist essentially of, or consist of one or more of silicon dioxide, aluminum oxide, hafnium oxide, zirconium oxide, etc. In some embodiments, the insulative material 33 may comprise ferroelectric material (e.g., may be a ferroelectric insulative material). The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

The semiconductor material 24 is supported by a conductive structure 32. The conductive structure 32 may correspond to a digit line (sense line, bitline) DL, with such digit line extending along the column-direction (i.e., the illustrated x-axis direction). The active regions 20 are electrically coupled to the conductive structure 32 through the lower source/drain regions 26.

The conductive structure 32 comprises conductive material 34. The conductive material 34 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments, the conductive material 34 may comprise one or more of tungsten, tungsten nitride and tungsten silicide.

The conductive material 34 is supported over a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the conductive structure 32 to indicate that other materials, components, devices, etc., may be provided between the base 12 and the conductive structure 32.

In the shown embodiment, logic circuitry (e.g., CMOS) is supported by the base and is within the illustrated gap between the base 12 and the conductive structure 32. The logic circuitry includes driver circuitry (e.g., wordline-driver-circuitry) 14 and sensing circuitry (e.g., sense-amplifier-circuitry) 16. The digit line 32 is shown to be electrically coupled with the sensing circuitry 16.

Additional conductive structures 36 extend along the row-direction (i.e., the illustrated y-axis direction). The conductive structures 36 may correspond to wordlines (access lines) WL1-WL6. The wordline structures WL1-WL6 are electrically coupled to the driver circuitry 14.

The conductive structures 36 comprise conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 38 may comprise, consist essentially of, or consist of tungsten. In some embodiments, the conductive material 38 may comprise conductively-doped silicon (e.g., polysilicon) and/or metal; with structures which comprise both conductively-doped silicon and metal corresponding to hybrid gate structures in some applications. In some embodiments, the conductive material 38 may be referred to as conductive gate material.

The view of FIG. 1 shows that each of the active regions 20 may be considered to be contained within a four-sided area 40 (only one of the four-sided areas 40 is shown and labeled in FIG. 1 in order to simplify the drawing). The conductive structure 36 corresponding to the wordline WL2 is adjacent to the illustrated four-sided area 40. Such conductive structure comprises segments 38, 42a and 42b proximate the four-sided area 40. The segments 38, 42a and 42b are along three of the four sides of the four-sided area, but no segment from the wordline WL2 is along the fourth side of the four-sided area 40. The segments 38, 42a and 42b may be considered together to form a three-sided gating structure.

In some embodiments, the wordline WL2 may be considered to be a comb-shaped configuration, with the segment 38 being along a shaft 44 of the comb-shaped configuration, and with the segments 42a and 42b being teeth of the comb-shaped configuration. The shaft 44 extends along the illustrated y-axis direction. The teeth 42a and 42b project from the shaft 44, and in the illustrated embodiment project along the x-axis direction. The illustrated wordlines all comprise the comb-shaped configuration of wordline WL2, and each of the active areas 20 may be considered to be contained within a four-sided area (analogous to the illustrated area 40), and to have segments of the comb-shaped wordline configurations along three of the four sides of the four-sided areas and not along the fourth sides of such four-sided areas.

In some embodiments, the wordline structures 36 may be referred to as first conductive structures, and the digit line structure 32 may be referred to as a second conductive structure; or the conductive structure 32 may referred to as a first conductive structure, and the conductive structures 36 may be referred to as second conductive structures. The digit line structure 32 may be representative of a large number of digit line structures which are formed along rows of the array 22, and which extend substantially orthogonally to the wordline structures 36.

In the illustrated embodiment, the active regions 20 are shown to be rectangular-shaped in top-down view. In other embodiments, the active regions 20 may have other shapes. Example other shapes are square, circular, elliptical, polygonal, etc. If the active regions 20 are polygonal, they may be four-sided polygonal, may have more than four sides, or may have fewer than four sides.

In operation, the driver circuitry 14 may be utilized to provide appropriate voltage along one or more selected wordlines 36 to gatedly couple source/drain regions 26 and 28 to one another across a channel region 30. In some embodiments, the wordlines 36 (specifically, transistor gates along the wordlines) may be considered to be operatively adjacent to (operatively proximate to) the channel regions 30 such that a sufficient voltage applied to selected wordlines will induce electric fields which enable current flow through the channel regions to electrically couple the source/drain regions on opposing sides of the channel regions with one another. If the voltage to the selected wordlines is below a threshold level, the current will not flow through the channel regions, and the source/drain regions on opposing sides of the channel regions will not be electrically coupled with one another. The selective control of the coupling/decoupling of the source/drain regions through the level of voltage applied to the wordlines may be referred to as gated coupling of the source/drain regions.

The vertically-extending active regions 20 may be considered to be within access transistors 58, with each access transistor comprising one of the active regions and a transistor gate adjacent such active region. The transistor gate corresponds to a portion of a conductive structure 36 which is operatively adjacent the channel region 30 of the active region.

Insulative material 46 is shown to extend around the wordlines 36. The insulative material 46 may comprise any suitable composition(s); and in some embodiments may comprise, consist essentially of, or consist of silicon dioxide. Portions of the insulative material 46 between the wordlines 36 and the channel regions 30 may be considered to correspond to gate dielectric material 48. Such gate dielectric material may or may not be the same as the rest of the insulative material 46.

The array 22 of FIGS. 1 and 1A may be considered to correspond to a memory array, with individual memory cells 19 of the memory array comprising a storage-element 18 together with an access transistor 58.

In the illustrated embodiment, additional conductive structures 50 extend along the rows of the array 22, and along the fourth sides of the four-sided areas 40. The structures 50 may be referred to as third structures to distinguish them from the first and second structures 32 and 36.

The structures 50 comprise conductive material 52. The conductive material 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 52 of the third structures 50 may comprise a same composition as one or both of the materials 34 and 38 of the first and second structures 32 and 36. In some embodiments, the conductive material 52 of the third structures 50 may comprise a different composition than one or both of the materials 34 and 38 of the first and second structures 32 and 36. In some embodiments, the material 52 may comprise conductively-doped silicon (e.g., polysilicon) and/or metal; with configurations comprising both conductively-doped silicon and metal corresponding to hybrid structures in some applications.

The third structures 50 of FIGS. 1 and 1A may correspond to shield structures which provide shielding between adjacent (neighboring) components (e.g., neighboring active regions and/or neighboring wordlines). The shield structures may prevent undesired capacitive coupling between the neighboring components. In some embodiments, the shield structures 50 may be electrically coupled with a suitable reference voltage (reference voltage node) 54. The reference voltage 54 may be any suitable reference voltage, and in some embodiments may be the same as the common plate (CP) voltage.

Insulative material 56 is adjacent to the conductive structures 50. In the shown embodiment, the insulative material 56 is under the conductive structures 50, and is along sidewalls of the conductive structures 50. The insulative material 56 may comprise any suitable composition(s); and in some embodiments may comprise, consist essentially of, or consist of silicon dioxide. The insulative material 56 may or may not be the same as the insulative material 46 adjacent the wordlines 36.

Figure 2:
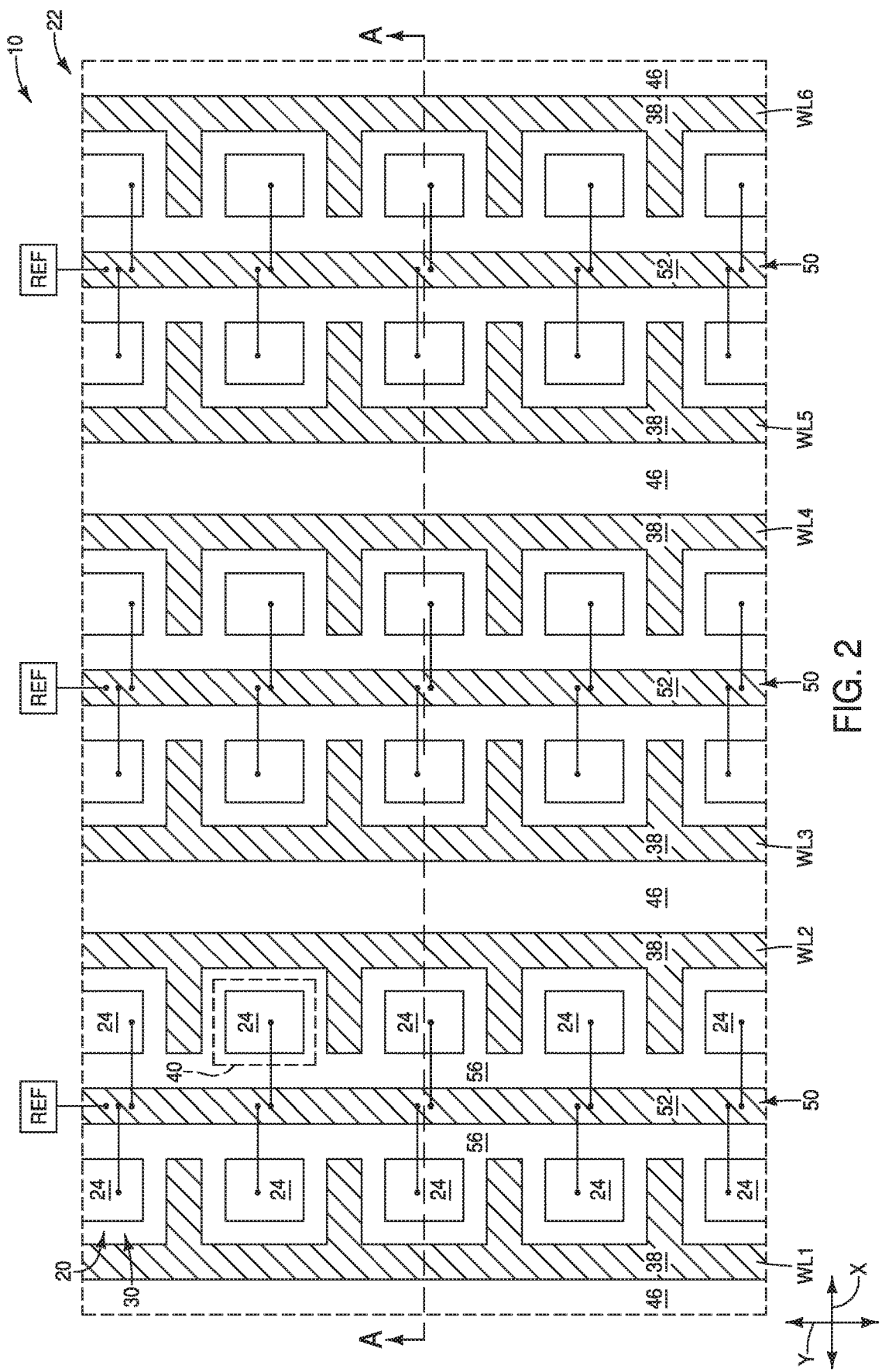
FIGS. 2 and 2A are diagrammatic views of a region of an example integrated assembly.
Figure 2A:
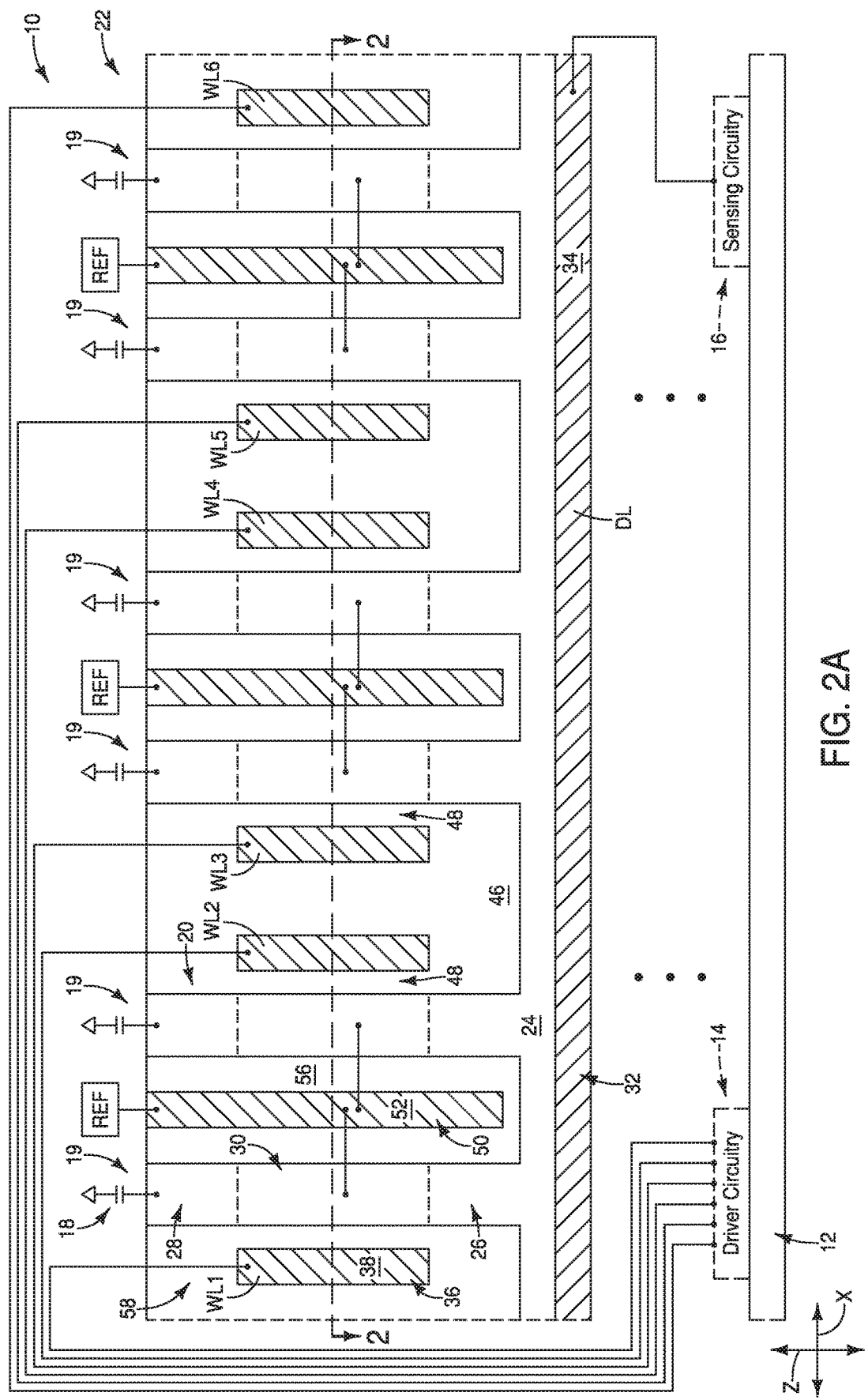

In some applications, the structures 50 may be configured to alleviate or prevent floating body problems. Floating body effects may problematically occur with vertical access transistors; as described in U.S. Pat. No. 8,878,271, with Kamal M. Karda as the first inventor, and which is assigned to Micron Technology, Inc. The floating body effects result from the channel region of a vertical access transistor being within a body of semiconductor material which is not electrically coupled with a reference voltage (i.e., which "floats" rather than being set to a specific reference voltage). The floating body effects may lead to degraded charge retention, power distribution problems, and/or other problems across a memory array. FIGS. 2 and 2A show the assembly 10 in an example application which the structures 50 are electrically coupled with body regions (channel regions) 30 of the access transistors 58.

The conductive structures 50 may be electrically coupled with a suitable reference voltage (reference voltage node) REF to enable floating body effects to be alleviated. In some embodiments, such reference voltage may be the ground voltage GND. In other embodiments, such reference voltage may be less than the ground voltage or greater than the ground voltage.

The assemblies 10 of FIGS. 1 and 2 may be formed with any suitable processing. Example processing is described with reference to FIGS. 3-19.

Figure 3:
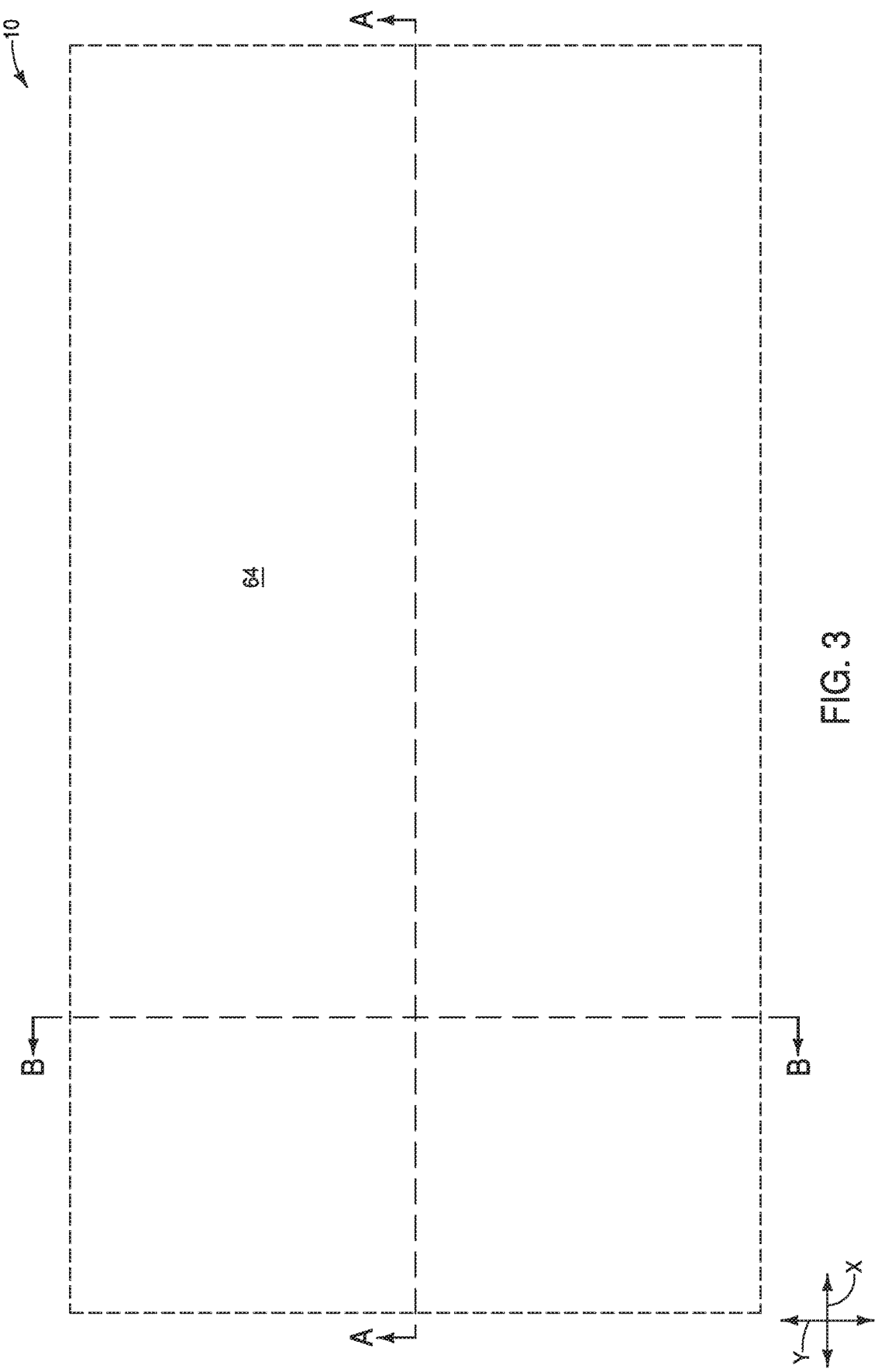
Figure 3A:
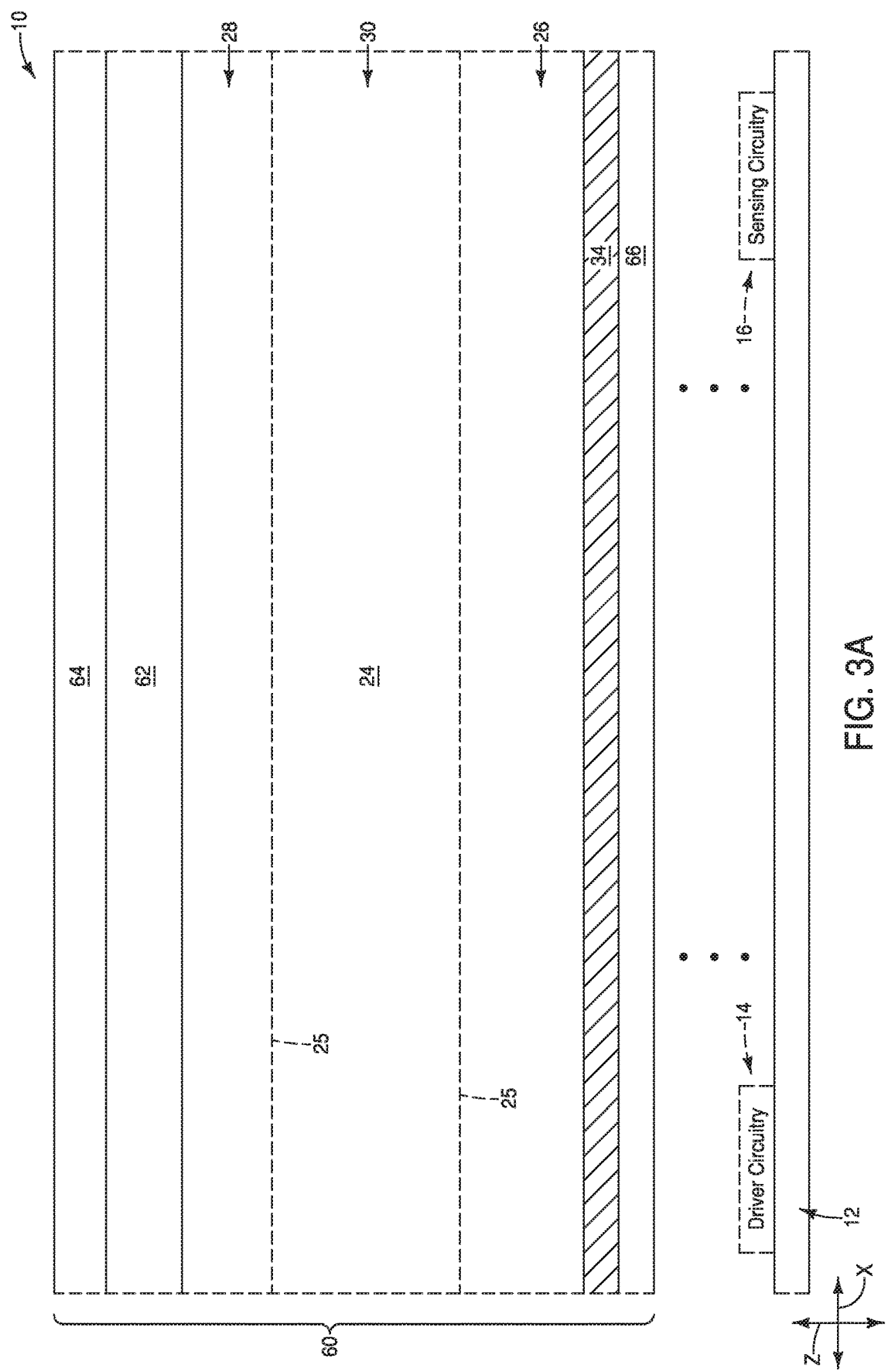

Referring to FIGS. 3-3B, the assembly 10 is shown at a process stage in which a stack 60 is formed over the base 12. The stack 60 includes an expanse of the digit line material 34, an expanse of the semiconductor material 24 over the digit line material, a first masking material 62 over the semiconductor material, and a second masking material 64 over the first masking material.

The semiconductor material 24 is shown to comprise the conductively-doped regions 26 and 28, and to comprise the region 30 as a central region between the conductively-doped regions 26 and 28. The semiconductor material 24 is ultimately patterned into active regions analogous to the regions 20 described above with reference to FIGS. 1 and 2. The regions 26 and 28 may be heavily doped with n-type dopant (e.g., phosphorus, arsenic, etc.), and the central region 30 may be lightly doped with suitable dopant to achieve a desired threshold voltage in active regions patterned from the semiconductor material 24. The regions 26, 28 and 30 may have any suitable vertical thicknesses. In some embodiments, the regions 26, 28 and 30 may all have about the same vertical thicknesses as one another. In other embodiments, at least one of the regions 26, 28 and 30 may have a different vertical thickness relative to others of the regions. Also, in some embodiments the heavily-doped regions 26 and 28 may have about the same vertical thickness as one another, and in other embodiments the heavily-doped regions 26 and 28 may have different vertical thicknesses relative to one another.

The masking materials 62 and 64 (e.g., materials suitable for hard masks) may comprise any suitable compositions. In some embodiments, the first masking material 62 may comprise, consist essentially of, or consist of silicon nitride; and the second masking material 64 may comprise, consist essentially of, or consist of silicon dioxide.

In the illustrated embodiment, the stack 60 includes an insulative material 66 under the digit line material 34. The insulative material 66 may comprise any suitable composition(s); and in some embodiments may comprise, consist essentially of, or consist of silicon dioxide.

In the shown embodiment, the logic circuitry 14 and 16 is provided over the base 12 at the processing stage of FIGS. 3-3B. In other embodiments, at least some of the logic circuitry may be provided in other locations (e.g., laterally outward of the stack 60, above the stack 60, etc.) and/or may be provided at a subsequent process stage.

Figure 4:
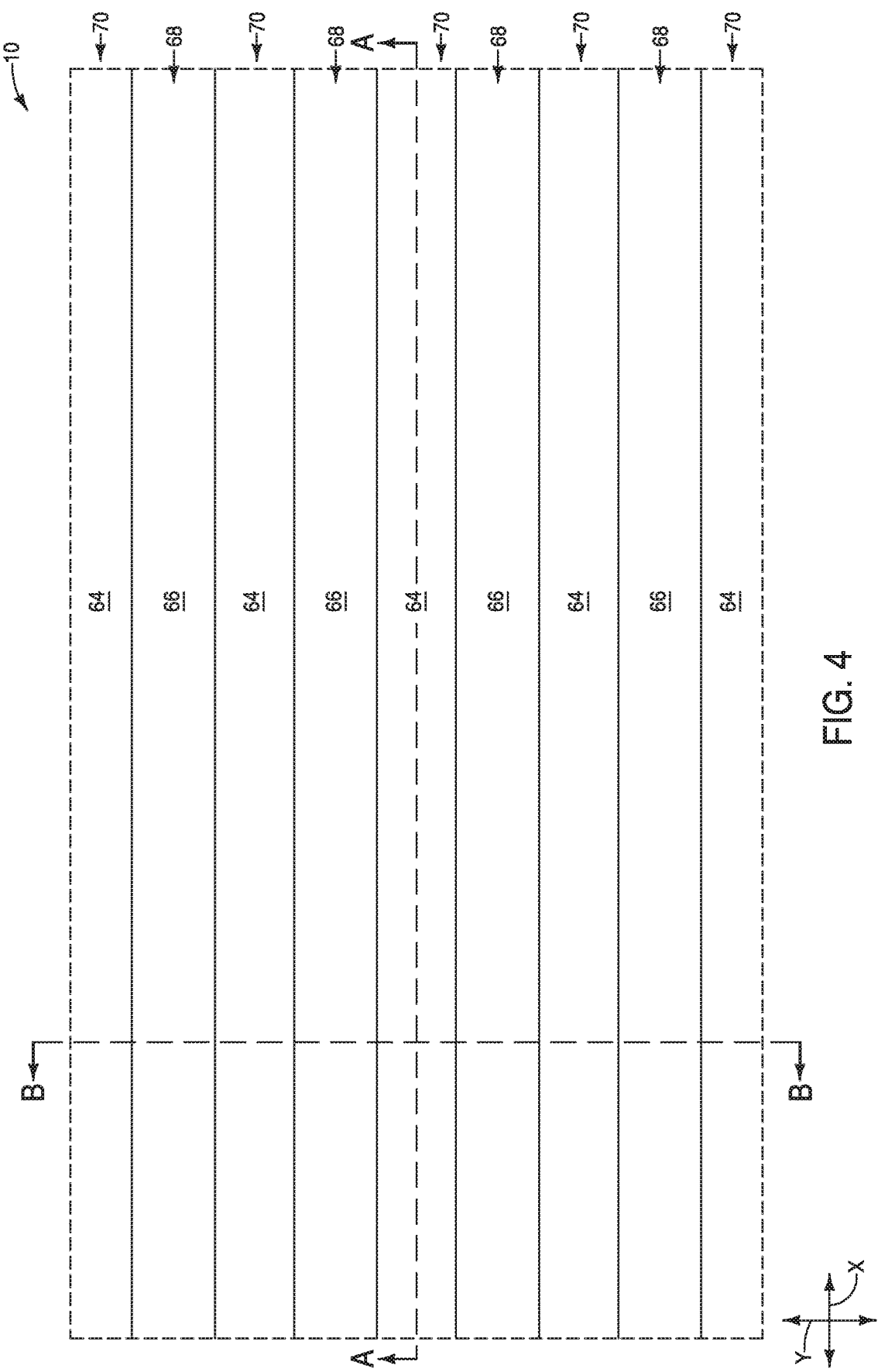
FIGS. 4-4B are diagrammatic views of the region of the example integrated assembly of FIG. 3 at a process stage subsequent to that of FIG. 3.
Figure 4A:
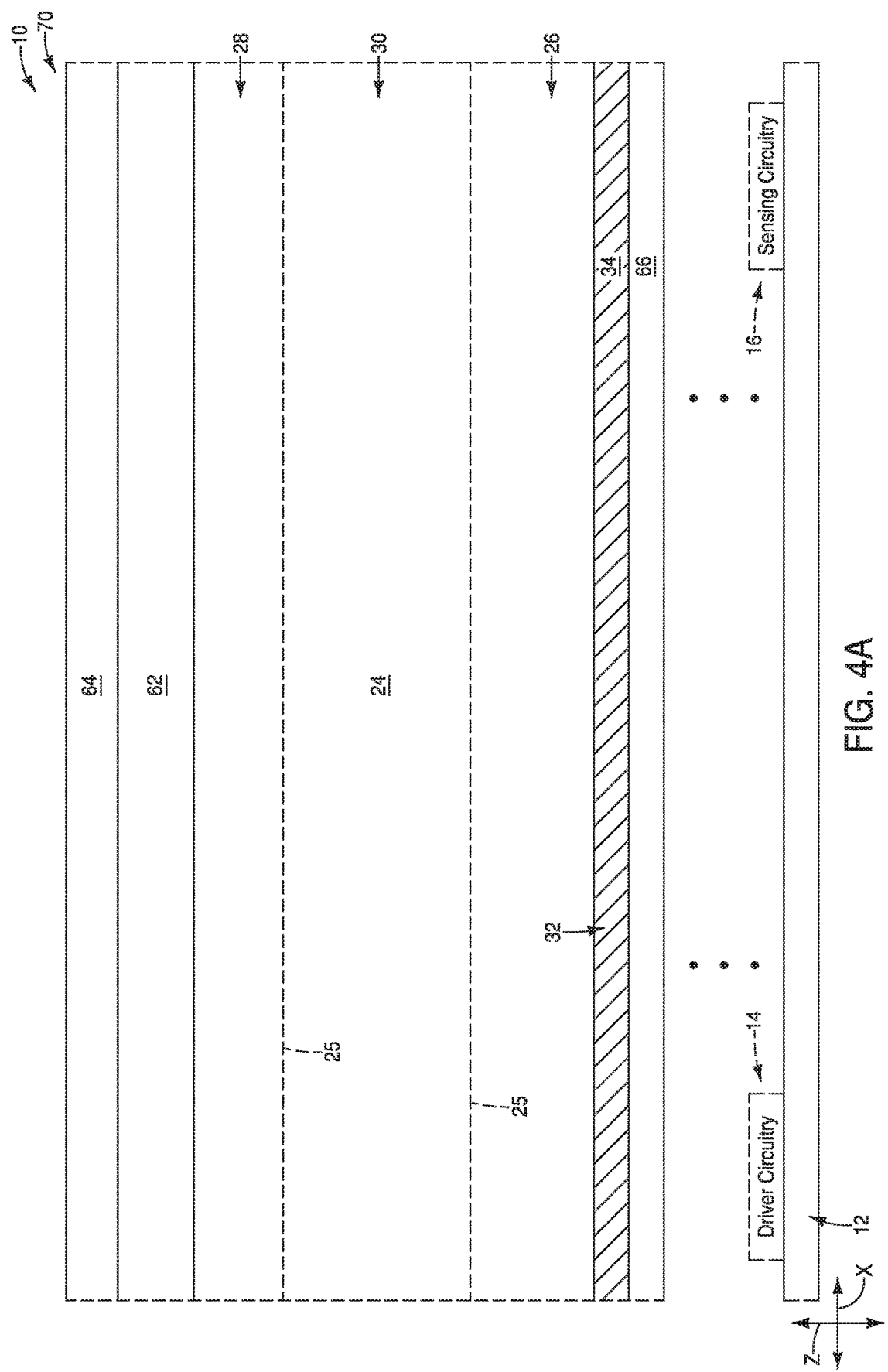
Figure 4B:
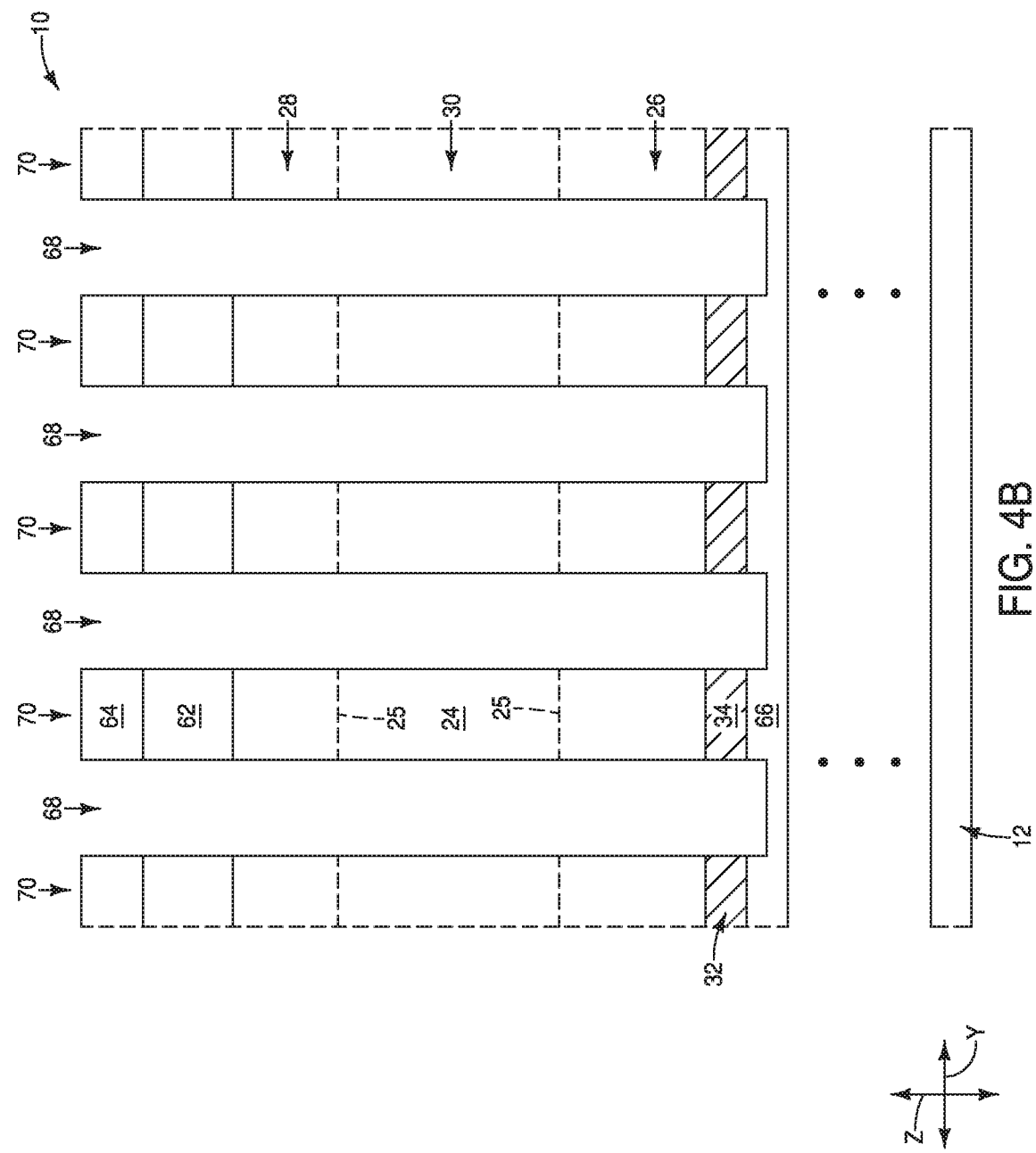

Referring to FIGS. 4-4B, trenches 68 are formed to extend through the materials 34, 24, 62 and 64, and in the shown embodiment extend into the material 66. The formation of the trenches 68 patterns the materials 34, 24, 62 and 64 into features (rails) 70 which extend along a first direction (the illustrated x-axis direction). In some embodiments, the trenches 68 may be referred to as first trenches, and may be considered to laterally space the features 70 from one another.

The trenches 68 may be formed with any suitable processing. For instance, a photolithographically-patterned photoresist mask (not shown) may be formed over the masking material 64, a pattern may be transferred from the photoresist mask into the underlying materials 66, 34, 24, 62 and 64 with one or more suitable etches, and then the photoresist mask may be removed to leave the illustrated configuration of FIGS. 4-4B.

The formation of the trenches through the digit line material 34 patterns the digit line material into the digit lines 32. The digit lines 32 are electrically coupled with the conductively-doped bottom regions 26 of the features 70.

Figure 5:
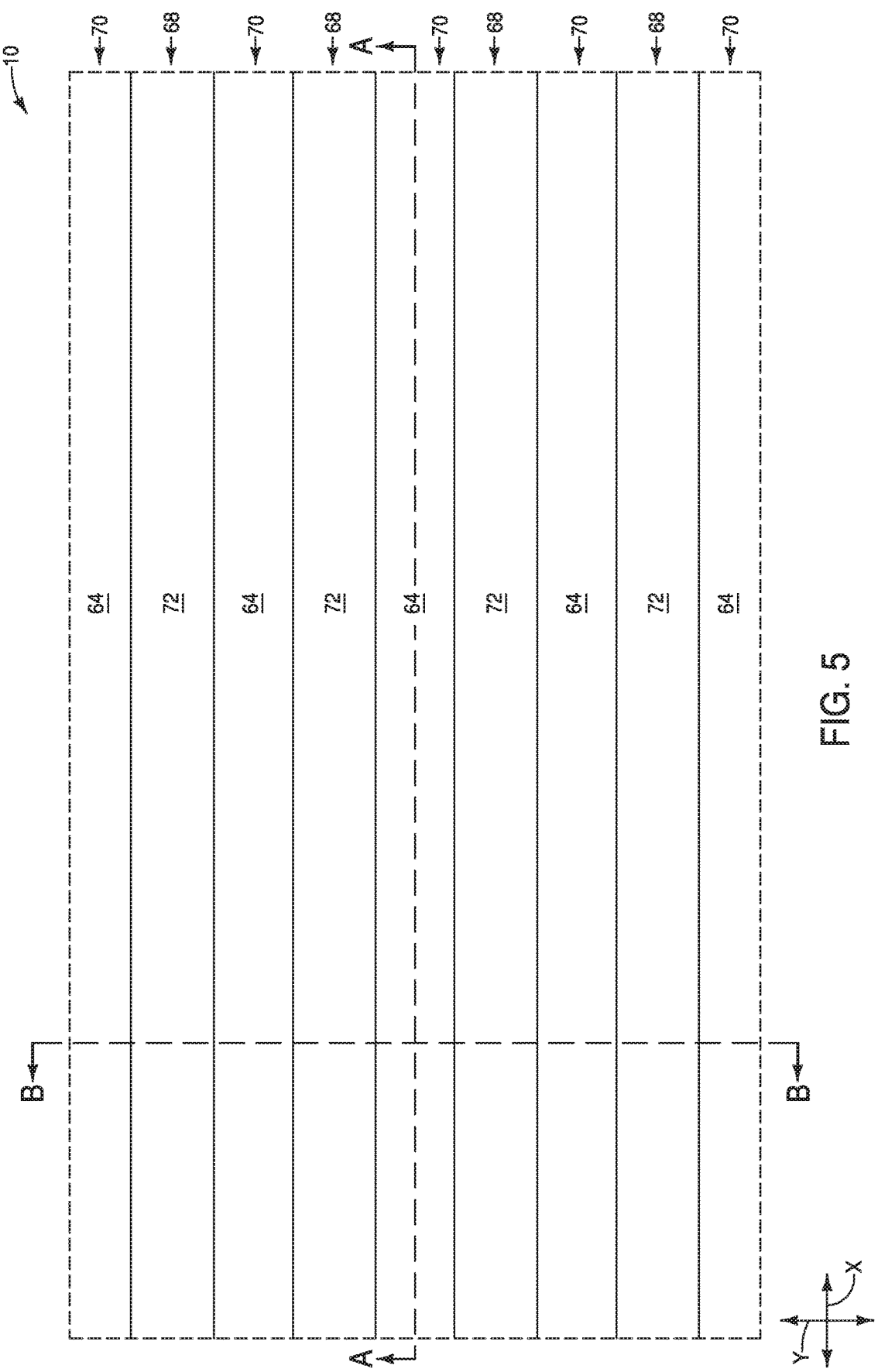
Figure 5A:
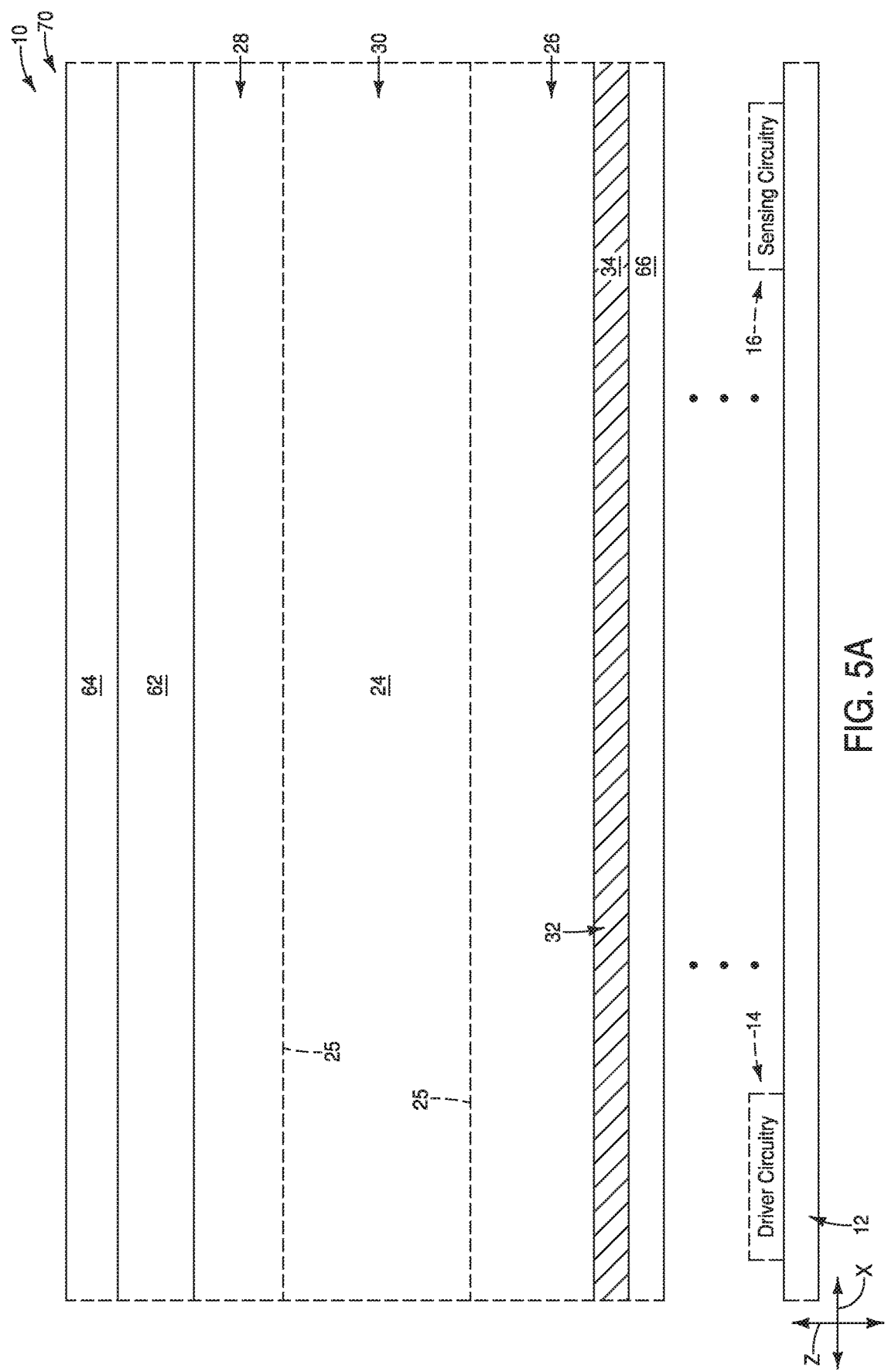

Referring to FIGS. 5-5B, insulative material 72 is formed within bottoms of the trenches 68. The insulative material 72 may be considered to be configured as steps 74 which are provided along bottom regions of the features 70. In the illustrated embodiment, the steps 74 have uppermost surfaces 75 which are at about the same height as uppermost boundaries of the bottom source/drain regions 26 (i.e., are provided at about the same level as the boundary 25 between the regions 26 and 30). Uppermost surfaces of the steps 72 may ultimately define a level for the bottom surfaces of wordlines. The uppermost surfaces of the steps 72 may be formed at any desired level, and in other embodiments may be above the illustrated boundary 25 between the regions 26 and 30, or below the illustrated boundary 25 between the regions 26 and 30.

The insulative material 72 may comprise any suitable composition(s); and in some embodiments may comprise, consist essentially of, or consist of silicon nitride.

Figure 6:
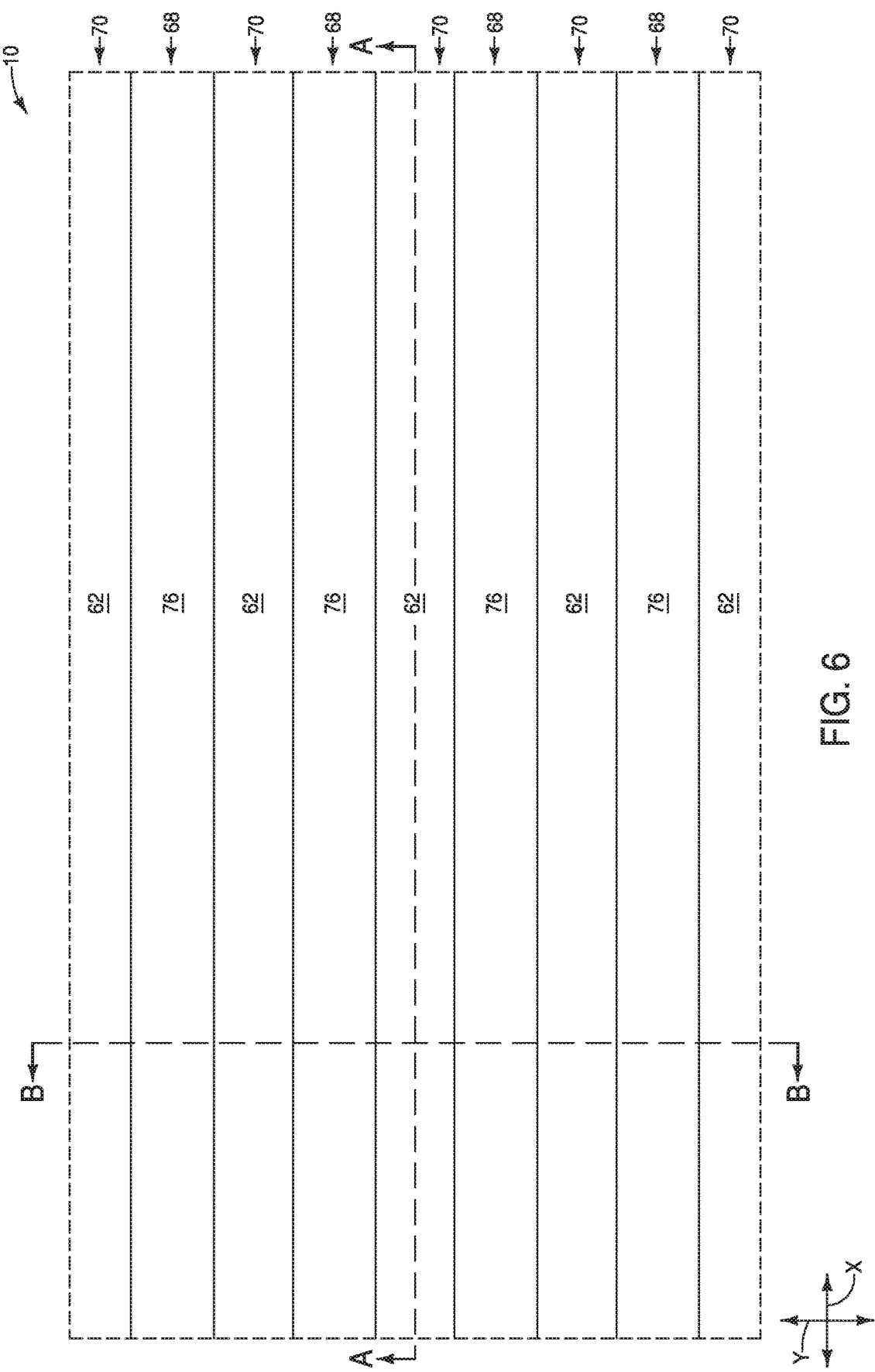
Figure 6A:
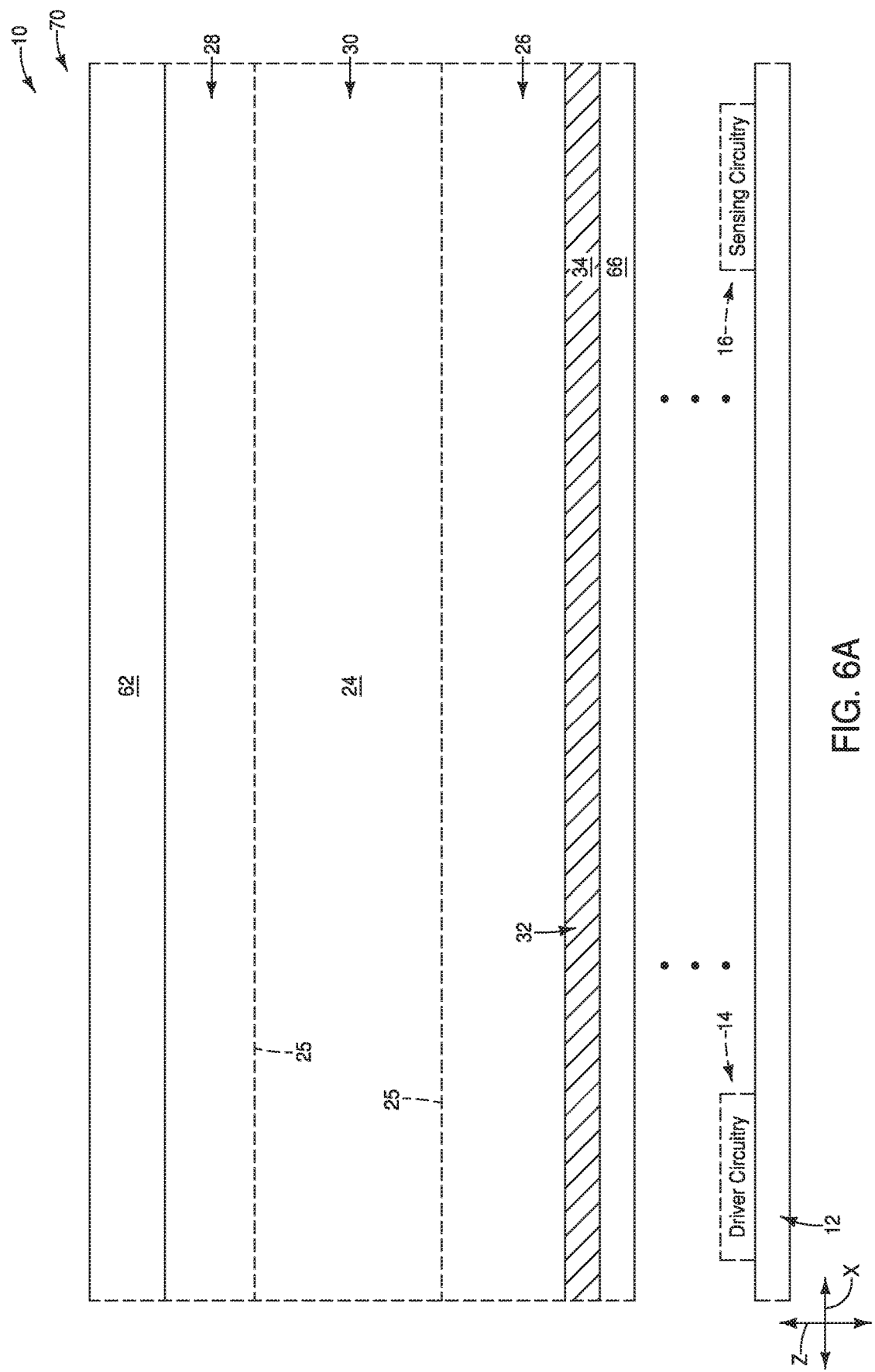

Referring to FIGS. 6-6B, sacrificial material 76 is formed within the trenches 68 and over the steps 74. The sacrificial material 76 may comprise any suitable composition(s); and in some embodiments may comprise, consist essentially of, or consist of silicon dioxide. If the sacrificial material 76 comprises a same composition as the top masking material 64 (FIGS. 5-5B), then the top masking material 64 may be removed during the patterning of the sacrificial material 76 (as shown).

The sacrificial material 76 may be formed to any suitable level within the trenches 68. In the illustrated embodiment, top surfaces 77 of the sacrificial material 76 are at about a same level as the boundaries 25 between the upper source/drain regions 28 and the central regions 30 (i.e., are approximately elevationally aligned with the lower boundaries of the upper source/drain regions 28). In some embodiments, the sacrificial material 76 defines a location where wordline material will be subsequently formed. The upper surfaces 77 of the sacrificial material 76 may be provided at any suitable location for an upper surface of the wordline material.

Figure 7A:
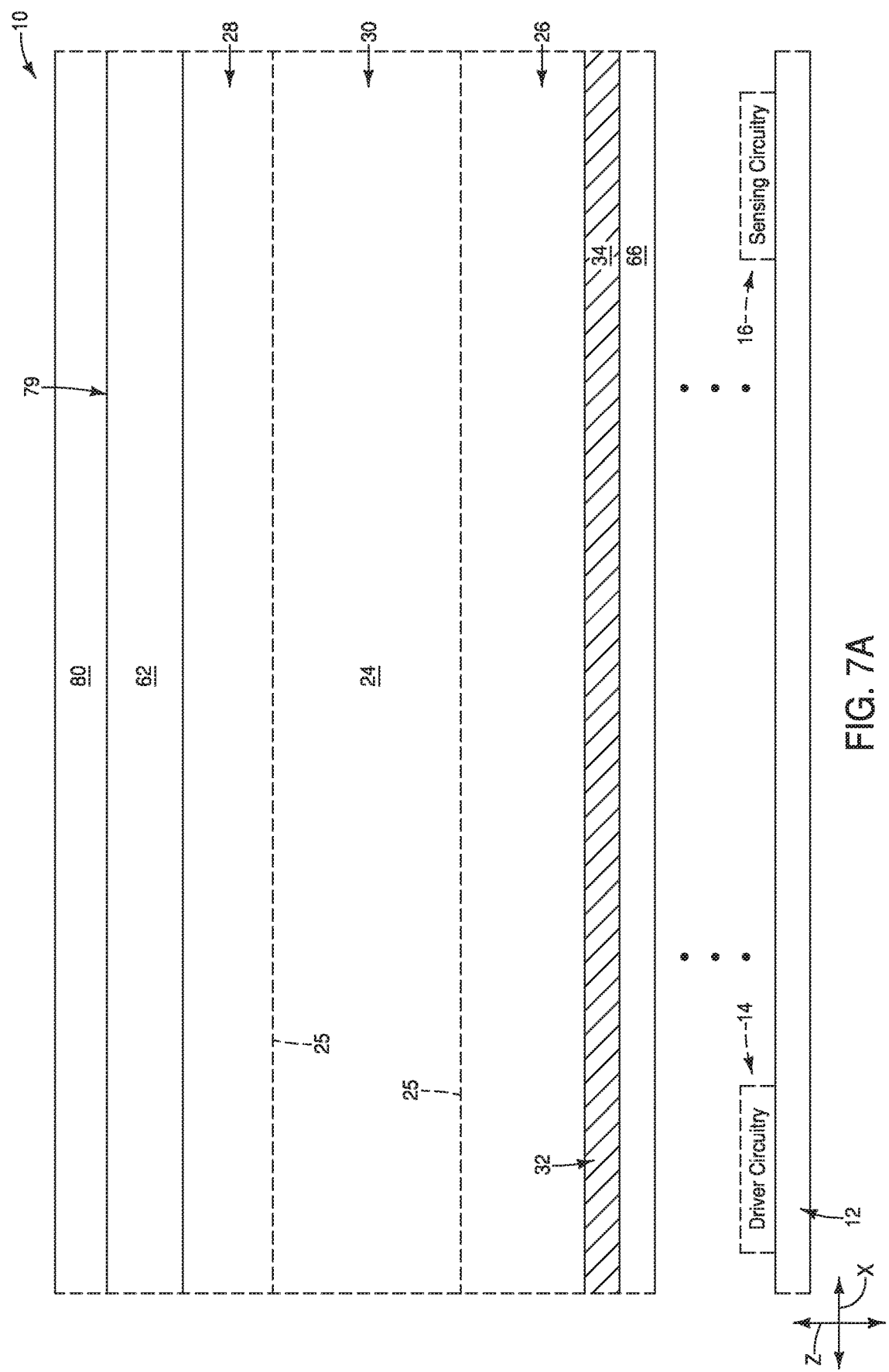

Referring to FIGS. 7-7B, fill material 78 is provided within the trenches 68 to fill such trenches, and then a masking material 80 is formed over the features 70 and the filled trenches. In the illustrated embodiment, a planarized surface 79 is formed to extend across the materials 62 and 78 prior to forming the masking material 80. The planarized surface 79 may be formed with any suitable processing, including, for example, chemical-mechanical polishing (CMP).

The fill material 78 may comprise any suitable composition(s); and in some embodiments may comprise, consist essentially of, or consist of silicon nitride. In some embodiments, the step material 72 and the fill material 78 may both comprise a same composition as one another (e.g., may both comprise silicon nitride).

The masking material 80 (e.g., a material suitable for a hard mask) may comprise any suitable composition(s); and in some embodiments may comprise, consist essentially of, or consist of silicon dioxide.

Figure 8:
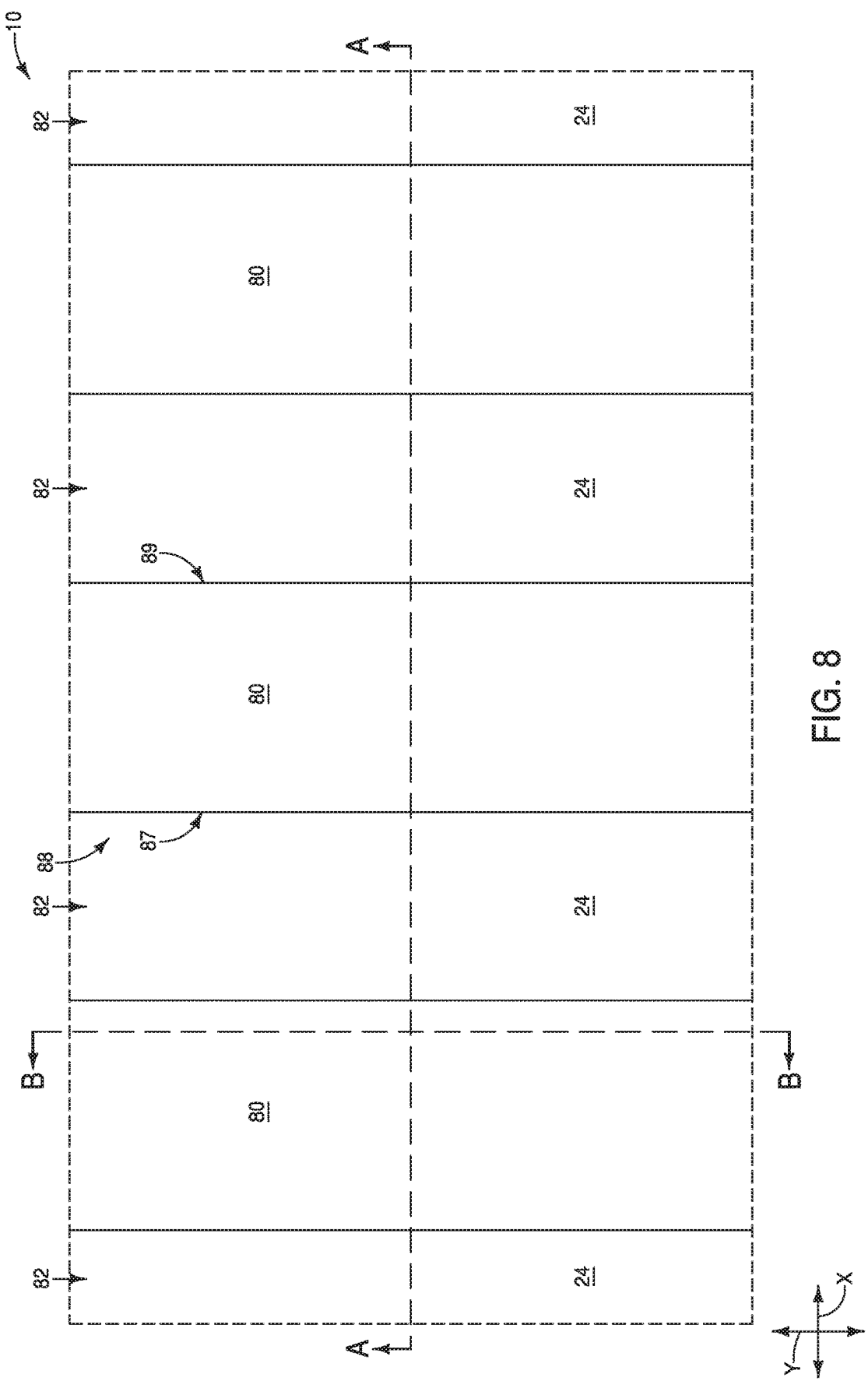
Figure 8A:
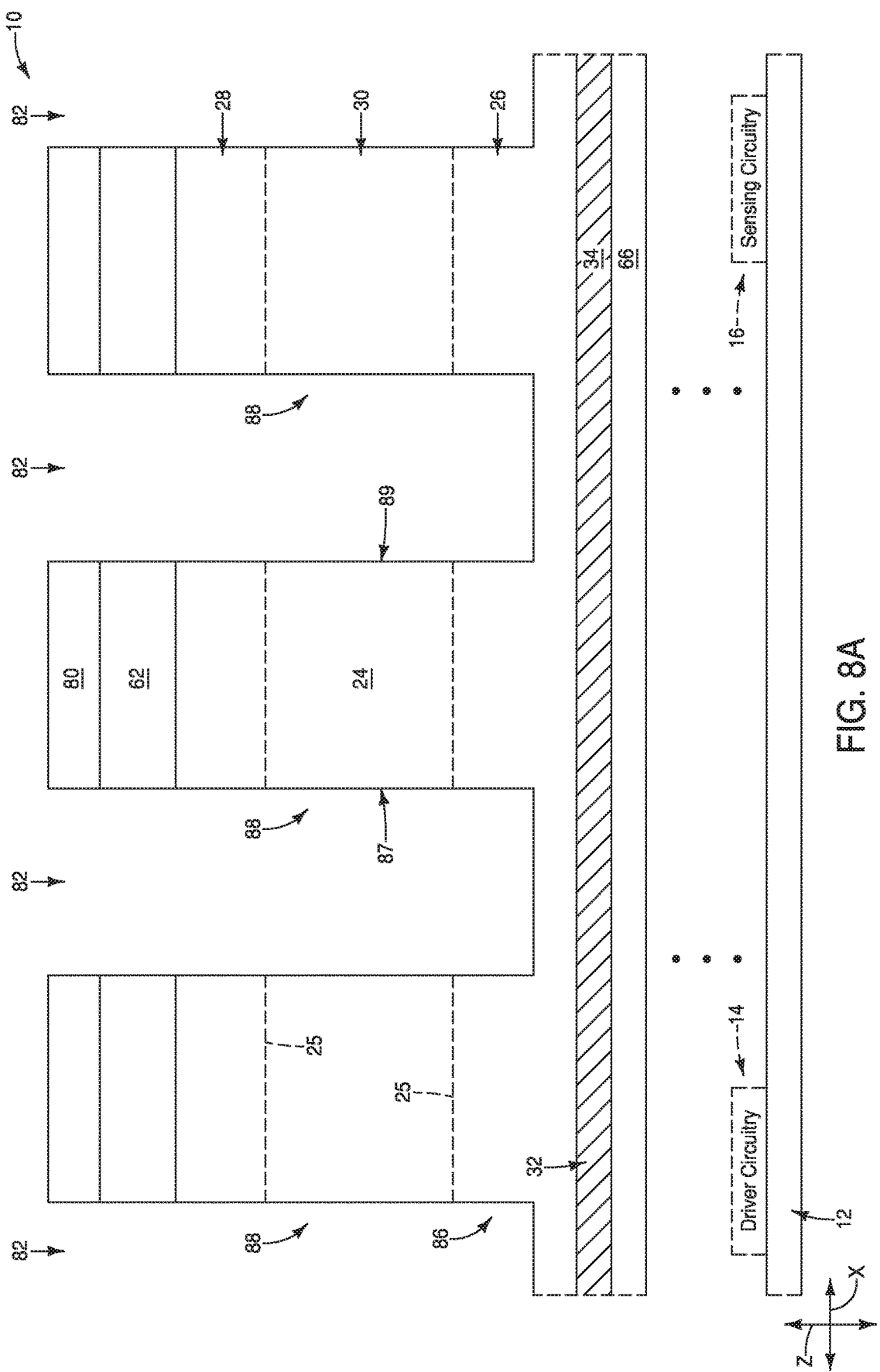

Referring to FIGS. 8-8B, second trenches 82 are formed to extend along a second direction (e.g., the illustrated y-axis direction), with the second direction of the second trenches 82 crossing the first direction of the first trenches 68 (FIGS. 4-4B).

The second trenches 82 extend through the fill material 78, sacrificial material 76 and steps 72, and extend at least partially through the semiconductor material 24. The remaining portion 86 of the semiconductor material 24 includes vertically-extending projections 88. Each of the vertically-extending projections has a first side 87 along one of the second trenches 82, and has a second side 89 along a neighboring one of the second trenches 82.

Figure 9:
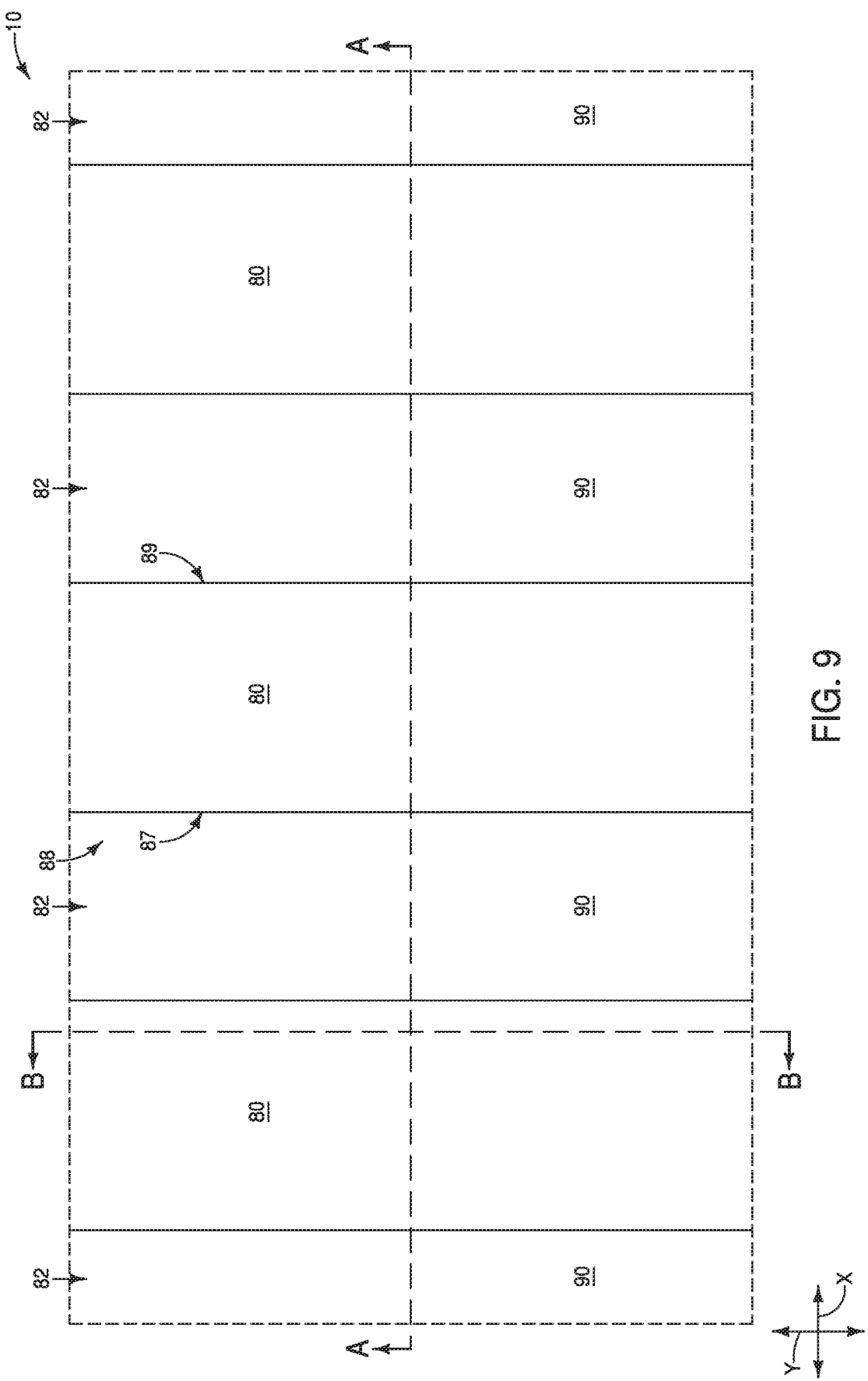
FIGS. 9-9C are diagrammatic views of the region of the example integrated assembly of FIG. 3 at a process stage subsequent to that of FIG. 8.
Figure 9A:
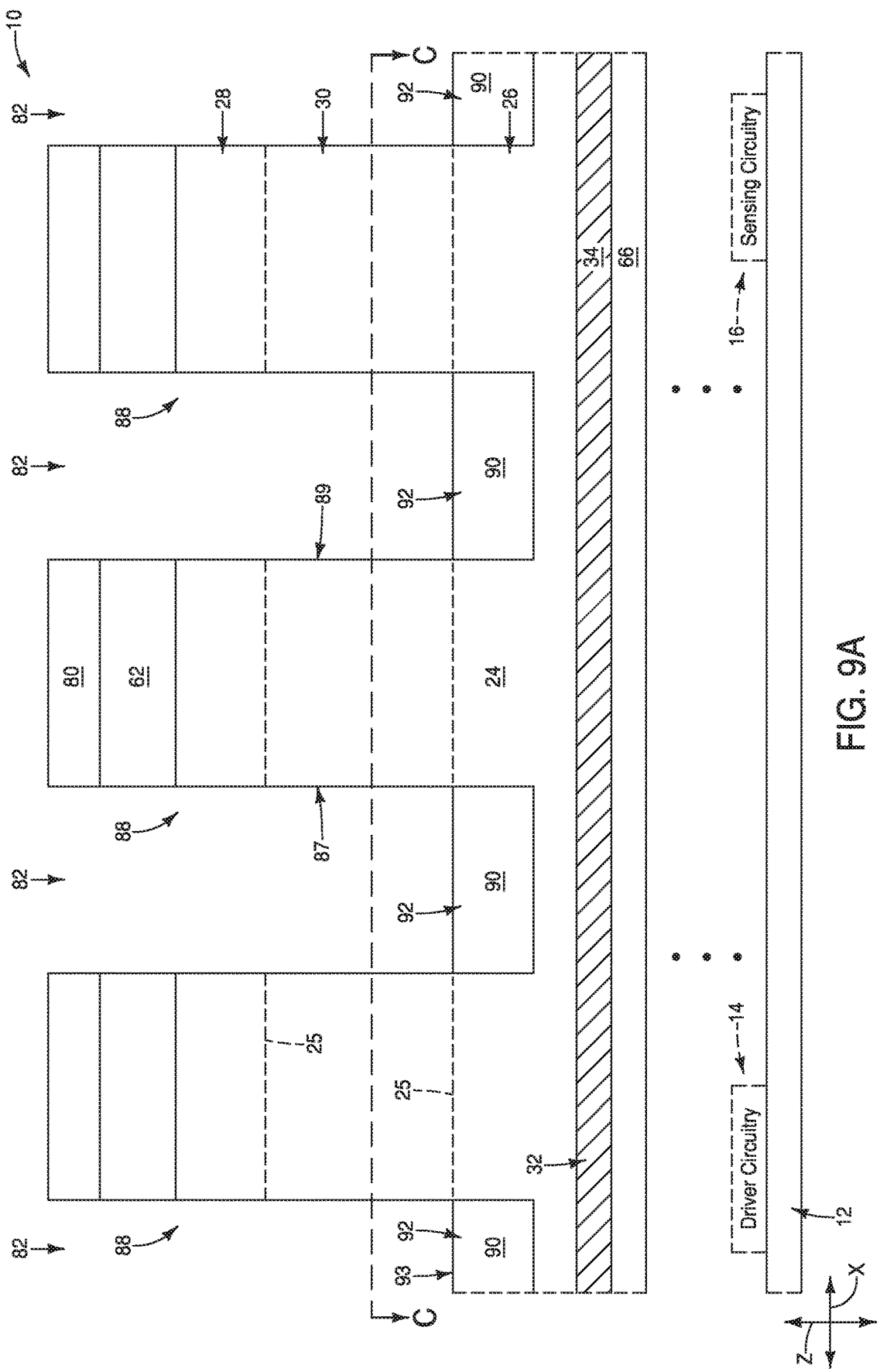
Figure 9C:
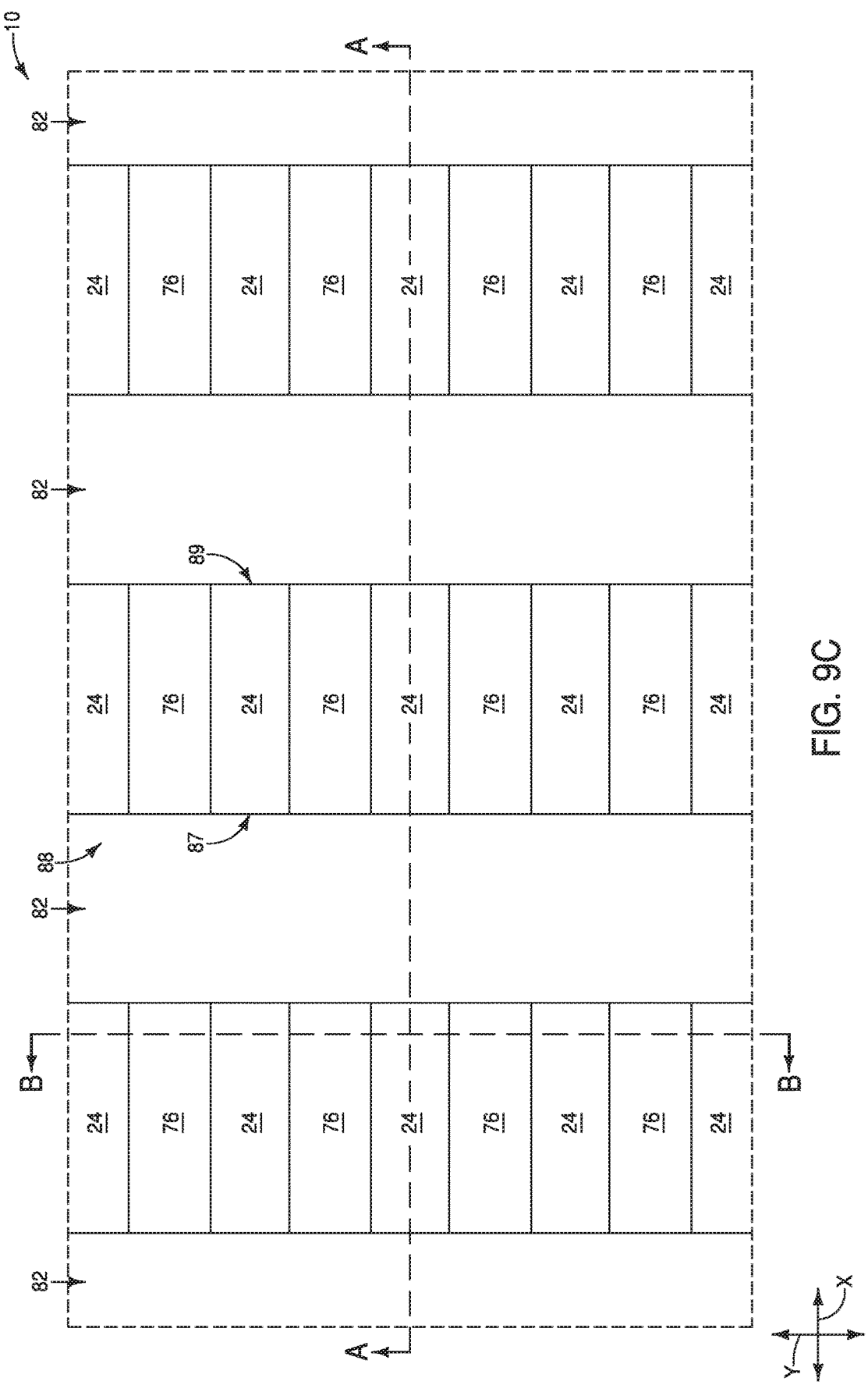

Referring to FIGS. 9-9C, additional step material 90 is formed within the trenches 82. The step material 90 is configured as steps 92. The steps 92 have upper surfaces 93, and such upper surfaces may be at a same elevational level as the upper surfaces 75 of the steps 74 (FIG. 9B). The steps 90 may comprise a same composition as the steps 74; and in some embodiments may comprise, consist essentially of, or consist of silicon nitride.

Figure 10:
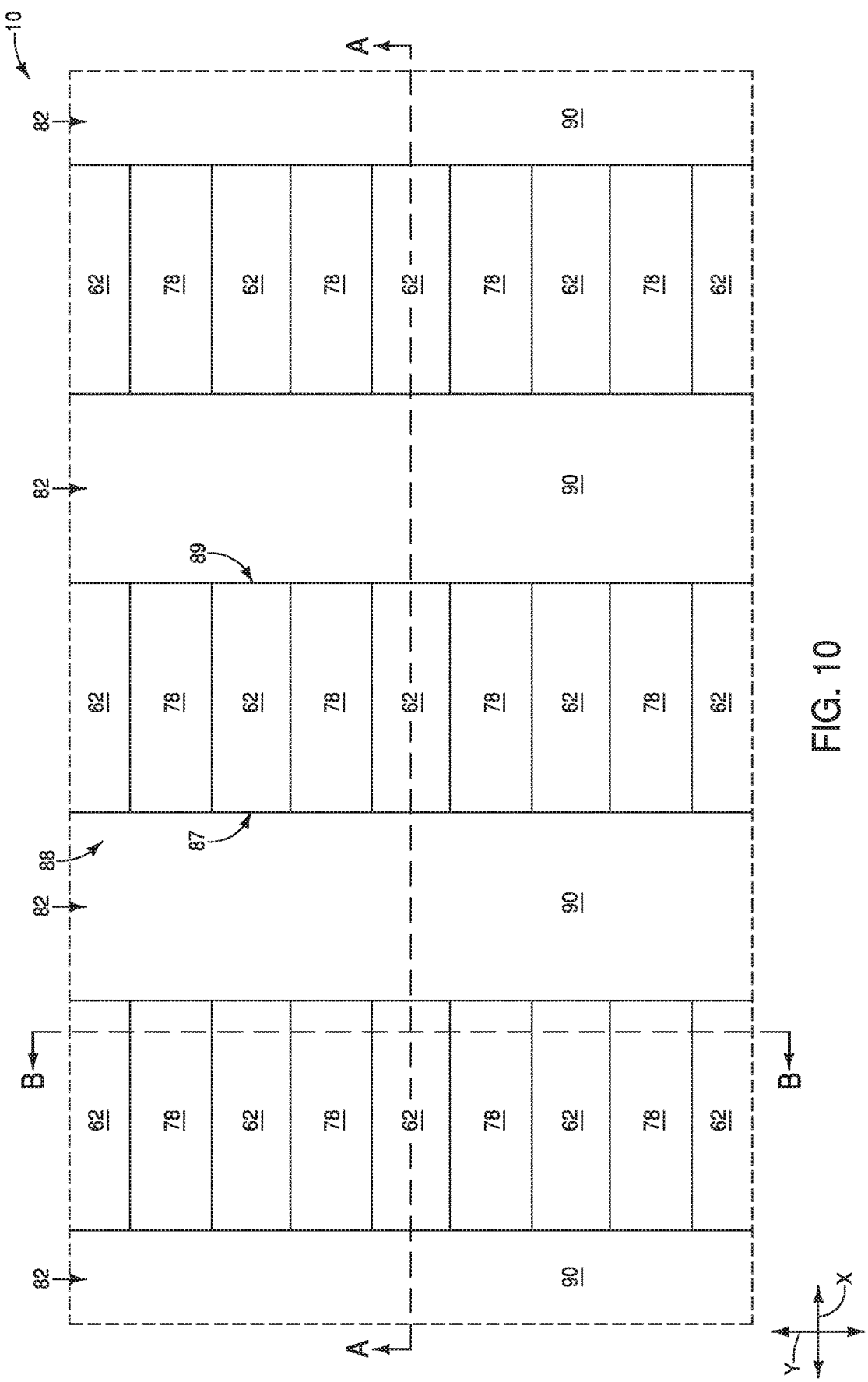
FIGS. 10-10C are diagrammatic views of the region of the example integrated assembly of FIG. 3 at a process stage subsequent to that of FIG. 9.
Figure 10A:
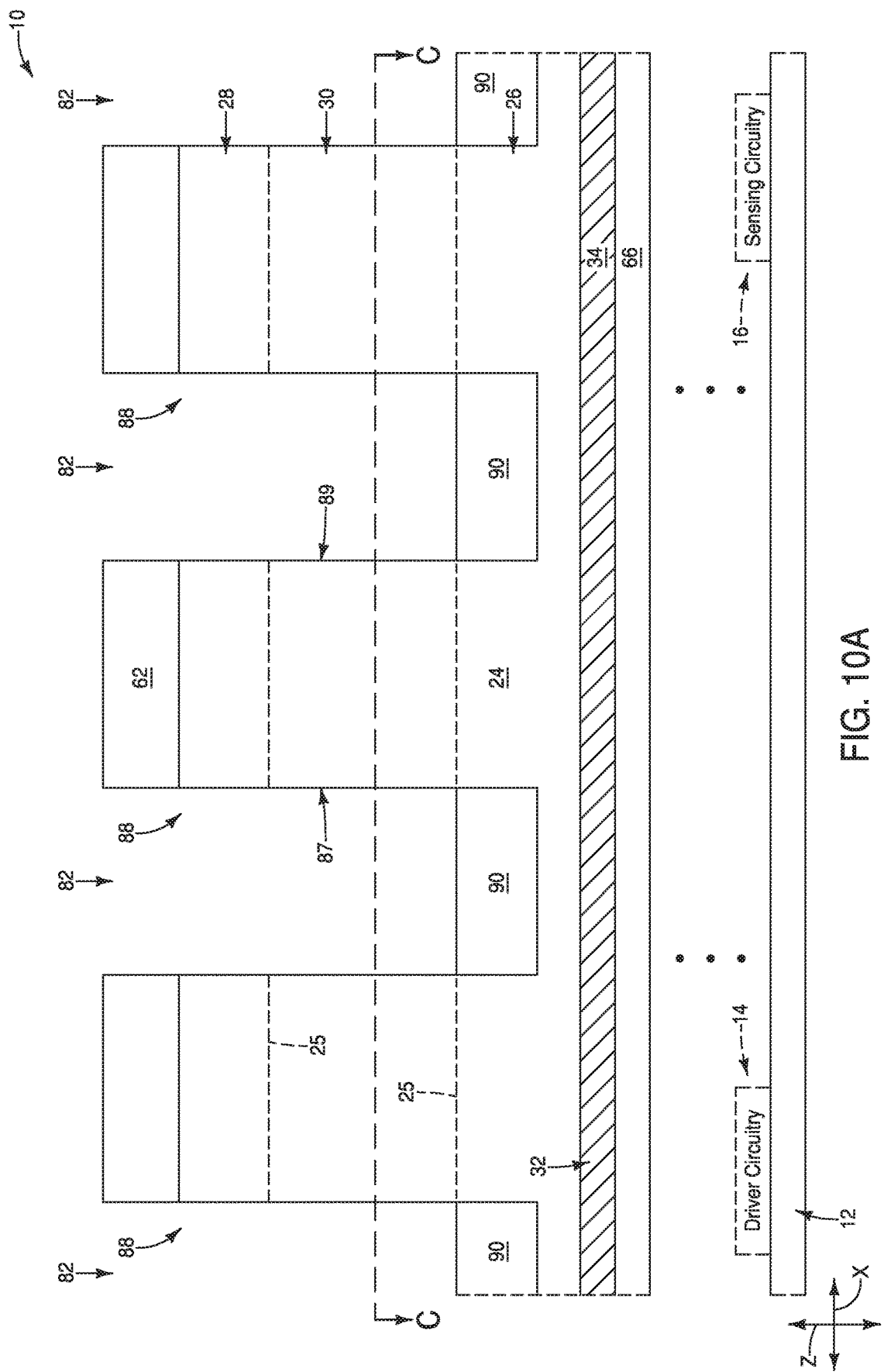
FIGS. 10A and 10B are diagrammatic cross-sectional side views along the lines A-A and B-B of FIGS. 10 and 10C, respectively.
Figure 10B:
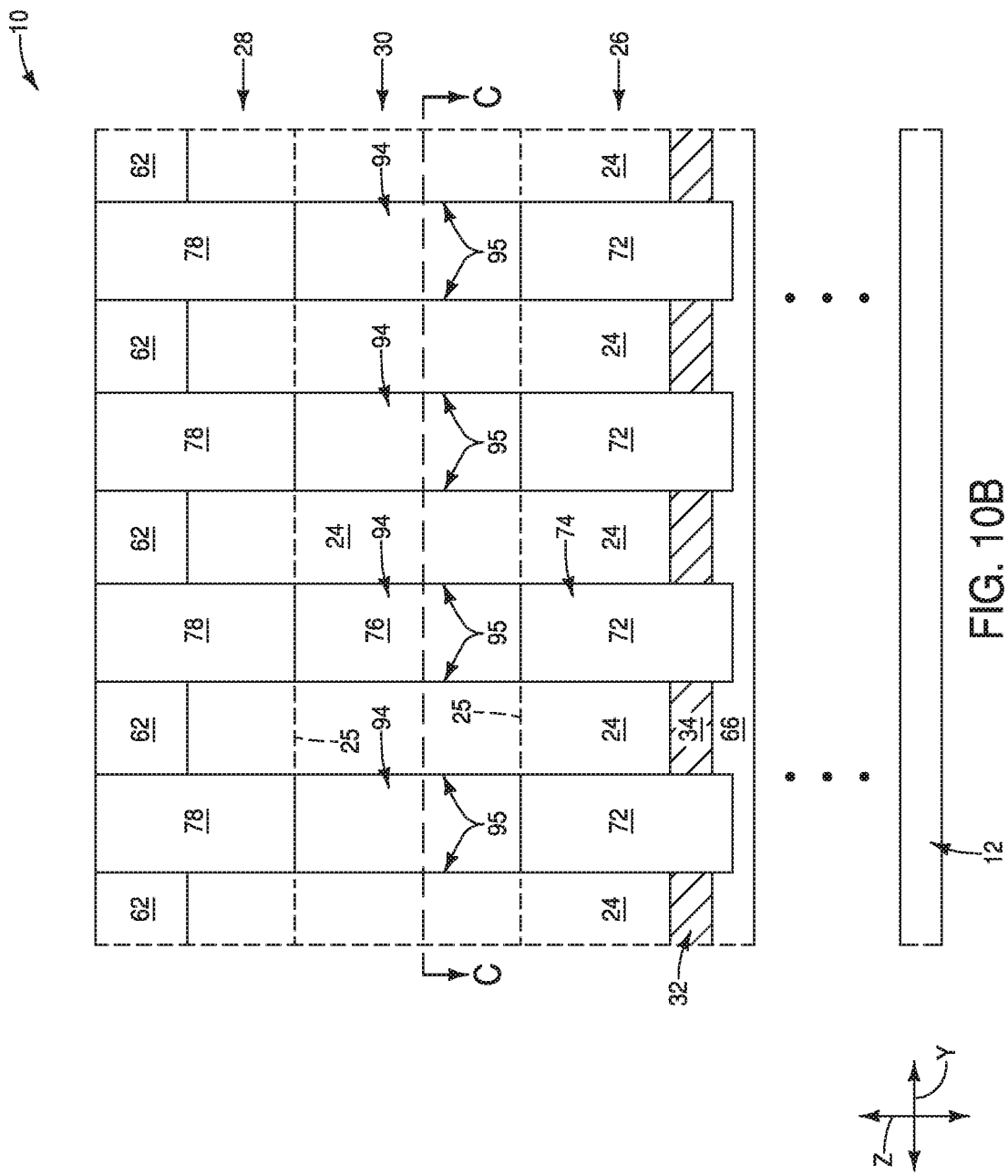
Figure 10C:
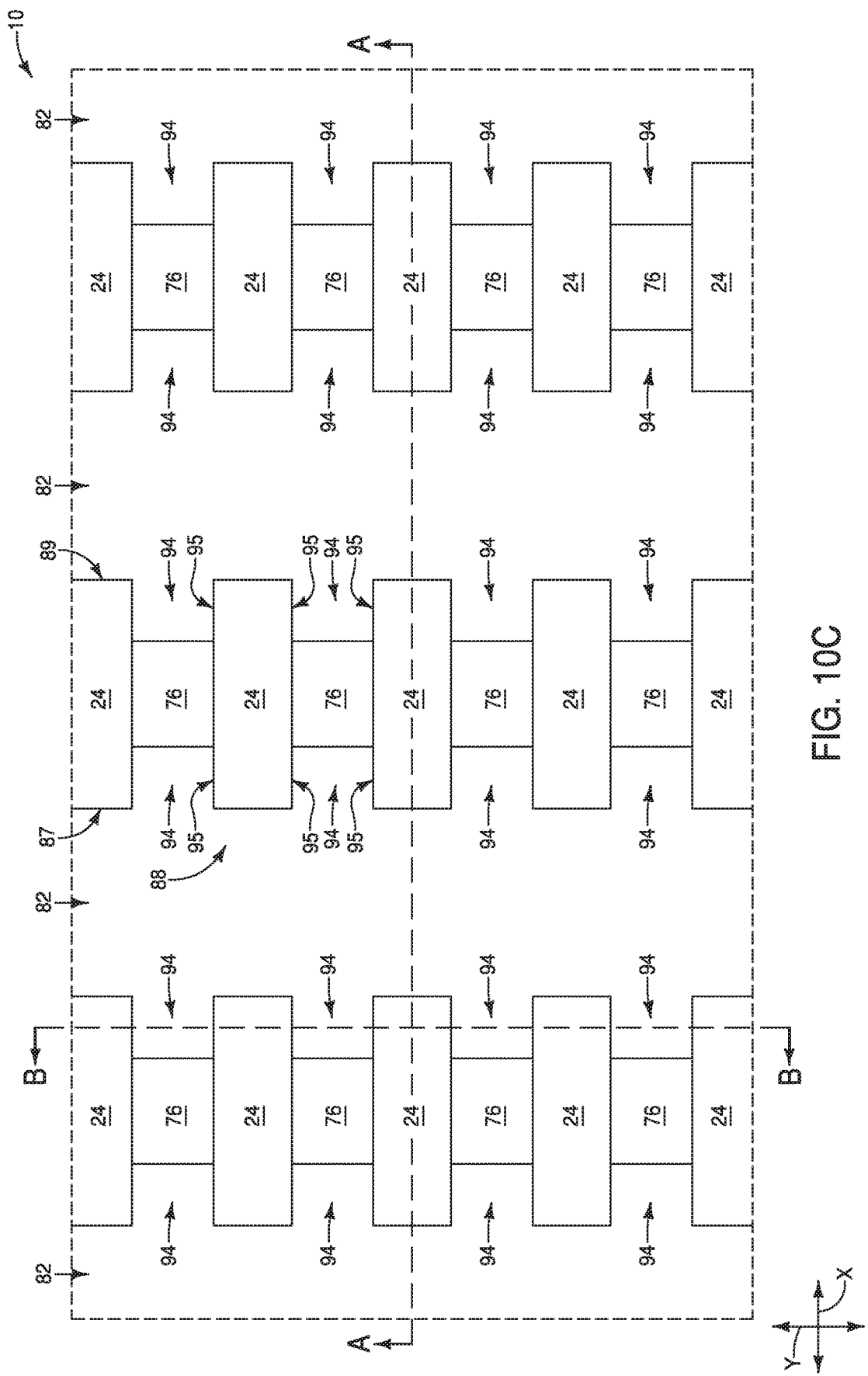

Referring to FIGS. 10-10C, the sacrificial material 76 is recessed to form cavities 94 (FIG. 10C). The cavities 94 are between the steps 74 and the fill material 78, as shown along the cross-section of FIG. 10B. The vertically-extending projections 88 comprise exposed surfaces 95 of the semiconductor material 24 within the cavities 94 and along the first and second sides 87 and 89 of such vertically-extending projections, with example surfaces 95 being labeled in FIGS. 10B and 10C (only some of the surfaces 95 are labeled in FIG. 10C in order to simplify the drawings).

The masking material 80 (FIGS. 9-9C) may be removed during the etching of the sacrificial material 76 (as shown) in embodiments in which the masking material 80 and the sacrificial material 76 both comprise a same composition (e.g., silicon dioxide).

Figure 11:
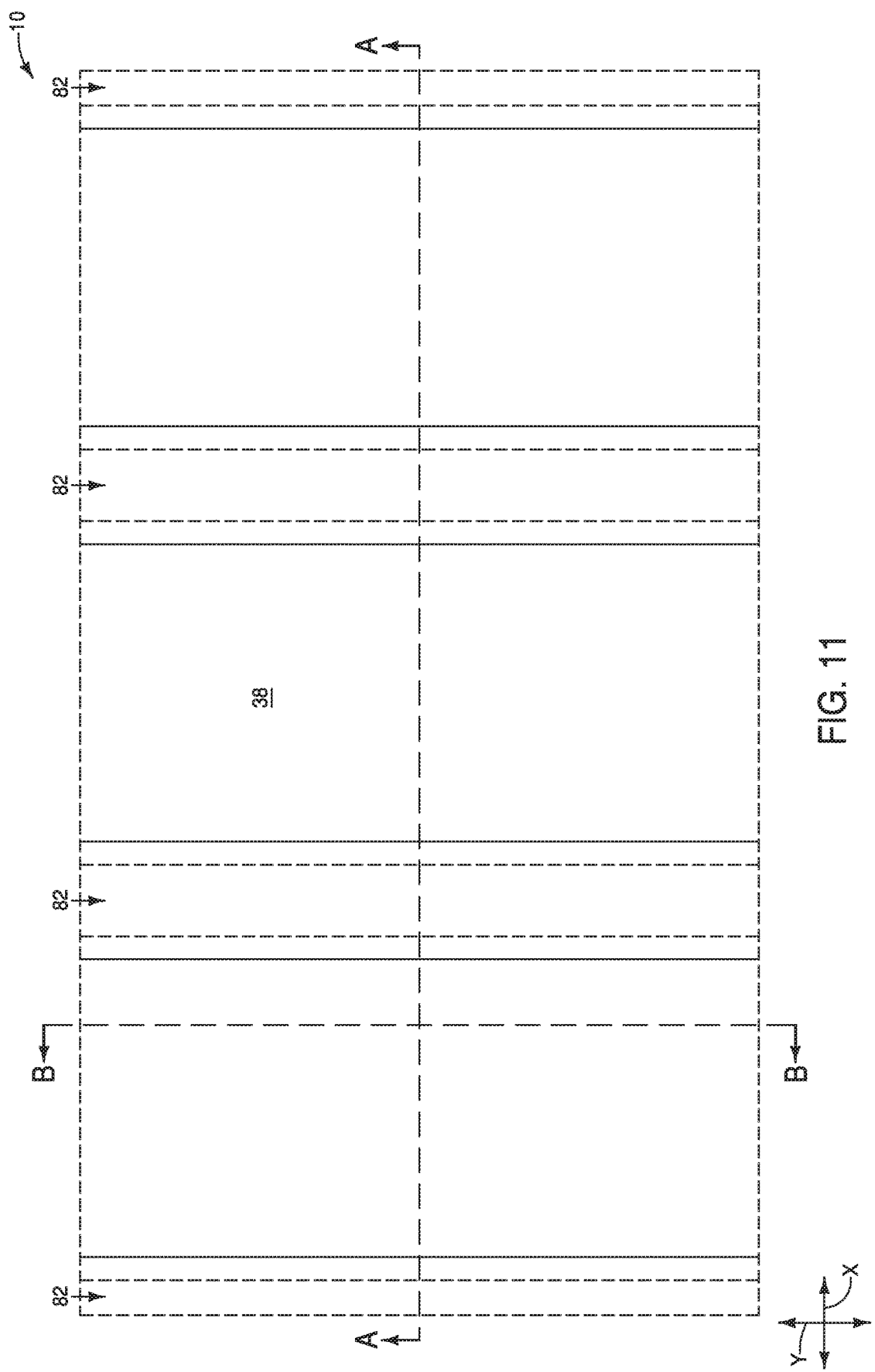
FIGS. 11-11C are diagrammatic views of the region of the example integrated assembly of FIG. 3 at a process stage subsequent to that of FIG. 10.
Figure 11A:
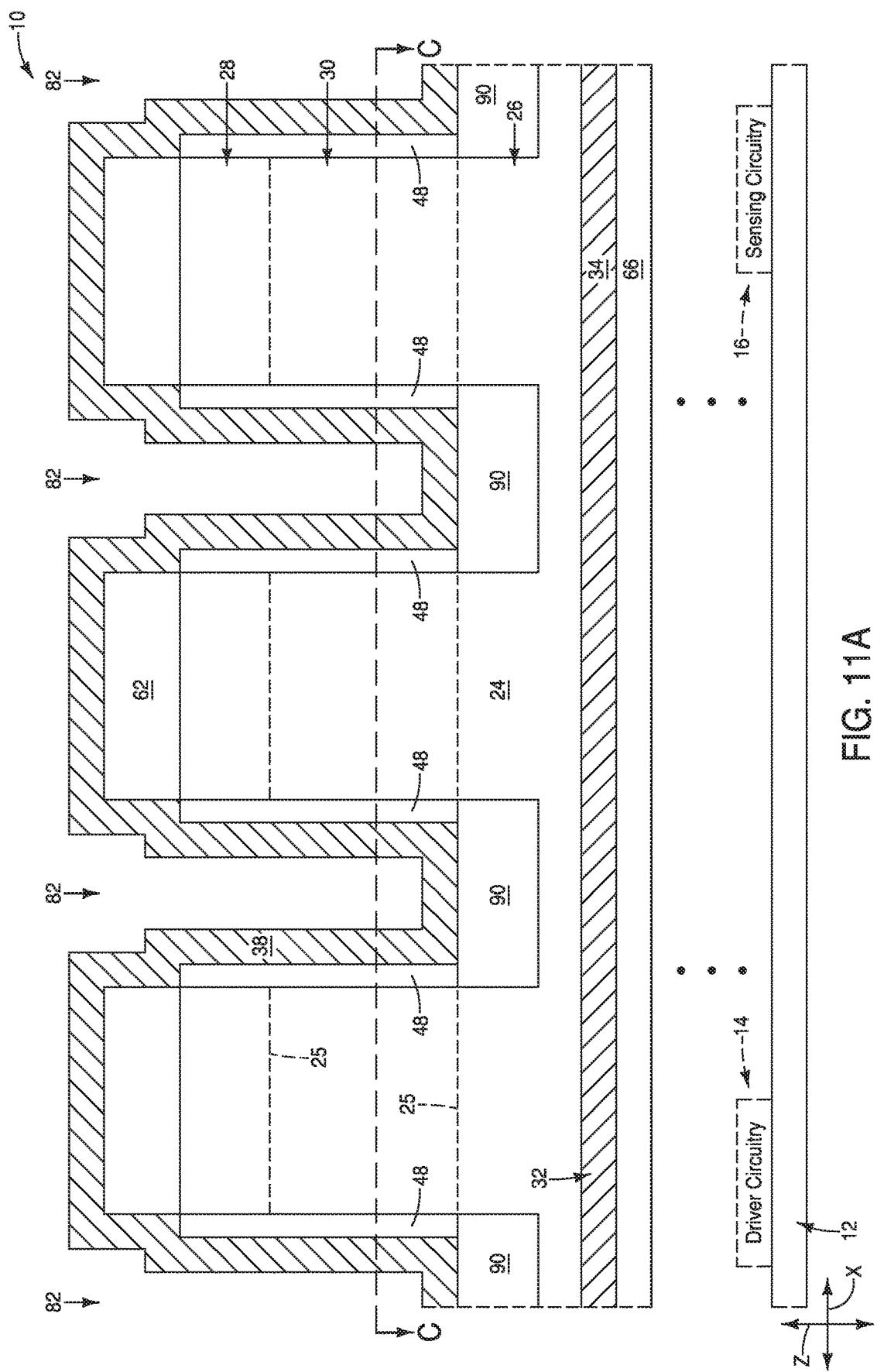
Figure 11C:
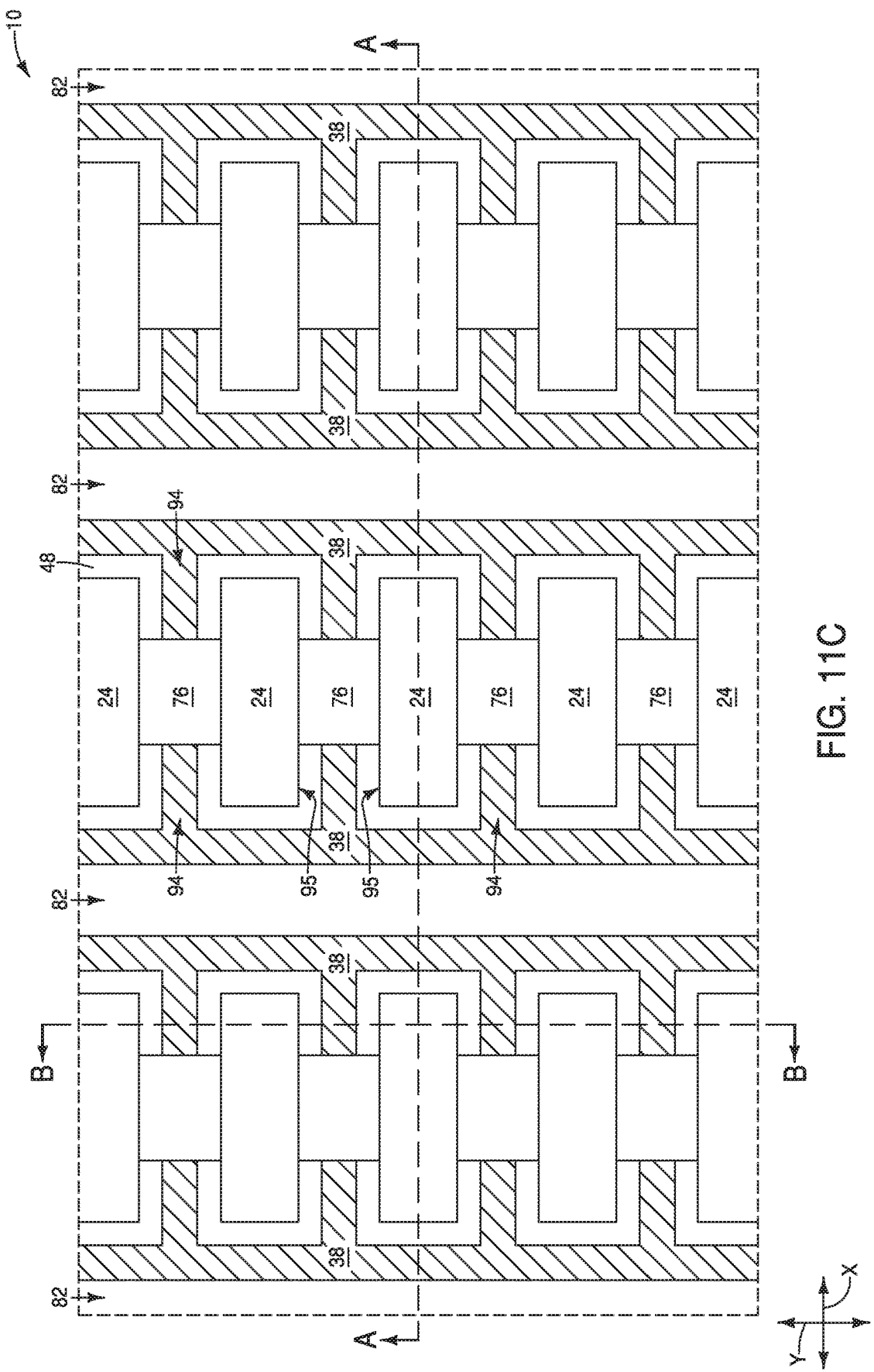

Referring to FIGS. 11-11C, insulative material 48 is formed along the exposed surfaces 95 of the semiconductor material 24, with such insulative material extending into the cavities 94. The insulative material 48 may comprise any suitable composition(s), including, for example, one or more of silicon dioxide, hafnium oxide, aluminum oxide, zirconium oxide, etc. The insulative material 48 corresponds to the gate dielectric material described above with reference to FIGS. 1 and 1A.

The insulative material 48 may be formed with any suitable processing. For instance, the insulative material 48 may be thermally grown along exposed surfaces of silicon-containing semiconductor material 24. Alternatively and/or additionally, the insulative material 48 may be deposited utilizing atomic layer deposition (ALD) and/or chemical vapor deposition (CVD).

The conductive material 38 is formed within the trenches 82, and is shown to extend into the cavities 94. The conductive material 38 is formed over the insulative material 48. The conductive material 38 corresponds to the wordline material described above with reference to FIGS. 1 and 1A, and may comprise any of the compositions described above with reference to FIGS. 1 and 1A.

Figure 12:
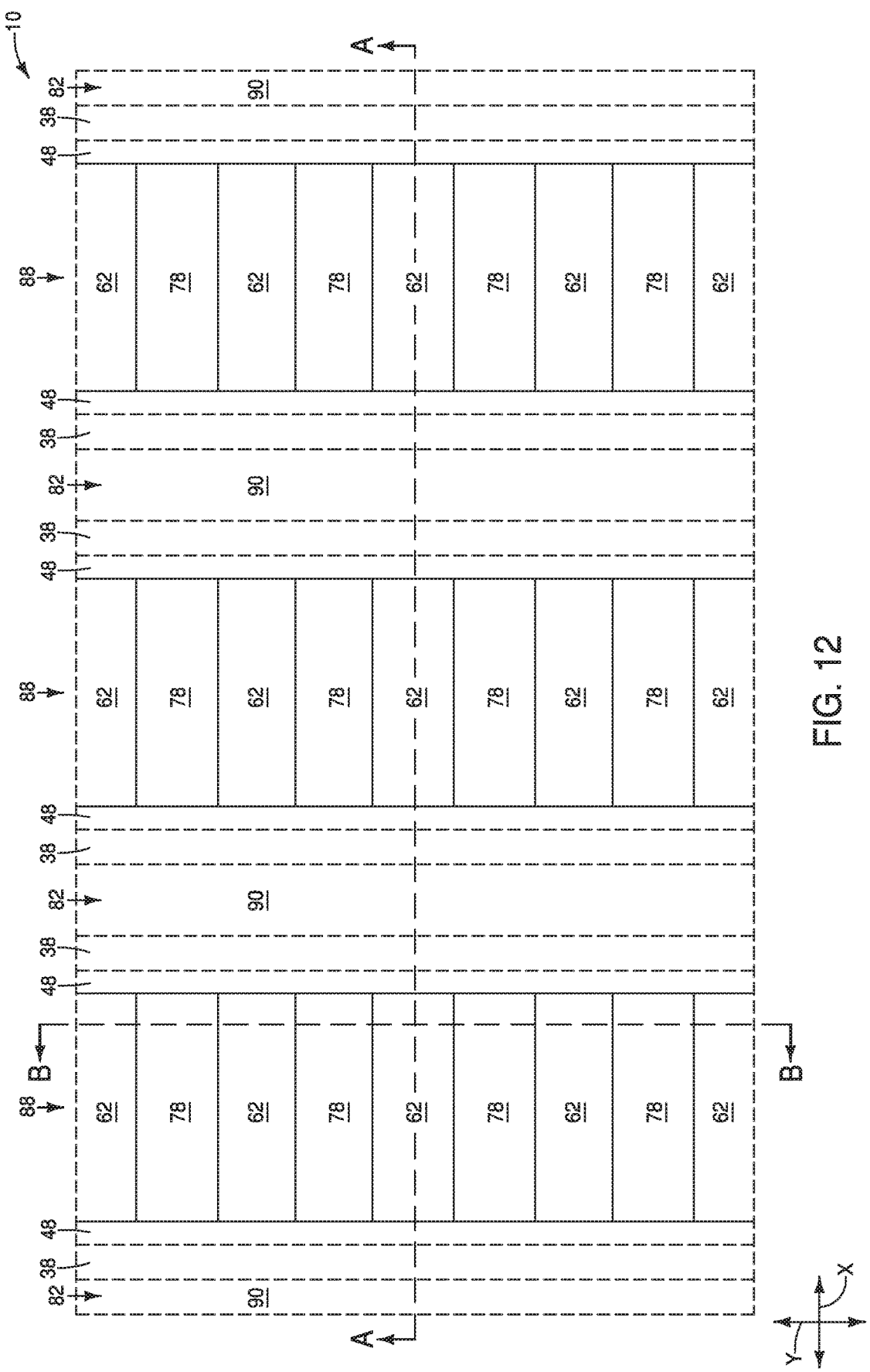
FIGS. 12-12C are diagrammatic views of the region of the example integrated assembly of FIG. 3 at a process stage subsequent to that of FIG. 11.
Figure 12A:
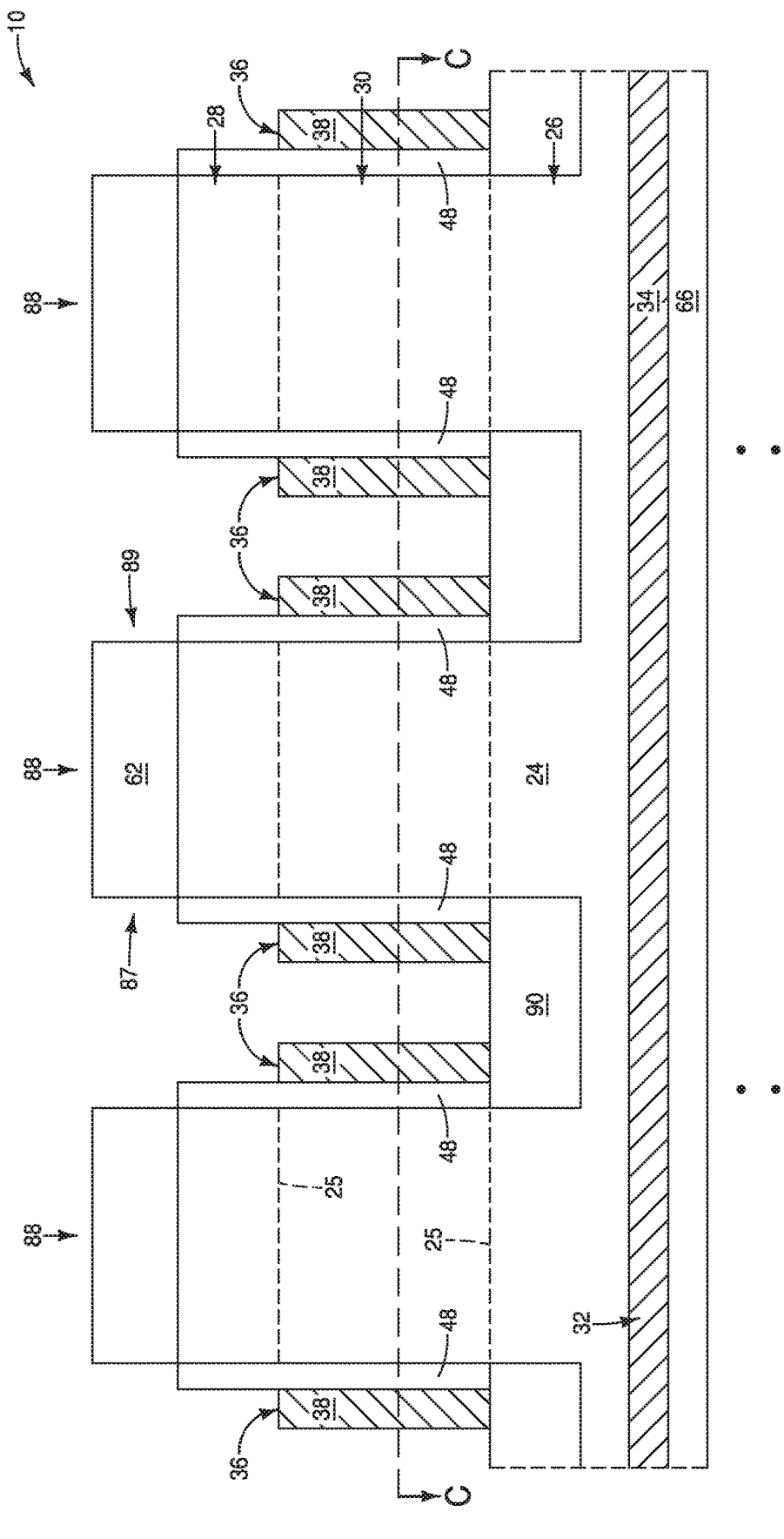
Figure 12C:
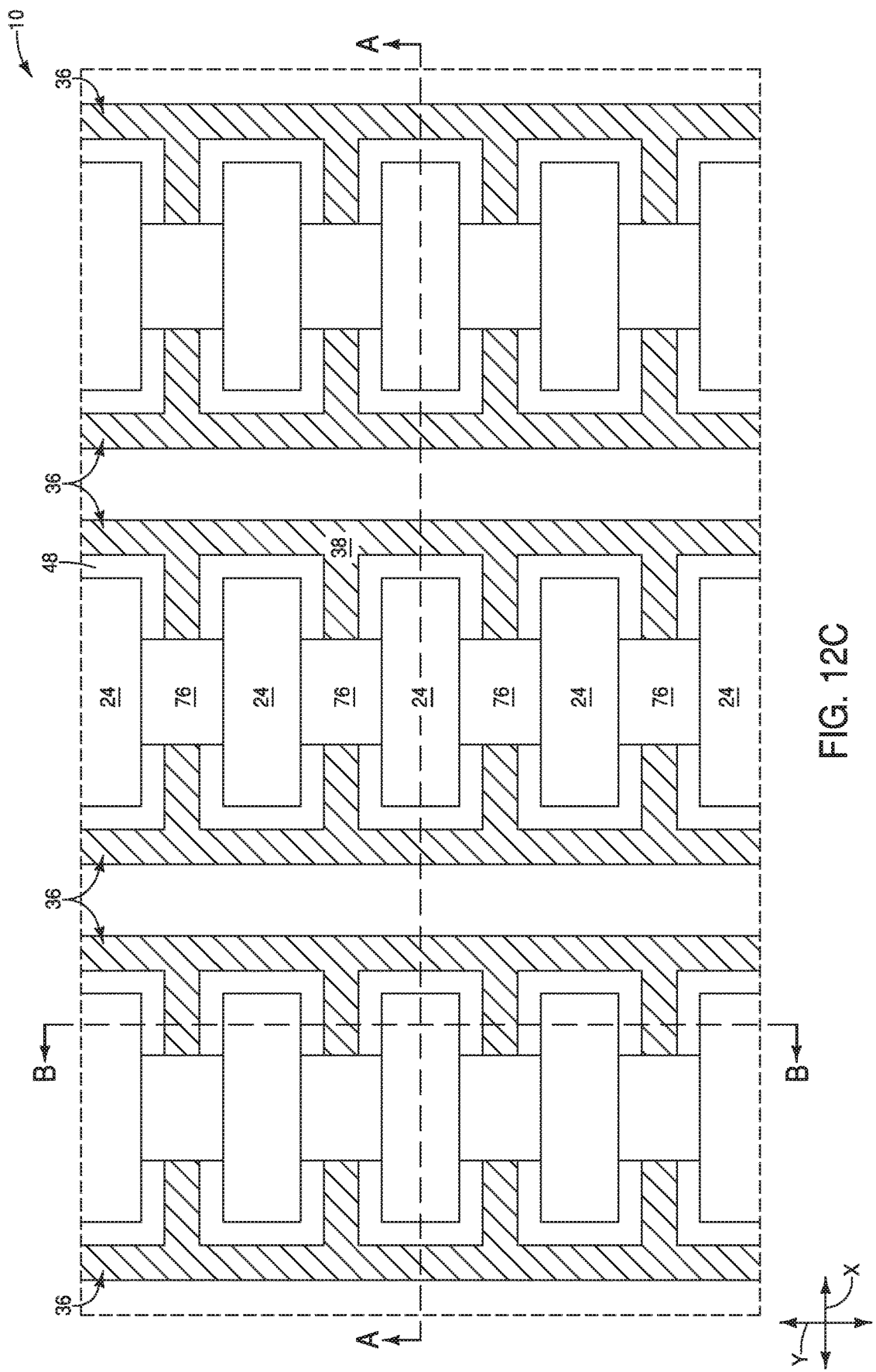

Referring to FIGS. 12-12C, the conductive material 38 is patterned into the conductive structures 36 (i.e., the wordlines) with one or more suitable etches. The conductive structures 36 are along the first and second sides 87 and 89 of the vertically-extending projections 88, as shown in FIG. 12A.

Figure 13:
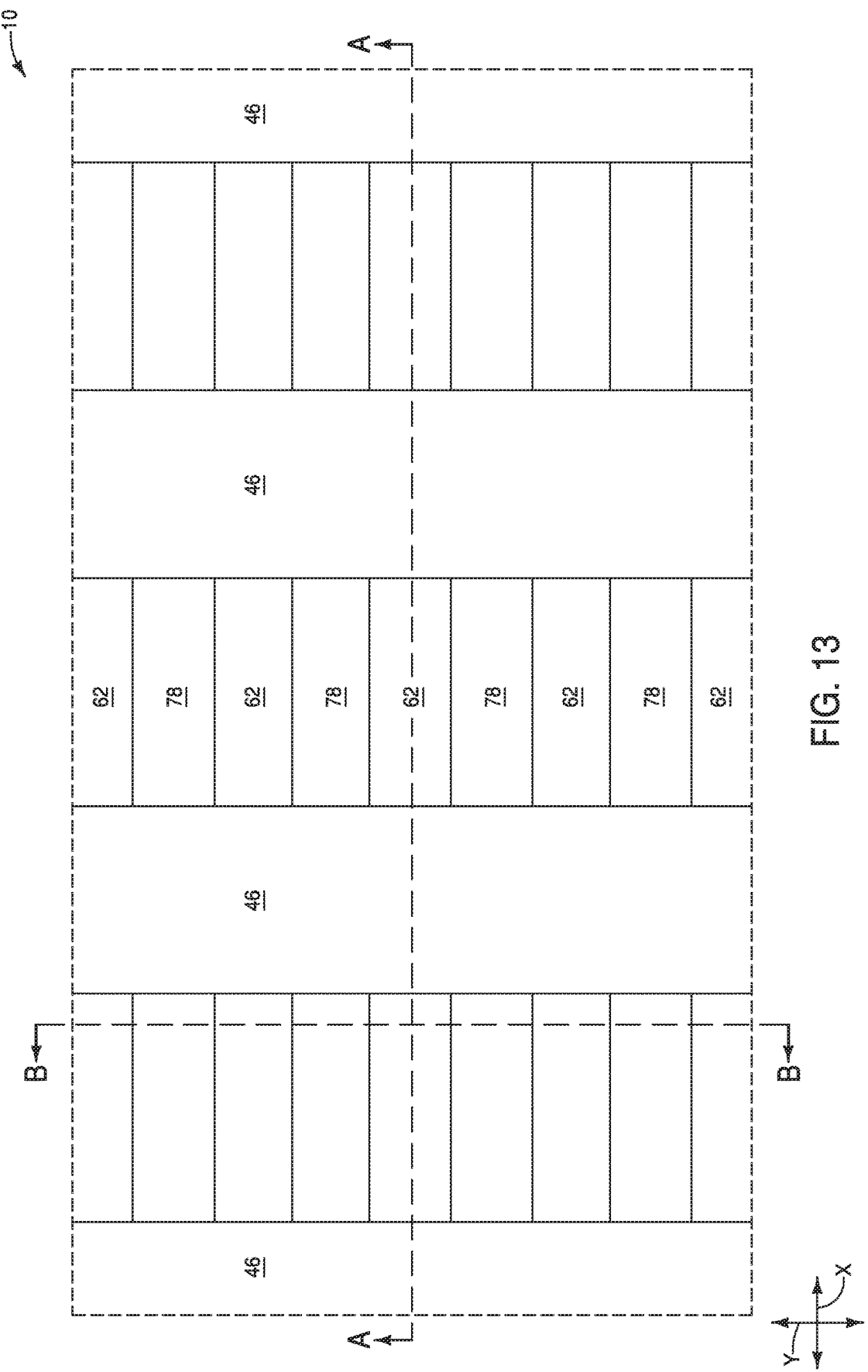
FIGS. 13-13C are diagrammatic views of the region of the example integrated assembly of FIG. 3 at a process stage subsequent to that of FIG. 12.
Figure 13A:
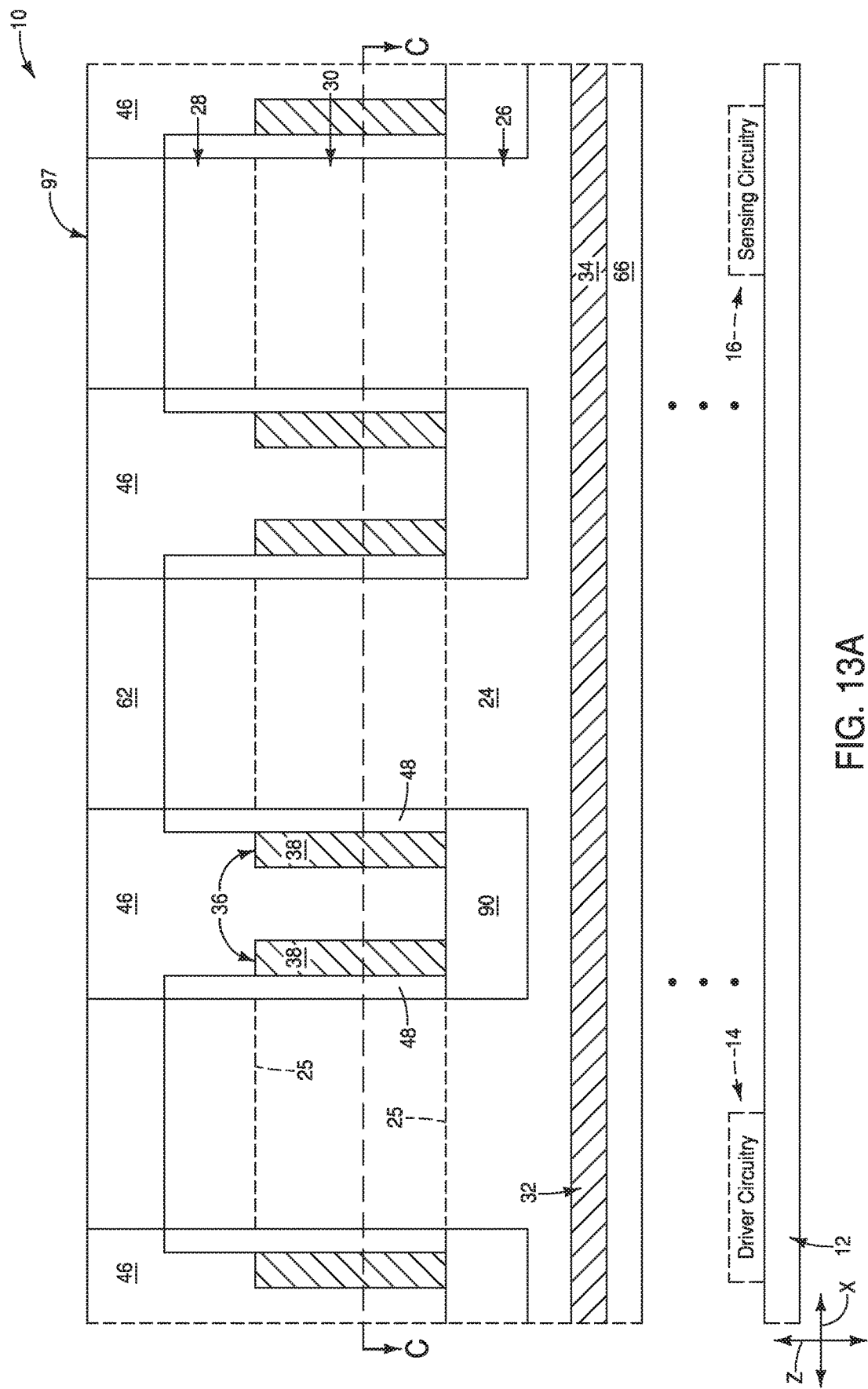
Figure 13C:
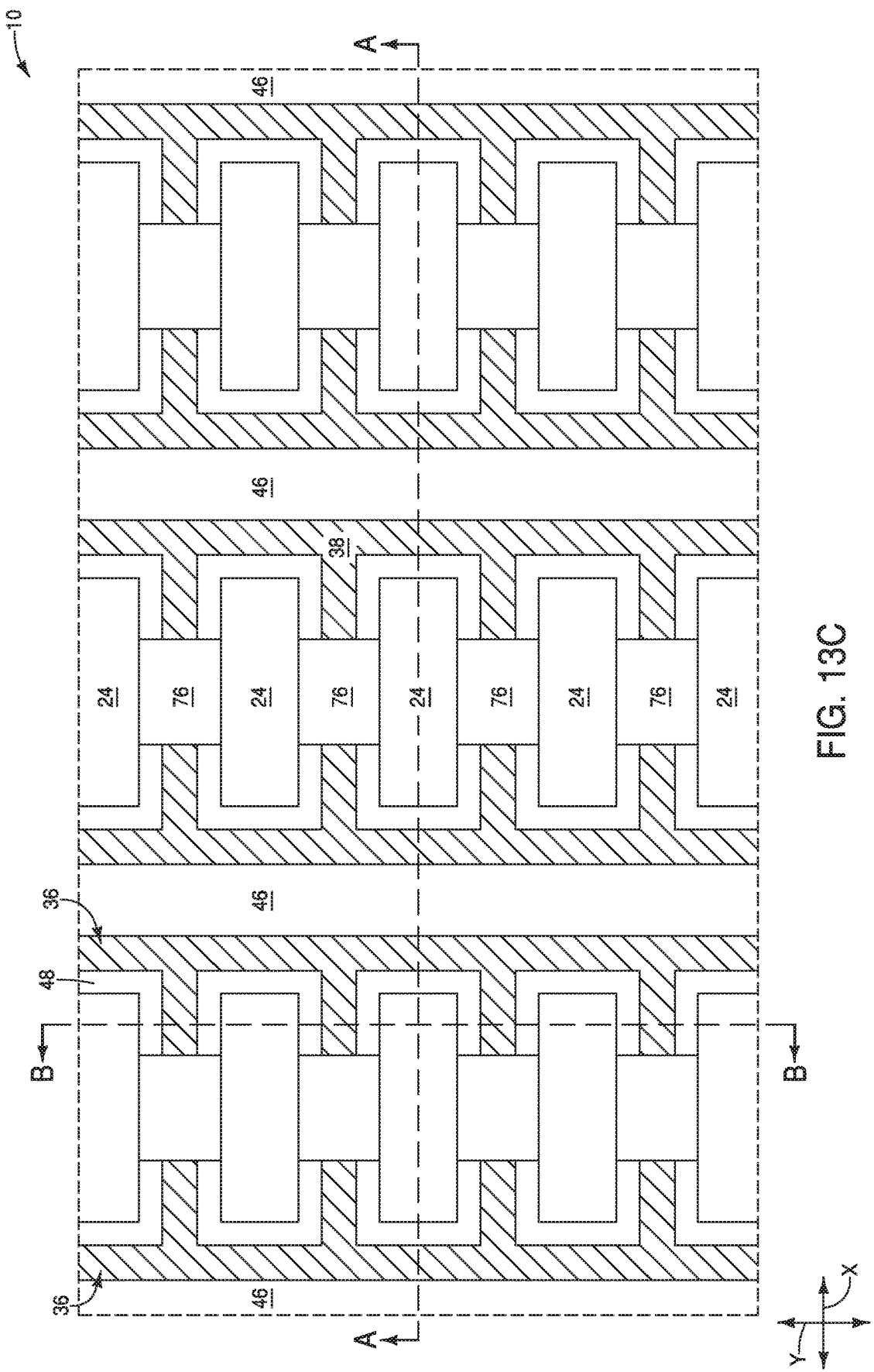

Referring to FIGS. 13-13C, the insulative material 46 is formed over the wordline material 38, and a planarized surface 97 is formed to extend across the materials 46, 62 and 78. The insulative material 46 may comprise silicon dioxide, as described above with reference to FIGS. 1 and 1A. The planarized surface 97 may be formed with any suitable processing, including, for example, CMP.

Figure 14:
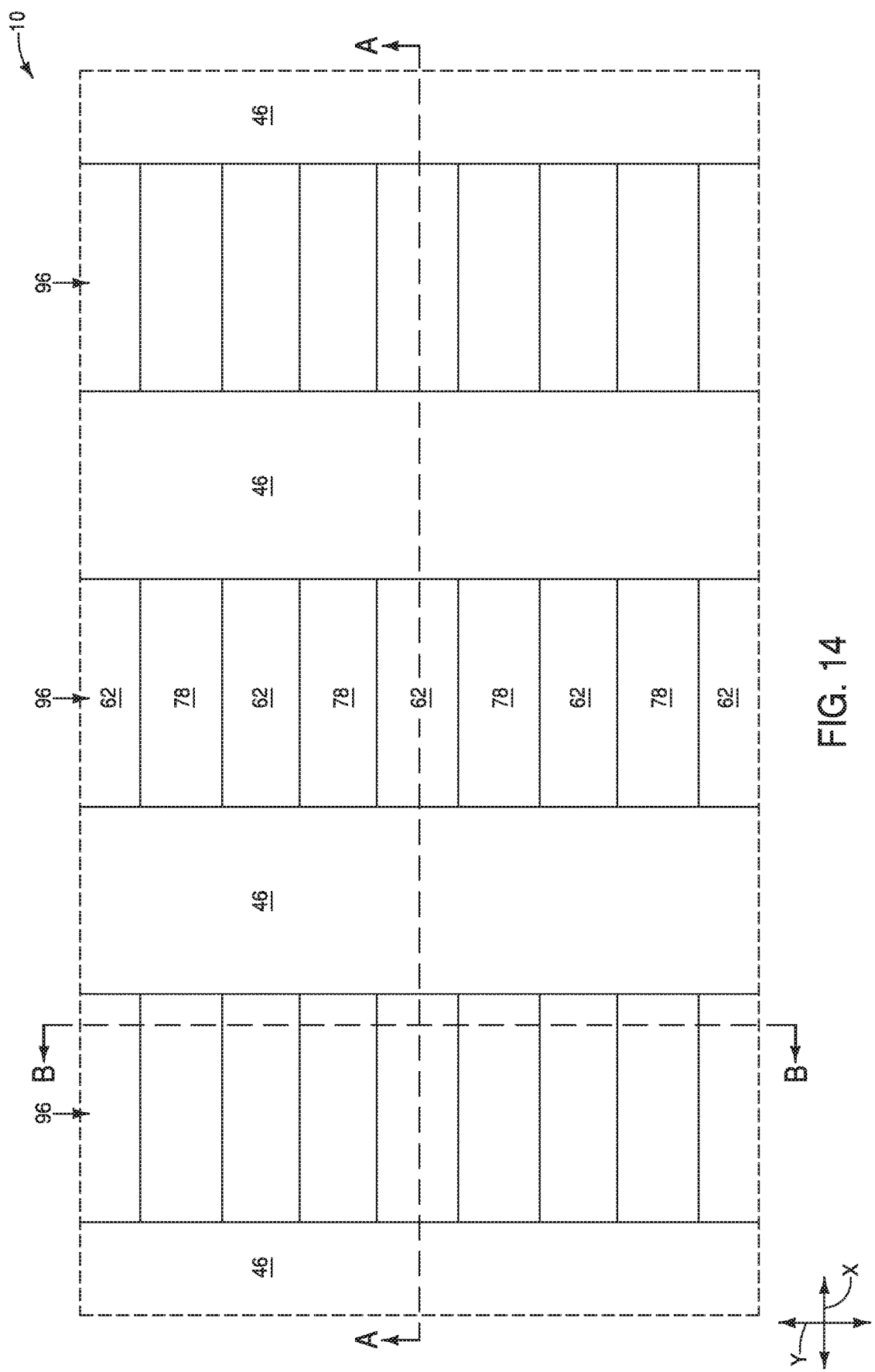
FIGS. 14-14C are diagrammatic views of the region of the example integrated assembly of FIG. 3 at a process stage subsequent to that of FIG. 13.
Figure 14A:
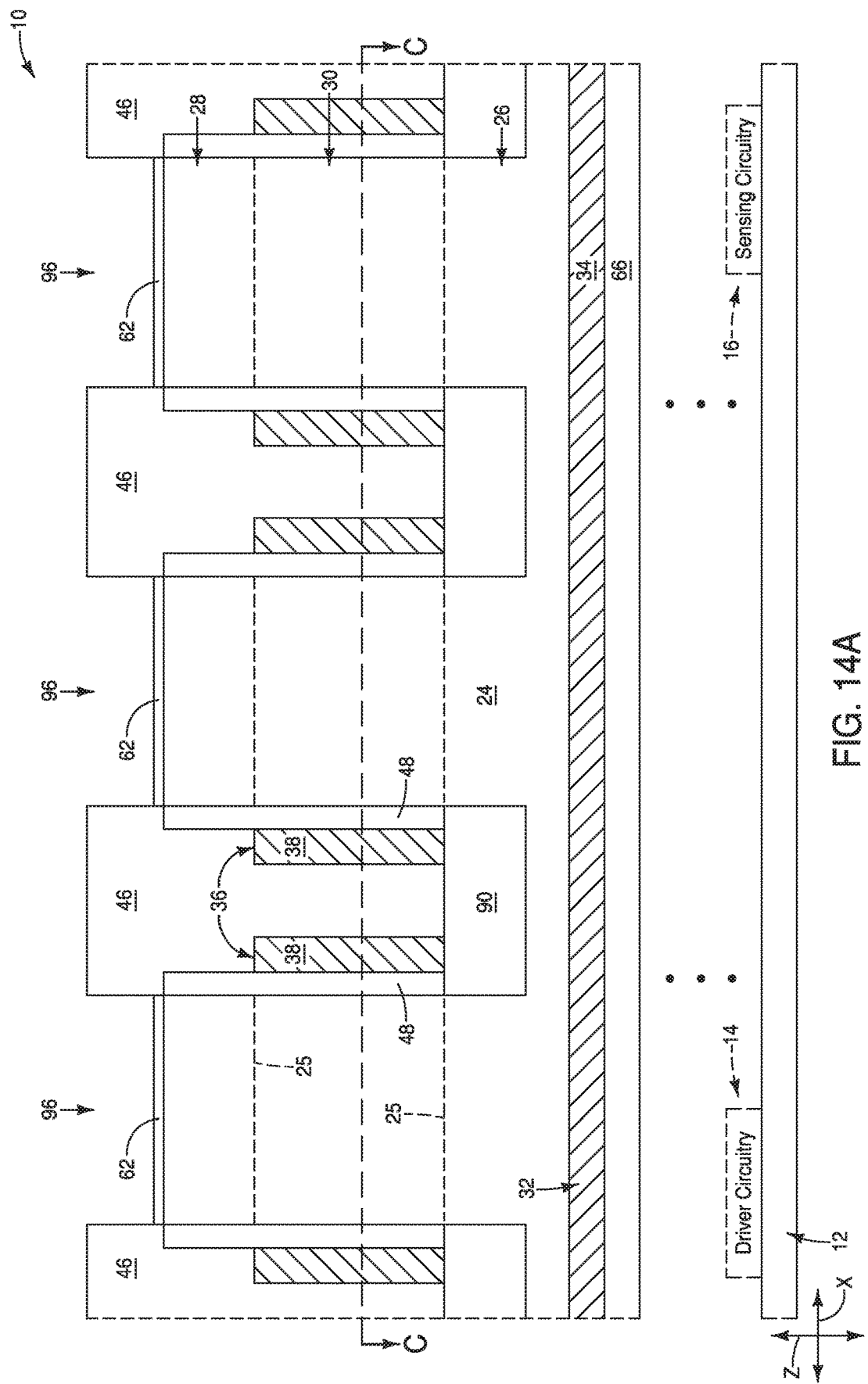
FIGS. 14A and 14B are diagrammatic cross-sectional side views along the lines A-A and B-B of FIGS. 14 and 14C, respectively.
Figure 14B:
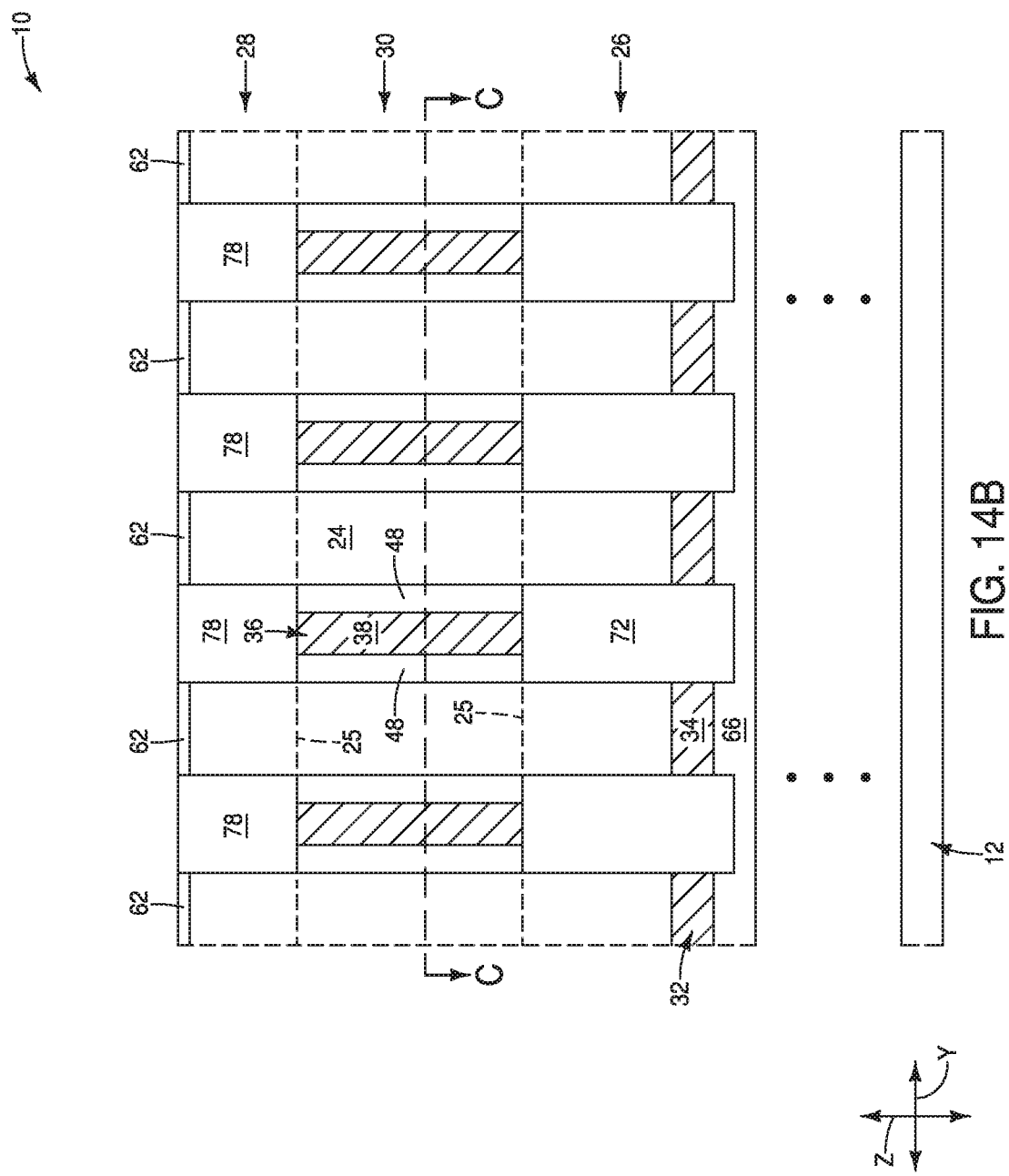
Figure 14C:
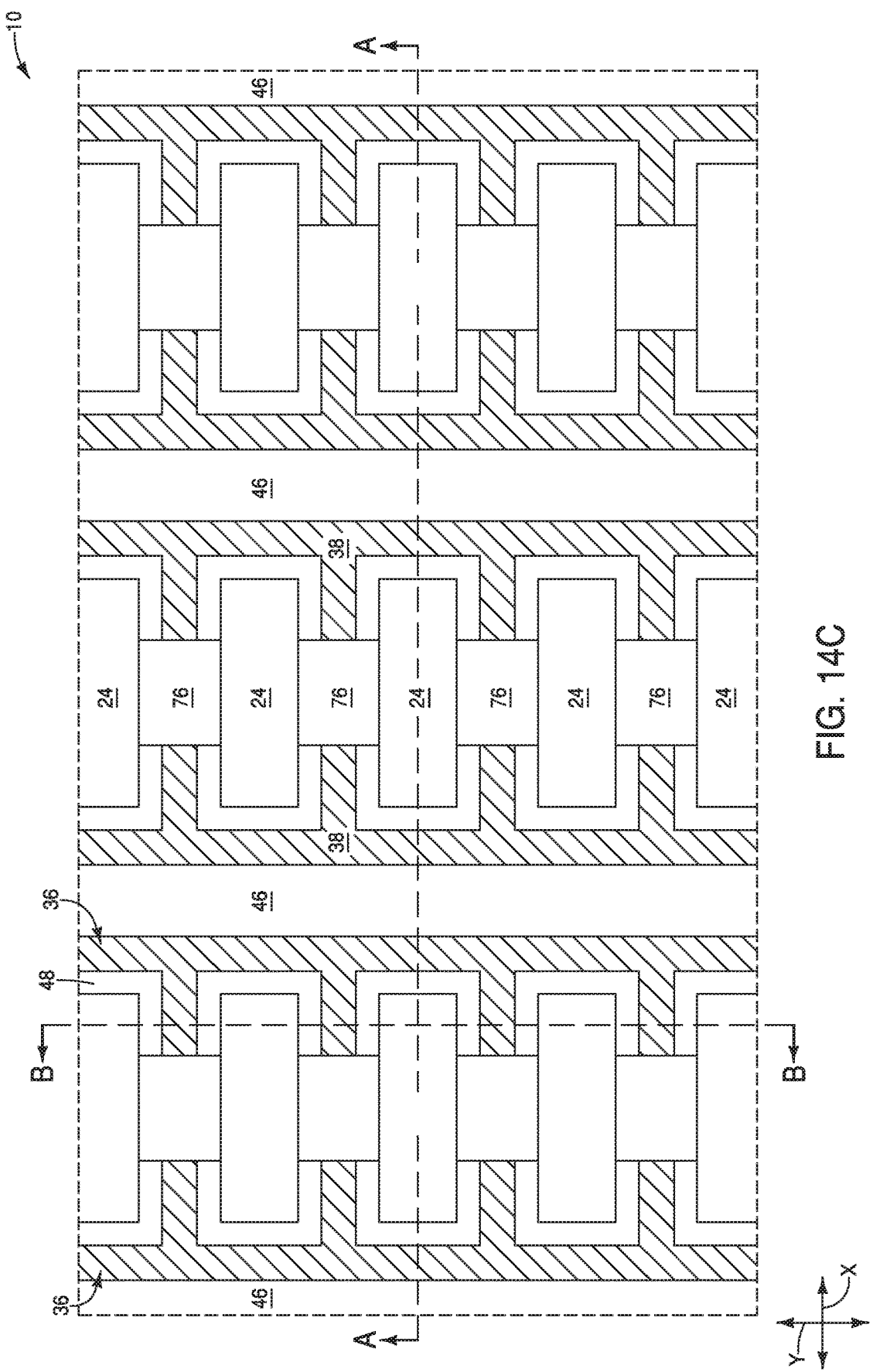

Referring to FIGS. 14-14C, the materials 62 and 78 are recessed relative to the material 46. In some embodiments, the materials 62 and 78 may comprise silicon nitride, the material 46 may comprise silicon dioxide, and the materials 62 and 78 may be selectively recessed relative to the material 46 utilizing phosphoric acid. For purposes of interpreting this disclosure and the claims that follow, an etch is selective for a first material relative to a second material if the etch removes the first material faster than the second material, which may include, but which is not limited to, etches which are 100% selective for the first material relative to the second material.

The recessing of the materials 62 and 78 may be considered to form third trenches 96, with such a third trenches extending along the second direction corresponding to the illustrated y-axis.

Figure 15:
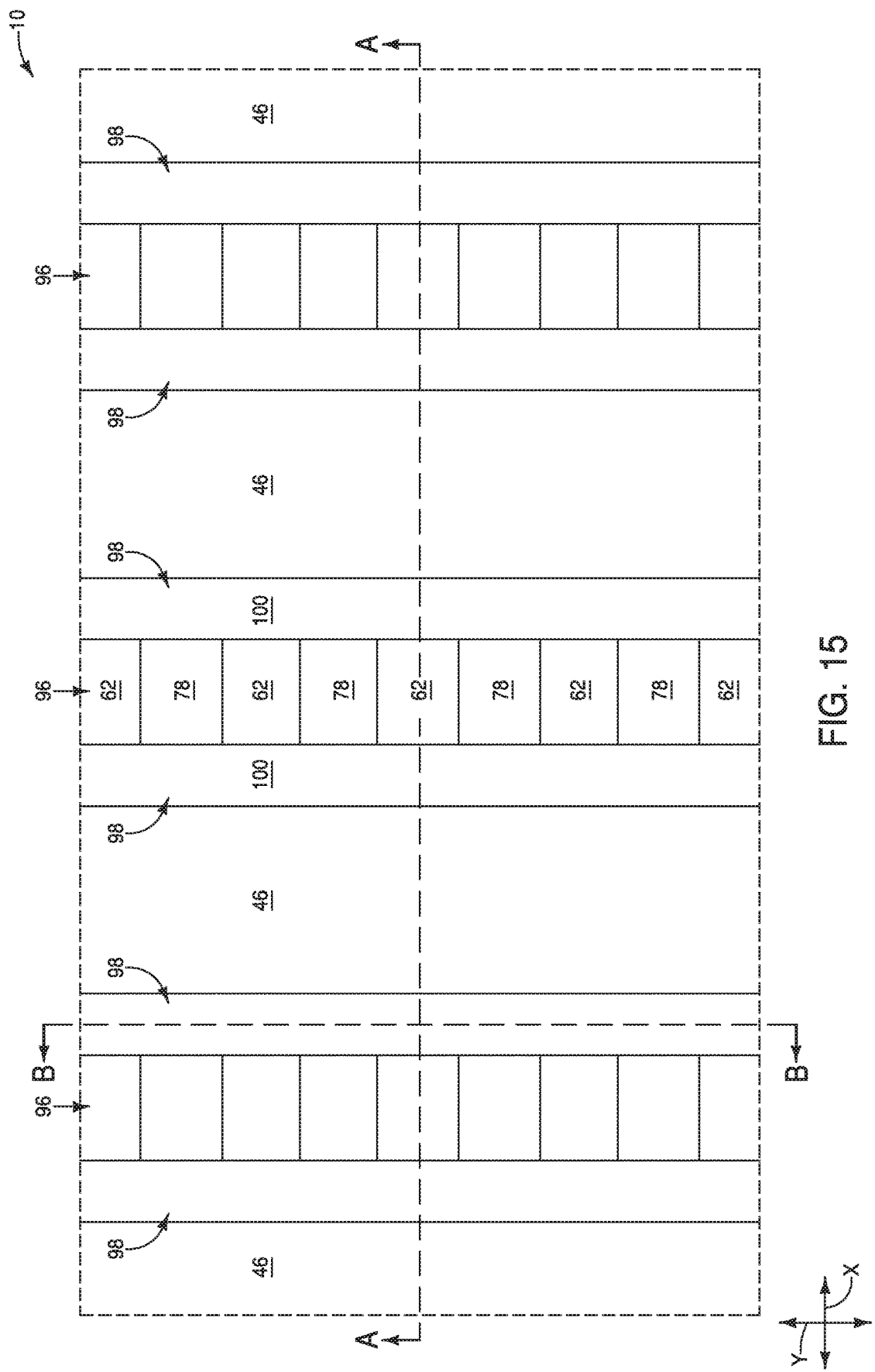
FIGS. 15-15C are diagrammatic views of the region of the example integrated assembly of FIG. 3 at a process stage subsequent to that of FIG. 14.
Figure 15A:
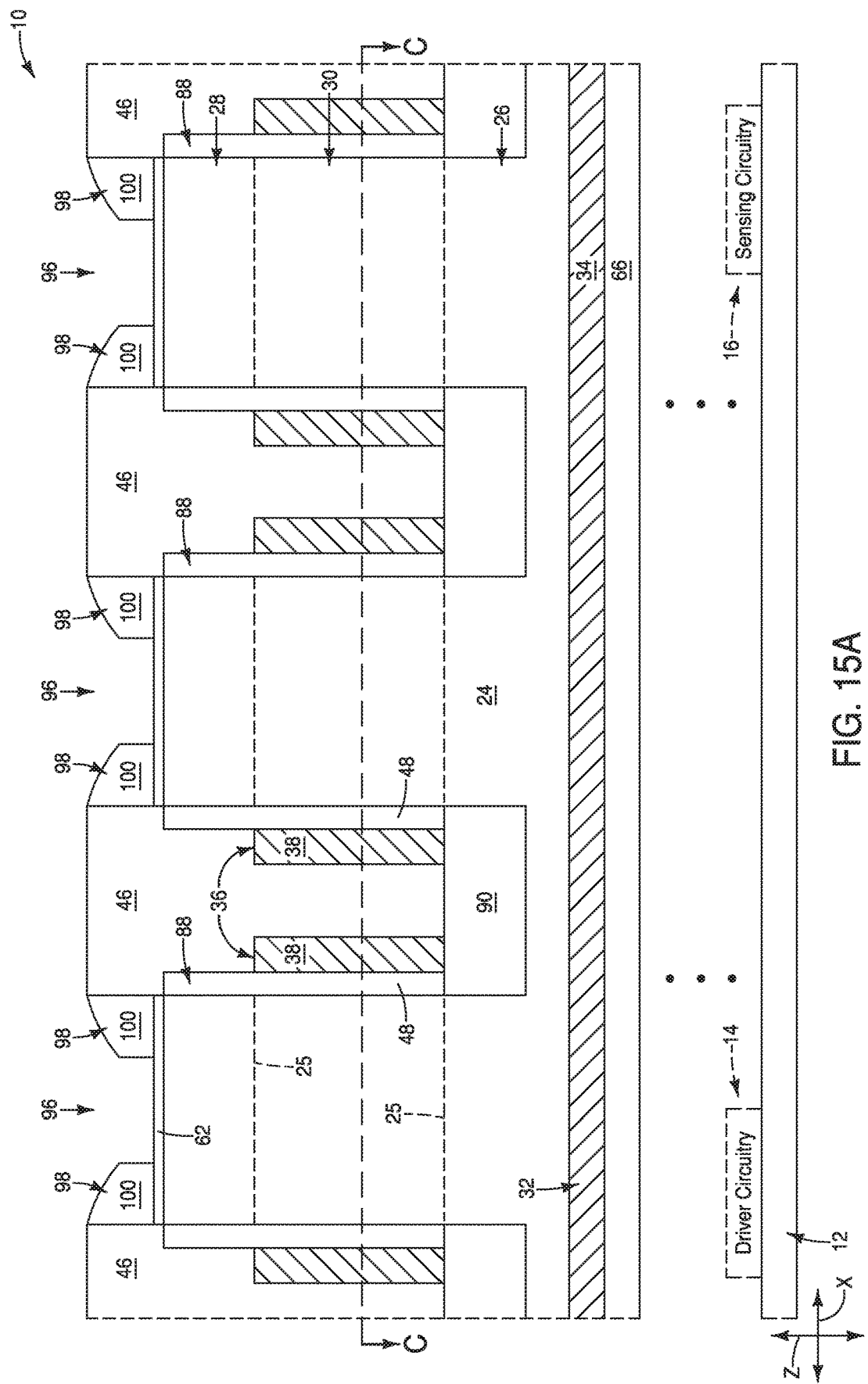
FIGS. 15A and 15B are diagrammatic cross-sectional side views along the lines A-A and B-B of FIGS. 15 and 15C, respectively.
Figure 15B:
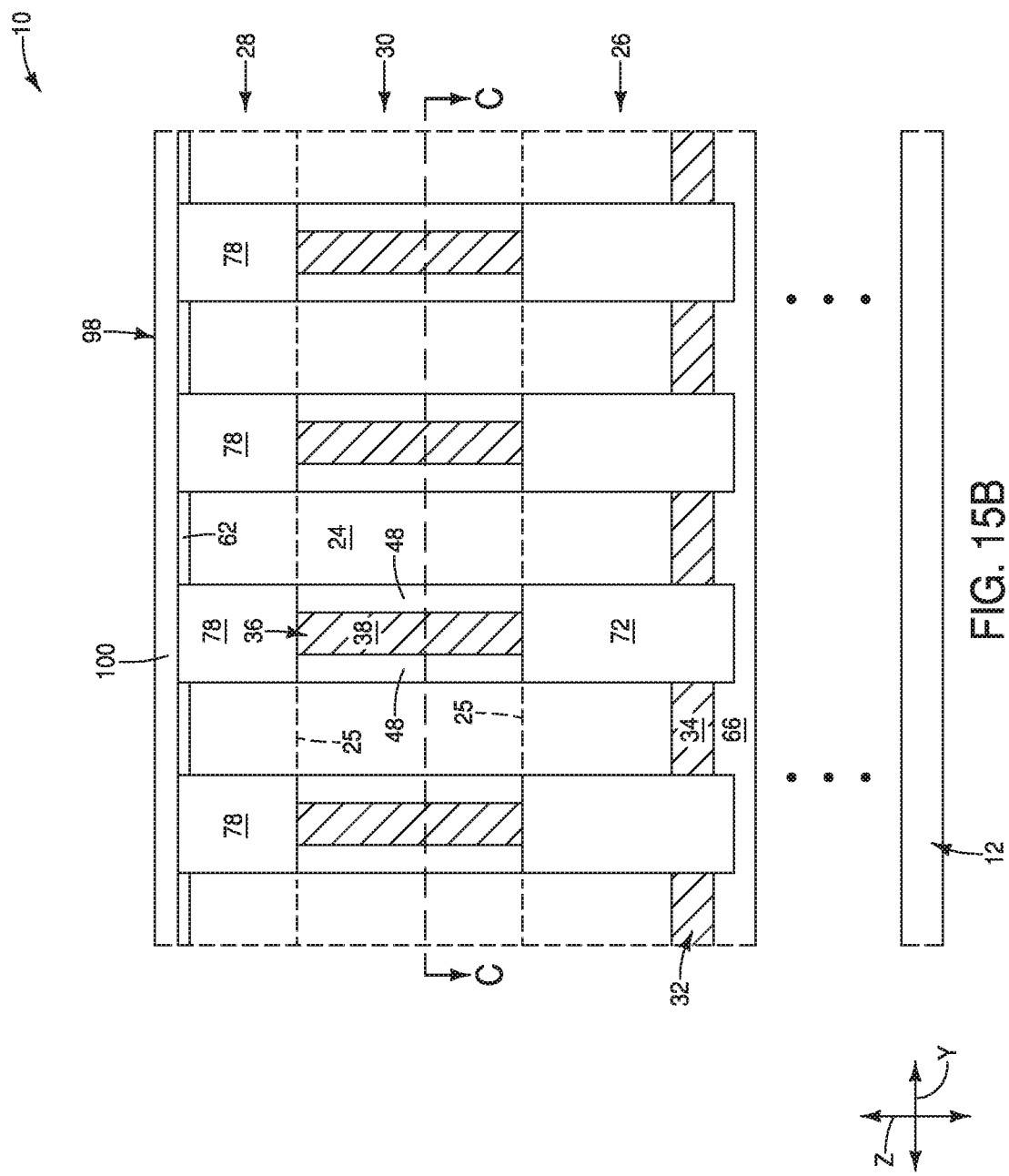
Figure 15C:
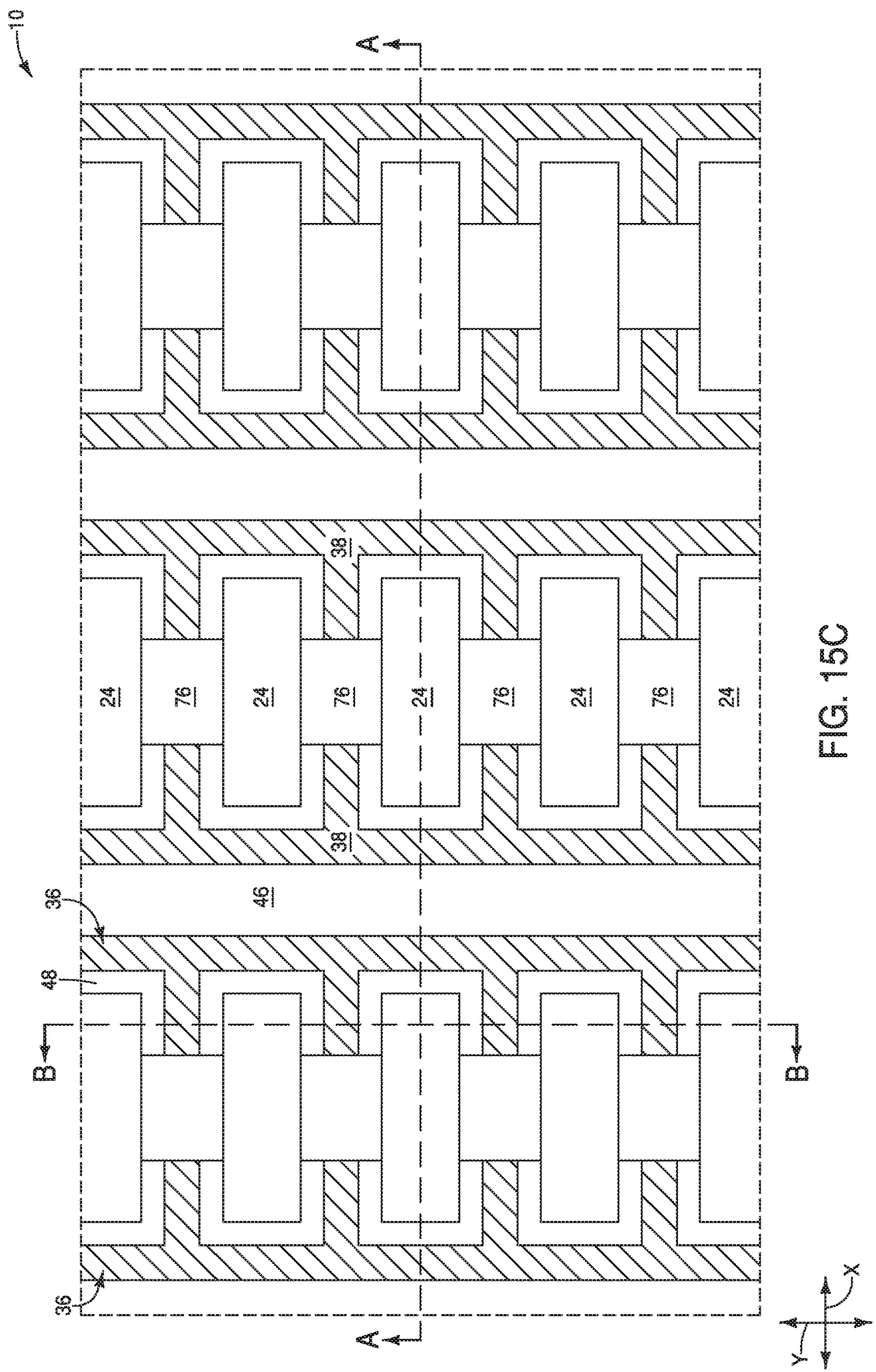

Referring to FIGS. 15-15C, spacers 98 are formed along sidewalls of the trenches 96. The spacers 98 comprise a spacer material 100. In some embodiments, the spacer material 100 may comprise a same composition as the insulative material 46; and accordingly may comprise, consist essentially of, or consist of silicon dioxide.

The spacers 98 narrow the trenches 96.

Figure 16:
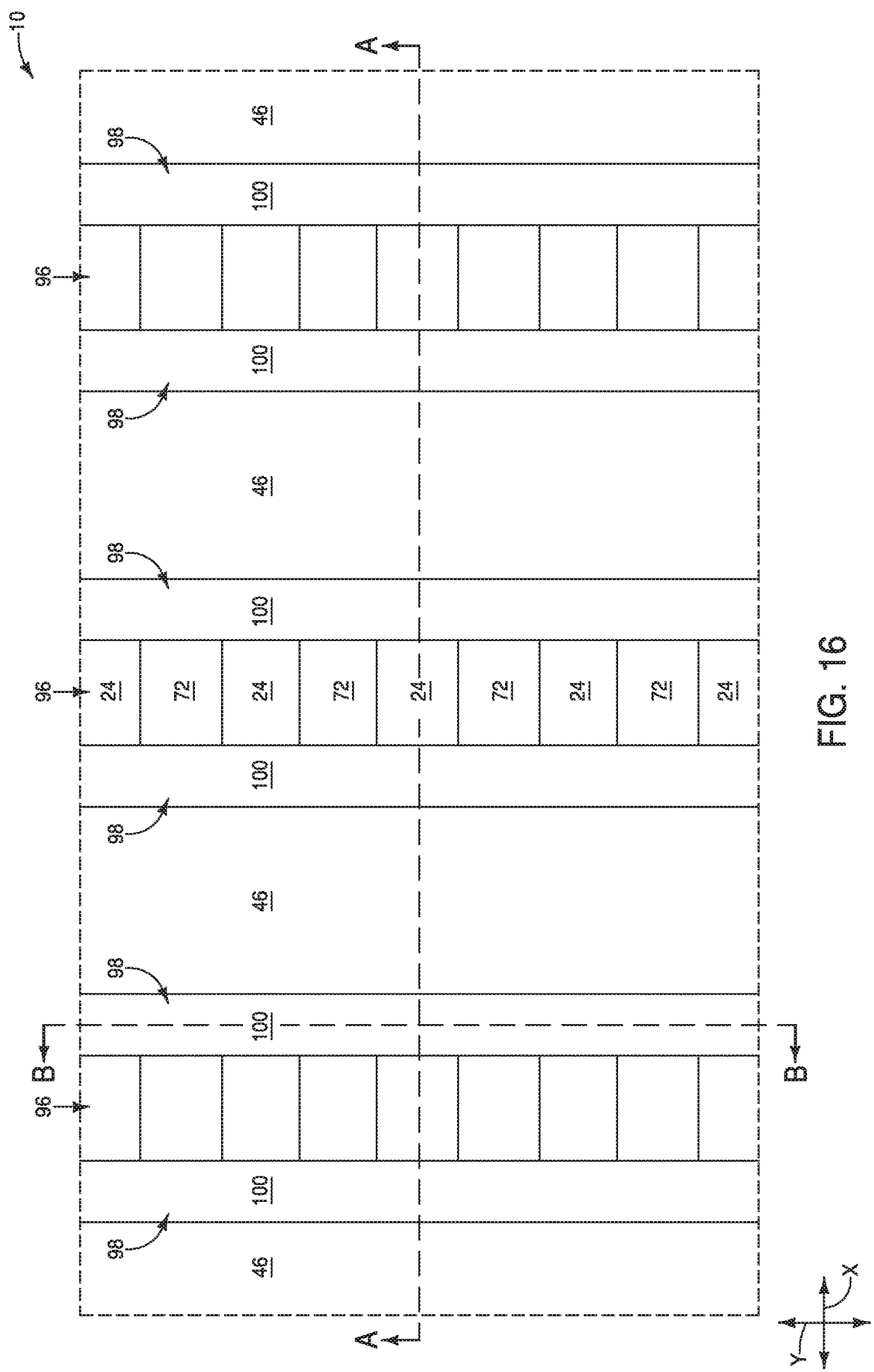
FIGS. 16-16C are diagrammatic views of the region of the example integrated assembly of FIG. 3 at a process stage subsequent to that of FIG. 15.
Figure 16A:
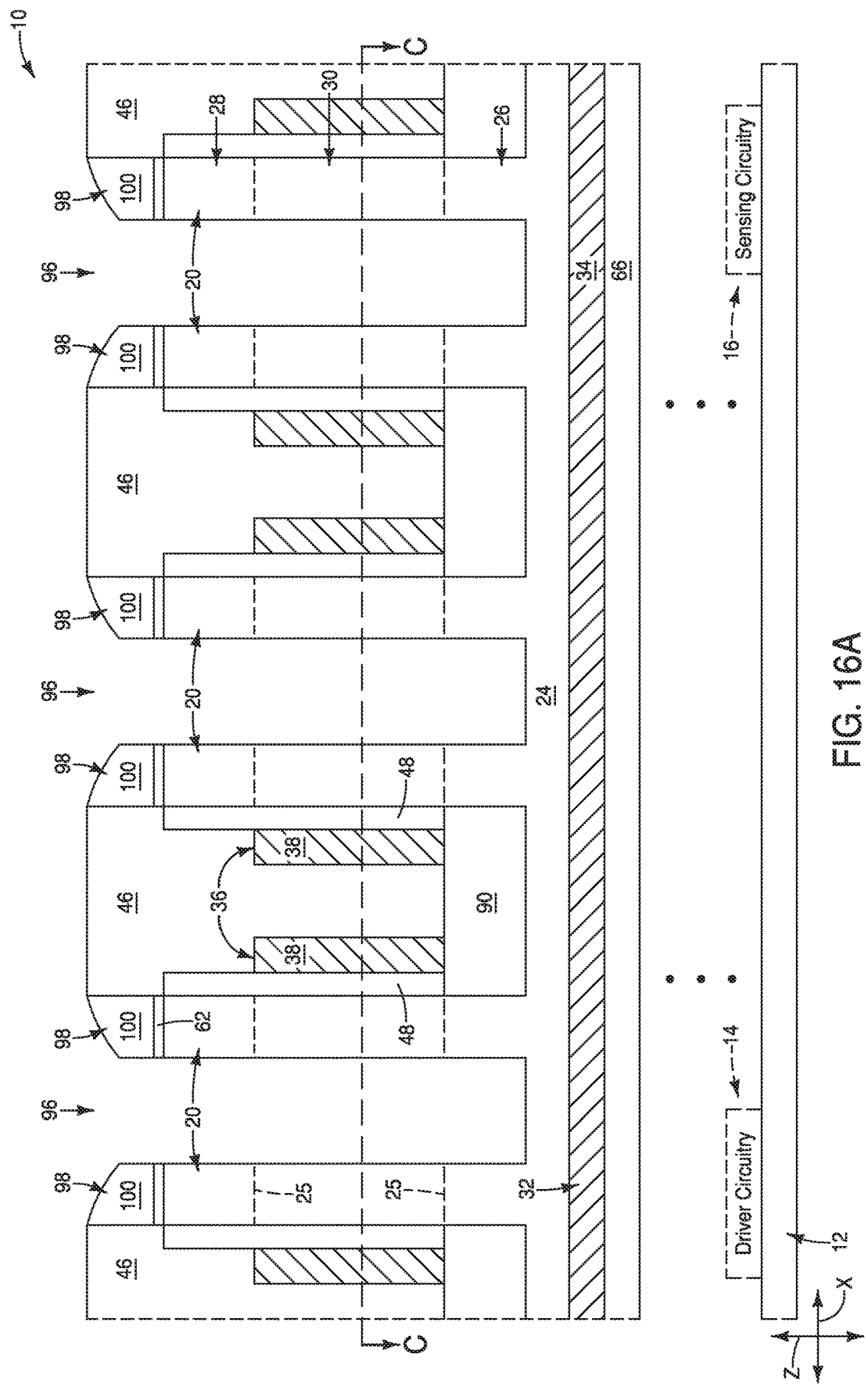
FIGS. 16A and 16B are diagrammatic cross-sectional side views along the lines A-A and B-B of FIGS. 16 and 16C, respectively.
Figure 16B:
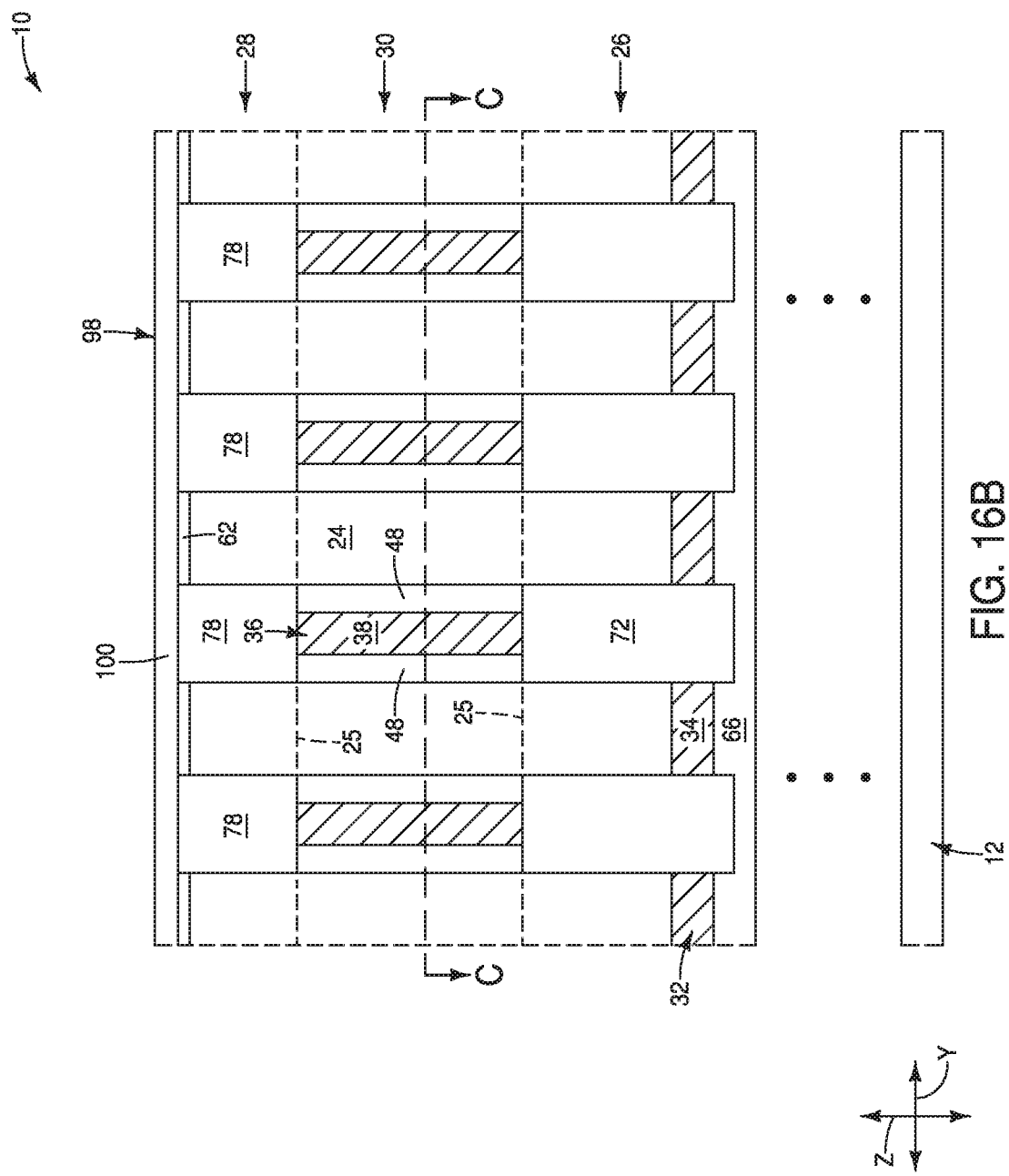
Figure 16C:
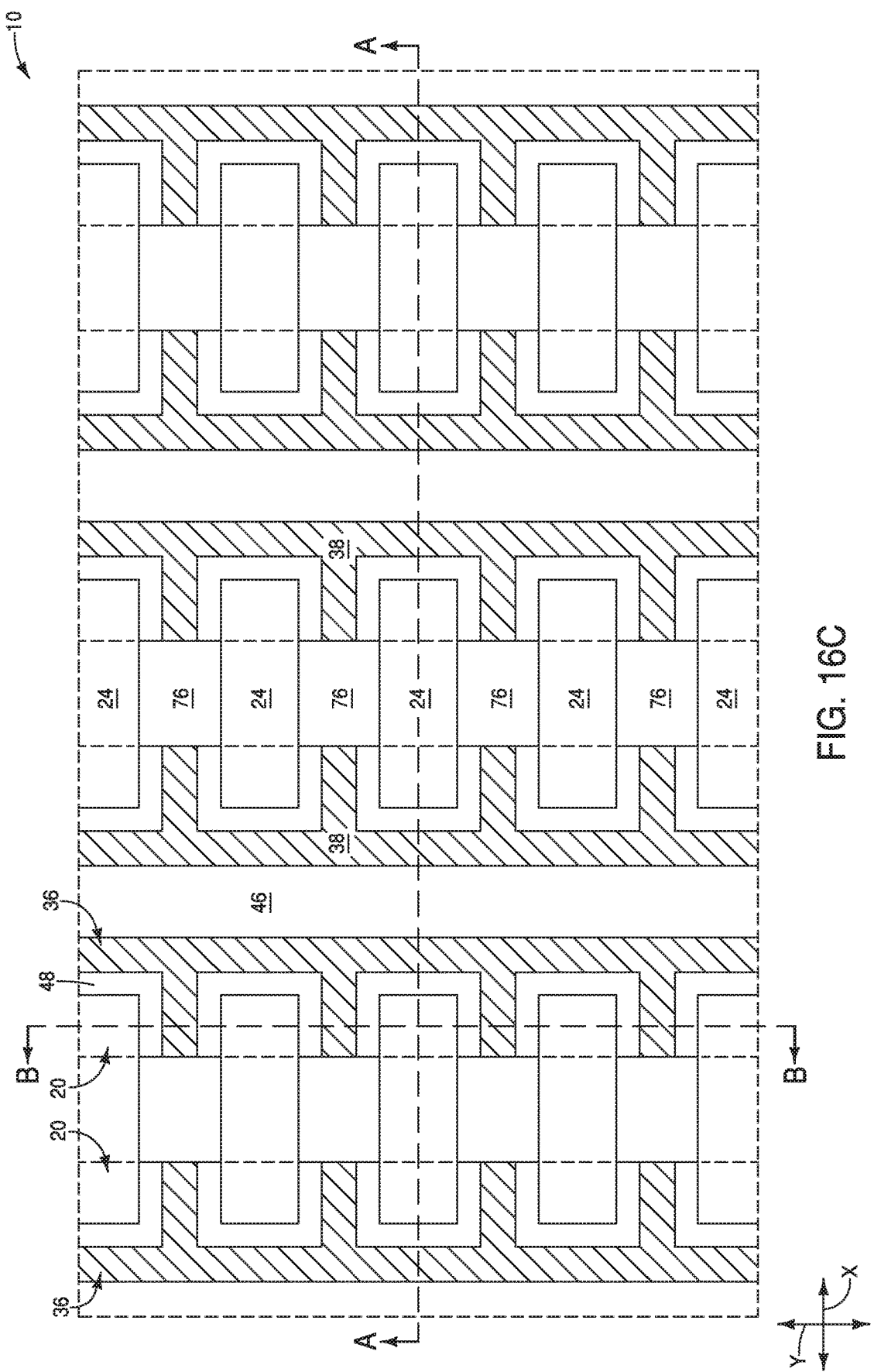

Referring to FIGS. 16-16C, the narrowed trenches 96 are extended into the projections 88 (FIG. 15A) to divide each of the projections into a pair of adjacent active regions 20 (with the active regions 20 corresponding to vertically-extending pillars of the semiconductor material 24).

The assembly 10 of FIGS. 16-16C may be utilized to form memory arrays 22 analogous to the memory arrays 22 described above with reference to FIGS. 1 and 2. For instance, FIGS. 17-19 shows example process stages which may follow that of FIG. 16A.

Figure 17:
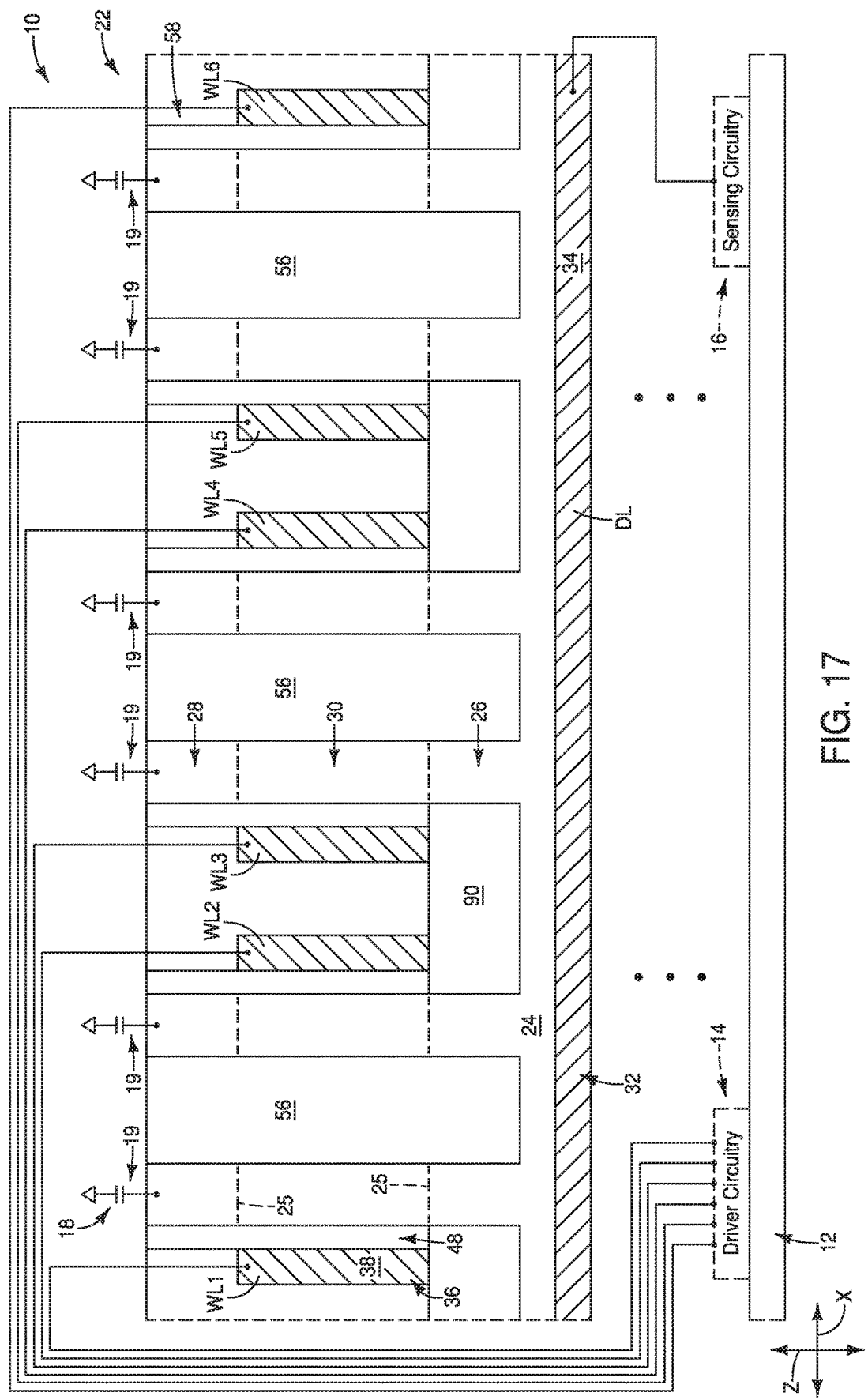
FIGS. 17-19 are diagrammatic cross-sectional views of the region of the example integrated assembly of FIG. 16A at example process stages which may follow that of FIG. 16A.

Referring to FIG. 17, the insulative material 56 is formed within the gaps (trenches) 96 (FIG. 16A). The storage-elements 18 are formed to be electrically-coupled with the upper source/drain regions 28. The conductive structures 36 correspond to wordlines WL1-WL6, and are electrically coupled with the driver circuitry 14. The conductive structure 32 corresponds to a digit line DL, and is electrically coupled with the sensing circuitry 16.

Figure 18:
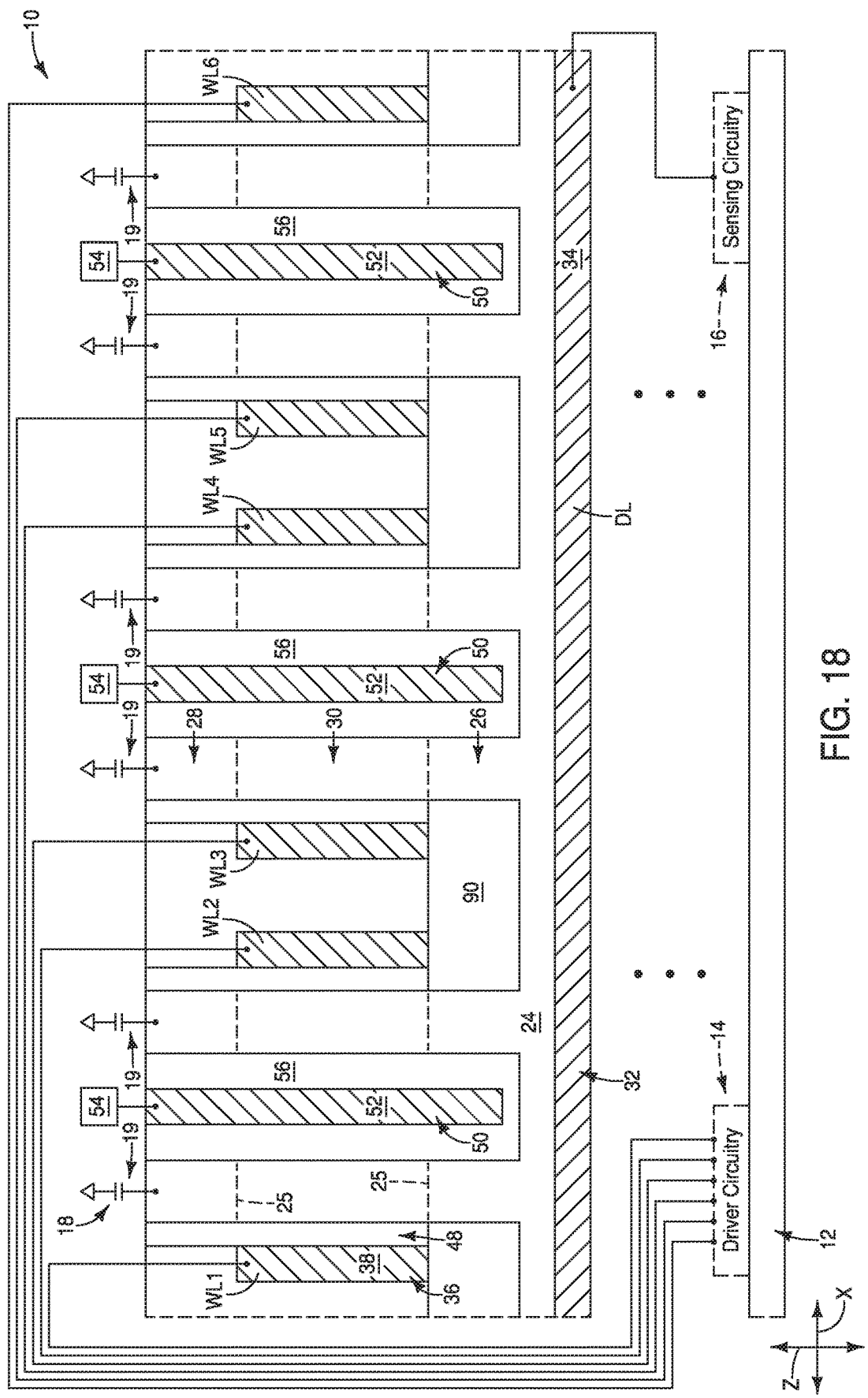

Referring to FIG. 18, the shield structures 50 are formed within the gaps (trenches) 96 (FIG. 16A), in addition to the insulative material 56. The configuration of FIG. 18 is analogous to that described above with reference to FIG. 1A.

Figure 19:
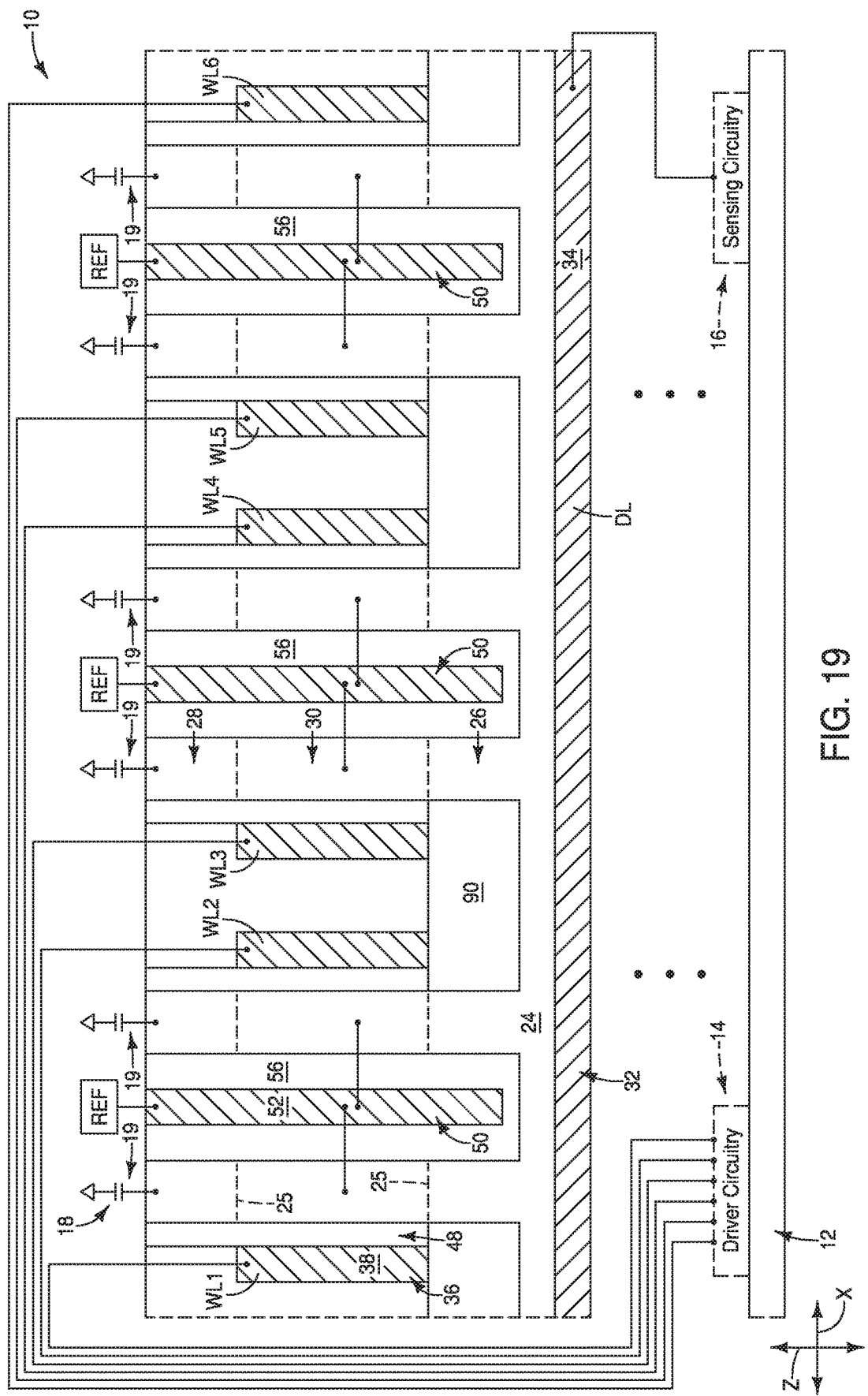

Referring to FIG. 19, the body-contact structures 50 are formed within the gaps (trenches) 96 (FIG. 16A), in addition to the insulative material 56. The configuration of FIG. 19 is analogous to that described above with reference to FIG. 2A.

Figure 20:
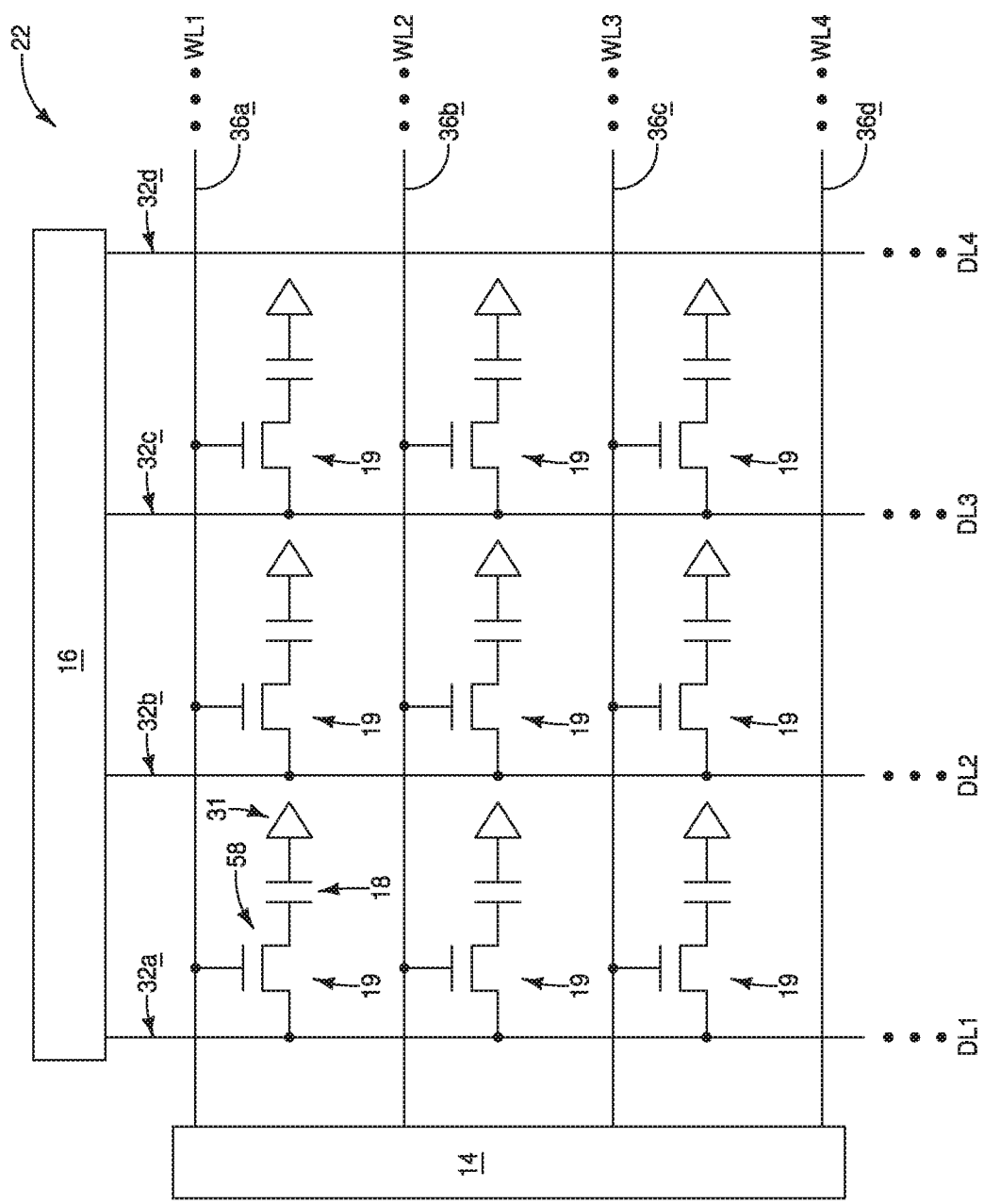
FIG. 20 is a diagrammatic schematic view of a region of an example memory array.

The memory arrays described herein may have any suitable configurations. FIG. 20 shows an example configuration for a DRAM array 22. Such configuration has digit lines 32a-d (DL1-DL4) extending along columns of the array, and coupled with the sensing circuitry 16; and has wordlines 36a-d (WL1-WL4) extending along rows of the array, and coupled with the driver circuitry 14. Each of the memory cells 19 is uniquely addressed by one of the digit lines in combination with one of the wordlines. The memory cells 19 include the access transistors 58 and the capacitors 18.

The illustrated memory array 22 of FIG. 20 is a DRAM array. In other embodiments, the memory array 22 may be a FeRAM array.

The gating structures described herein may be referred to as three-sided gating structures since they extend along three of the four sides of the four-sided areas 40 described with reference to FIGS. 1 and 2. The three-sided gating structures may be advantageous as compared to gating structures which extend along fewer than three of the four sides in that they may enable better control of current flow through the channel region 30. Further, they may provide an improved electric field along the channel region, which may improve drive current. Additionally, the three-sided gates may reduce channel disturb from adjacent devices as compared to other gate configurations. The optional structures 50 (i.e., the optional shields and body-contact structures described above with reference to FIGS. 1 and 2) may provide additional advantages. For instance, the shields may reduce capacitive coupling between neighboring devices, and the body-contact structures may eliminate problematic floating-body effects. In some embodiments, the body-contact structures described above with reference to FIG. 2 may be utilized to both provide the advantages of shielding and the elimination of floating-body effects.

The three-sided gating structures described herein may be advantageous relative to gating structures which extend along all four sides of the four-sided areas 40 described with reference to FIGS. 1 and 2 in that the three-sided gating structures may be more cost-effective to fabricate than are four-sided gating structures.

The processing described herein may be readily incorporated into existing fabrication processes with introduction of few, if any, additional masks.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having an array of vertically-extending active regions. Each of the active regions is contained within a four-sided area. Conductive gate material is configured as first conductive structures. Each of the first conductive structures extends along a row of the array. The first conductive structures include segments along three of the four sides of each of the four-sided areas, and not along the fourth side of each of the four-sided areas. Second conductive structures are under the active regions and extend along columns of the array. Third conductive structures extend along the rows of the array and are adjacent the fourth sides of the four-sided areas. Storage-elements are electrically coupled with the active regions.

Some embodiments include an integrated assembly having an array of vertically-extending active regions. Each of the active regions comprises a lower source/drain region, an upper source/drain region, and a channel region vertically between the upper and lower source/drain regions. Each of the active regions is contained within a four-sided area. First conductive structures extend along rows of the array. The first conductive structures have comb-shaped configurations with shafts of the comb-shaped configurations extending linearly along the rows and being along first sides of the four-sided areas, and with teeth of the comb-shaped configurations projecting from the shafts and being along second and third sides of the four-sided areas. The comb-shaped configurations are adjacent the channel regions of the active regions. Second conductive structures are under the active regions and extend along columns of the array. The second conductive structures are electrically coupled with the lower source/drain regions of the active regions. Storage-elements are electrically coupled with the upper source/drain regions of the active regions.

Some embodiments include a method of forming an integrated assembly. An expanse of semiconductor material is patterned into a plurality of features which extend along a first direction. The features are spaced from one another by first trenches. Steps are formed within the first trenches and along bottom regions of the features. Sacrificial material is formed within the first trenches and over the steps. Fill material is formed over the sacrificial material to fill the first trenches. Second trenches are formed which extend along a second direction which crosses the first direction. The second trenches extend through the fill material, sacrificial material and steps, and at least partially through the semiconductor material. The remaining semiconductor material includes vertically-extending projections. Each of the vertically-extending projections has a first side along one of the second trenches and has a second side along another of the second trenches adjacent to said one of the second trenches. The sacrificial material is recessed to form cavities between the steps and the fill material. The vertically-extending projections have exposed surfaces of the semiconductor material along the first and second sides and within the cavities. Insulative material is formed along the exposed surfaces of the semiconductor material of the vertically-extending projections. Conductive material is formed within the second trenches and over the insulative material. The conductive material is patterned as conductive structures extending along the first and second sides of the vertically-extending projections. Third trenches are formed to extend along the second direction and extend at least partially through the vertically-extending projections. The third trenches divide each of the vertically-extending projections into a pair of adjacent active regions. Storage-elements are formed to be electrically coupled with the active regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   an array of vertically-extending active regions; each of the active regions being contained within a four-sided area;
   conductive gate material configured as first conductive structures; each of the first conductive structures extending along a row of the array; the first conductive structures comprising segments along three of the four sides of each of the four-sided areas, and not along the fourth side of each of the four-sided areas;
   second conductive structures under the active regions and extending along columns of the array;
   third conductive structures extending along the rows of the array and being adjacent the fourth sides of the four-sided areas; and
   storage-elements electrically coupled with the active regions.

2. The integrated assembly of claim 1 wherein the active regions are four-sided polygons within the four-sided areas; and wherein the segments of the conductive structures are along only three of the sides of each of the four-sided polygons.

3. The integrated assembly of claim 1 wherein the storage elements are capacitors.

4. The integrated assembly of claim 3 wherein the capacitors are non-ferroelectric capacitors.

5. The integrated assembly of claim 3 wherein the capacitors are ferroelectric capacitors.

6. The integrated assembly of claim 1 wherein the third conductive structures are shield structures and are electrically coupled with a reference voltage node having a reference voltage.

7. The integrated assembly of claim 6 wherein the reference voltage is within a range of from greater than or equal to ground to less than or equal to VCC.

8. The integrated assembly of claim 1 wherein the active regions include body regions, and wherein the third conductive structures are electrically coupled with the body regions.

9. The integrated assembly of claim 1 wherein the conductive gate material comprises metal.

10. An integrated assembly, comprising:
    an array of vertically-extending active regions; each of the active regions comprising a lower source/drain region, an upper source/drain region, and a channel region vertically between the upper and lower source/drain regions; each of the active regions being contained within a four-sided area;

first conductive structures extending along rows of the array; the first conductive structures having comb-shaped configurations with shafts of the comb-shaped configurations extending linearly along the rows and being along first sides of the four-sided areas, and with teeth of the comb-shaped configurations projecting from the shafts and being along second and third sides of the four-sided areas; the comb-shaped configurations being adjacent the channel regions;

second conductive structures under the active regions and extending along columns of the array; the second conductive structures being electrically coupled with the lower source/drain regions; and storage-elements electrically coupled with the upper source/drain regions.

11. The integrated assembly of claim 10 further comprising third conductive structures extending along the rows of the array and being adjacent the fourth sides of the four-sided areas.

12. The integrated assembly of claim 11 wherein the third conductive structures are shield structures and are electrically coupled with a reference voltage node having a reference voltage.

13. The integrated assembly of claim 12 wherein the reference voltage is within a range of from greater than or equal to ground to less than or equal to VCC.

14. The integrated assembly of claim 11 wherein the active regions include body regions, and wherein the third conductive structures are electrically coupled with the body regions.

15. The integrated assembly of claim 10 wherein the storage elements are capacitors.

16. The integrated assembly of claim 15 wherein the capacitors are non-ferroelectric capacitors.

17. The integrated assembly of claim 15 wherein the capacitors are ferroelectric capacitors.

18. The integrated assembly of claim 10 wherein the active regions are rectangular-shaped within the four-sided areas; wherein the shafts are along one of the sides of the rectangular-shaped active regions; and wherein the teeth are along second and third sides of the rectangular-shaped active regions.

19. The integrated assembly of claim 10 wherein the comb-shaped configurations comprise tungsten.

\* \* \* \* \*